US009716043B2

(12) United States Patent
Park et al.

(10) Patent No.: US 9,716,043 B2
(45) Date of Patent: Jul. 25, 2017

(54) WIRING STRUCTURE AND METHOD OF FORMING THE SAME, AND SEMICONDUCTOR DEVICE INCLUDING THE WIRING STRUCTURE

(71) Applicant: Samsung Electronics Co., Ltd., Suwon-si, Gyeonggi-do (KR)

(72) Inventors: Jin-Hyeung Park, Suwon-si (KR); Yeon-Joo Kim, Yongin-si (KR); In-Hwan Kim, Gyeongsan-si (KR); Jun-Jung Kim, Suwon-si (KR); Kyoung-Pil Park, Goyang-si (KR); Jeong-Hoon Ahn, Yongin-si (KR); Sang-Chul Lee, Suwon-si (KR); Joon-Nyung Lee, Seoul (KR); Hyo-Seon Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/187,901

(22) Filed: Jun. 21, 2016

(65) Prior Publication Data
US 2016/0379891 A1     Dec. 29, 2016

(30) Foreign Application Priority Data

Jun. 29, 2015 (KR) .................. 10-2015-0091946

(51) Int. Cl.
*H01L 21/82* (2006.01)
*H01L 23/52* (2006.01)
(Continued)

(52) U.S. Cl.
CPC ............... *H01L 21/823475* (2013.01); *H01L 21/76811* (2013.01); *H01L 21/76813* (2013.01);
(Continued)

(58) Field of Classification Search
CPC ..... H01L 23/52; H01L 23/53; H01L 23/5226; H01L 23/528; H01L 23/53223;
(Continued)

(56) References Cited

U.S. PATENT DOCUMENTS 6,839,890 B2    1/2005 Sugita et al.
7,605,085 B2    10/2009 Tomita et al.
(Continued)

FOREIGN PATENT DOCUMENTS

JP    2002-278040 A    9/2002
KR    100976663 B1    8/2010
(Continued)

*Primary Examiner* — Monica D Harrison
(74) *Attorney, Agent, or Firm* — Harness, Dickey & Pierce, P.L.C.

(57) ABSTRACT

In a method of forming a wiring structure, a first mask having a first opening including a first portion extending in a second direction and a second portion extending in a first direction is formed. A second mask including a second opening overlapping the first portion of the first opening and third openings each overlapping the second portion of the first opening is designed. The second mask is fabricated to include a fourth opening by enlarging the second opening. The fourth opening overlaps a boundary between the first and second portions of the first opening. An insulating interlayer is etched using the first and second masks to form first and second via holes corresponding to the fourth and third openings, and a trench corresponding to the first opening. First and second vias and a wiring are formed to fill the first and second via holes and the trench.

20 Claims, 80 Drawing Sheets

(51) Int. Cl.
H01L 21/8234 (2006.01)
H01L 21/768 (2006.01)
H01L 23/522 (2006.01)
H01L 23/528 (2006.01)
H01L 23/532 (2006.01)

(52) U.S. Cl.
CPC ............... *H01L 21/76816* (2013.01); *H01L 21/823431* (2013.01); *H01L 23/528* (2013.01); *H01L 23/5226* (2013.01); *H01L 23/53223* (2013.01); *H01L 23/53238* (2013.01); *H01L 23/53266* (2013.01)

(58) Field of Classification Search
CPC ......... H01L 23/53238; H01L 23/53266; H01L 21/82; H01L 21/76; H01L 21/823475; H01L 21/76811; H01L 21/76813; H01L 21/76816; H01L 21/823431
See application file for complete search history.

(56) References Cited

U.S. PATENT DOCUMENTS

| | | | |
|---|---|---|---|
| 8,029,971 | B2 | 10/2011 | Allen et al. |
| 2008/0035980 | A1 | 2/2008 | Jeon |

FOREIGN PATENT DOCUMENTS

| | | | |
|---|---|---|---|
| KR | 2010-0116389 | A | 11/2010 |
| KR | 10-1069167 | B1 | 9/2011 |

FIG. 82
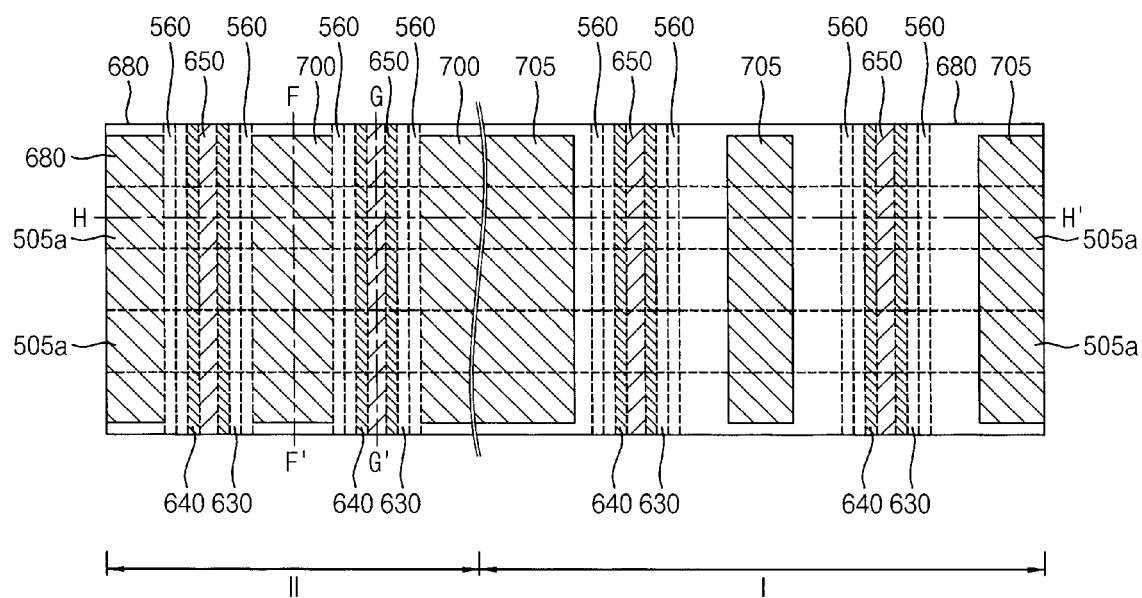
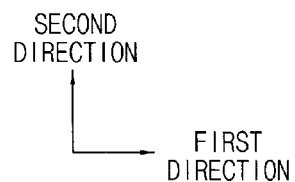

WIRING STRUCTURE AND METHOD OF FORMING THE SAME, AND SEMICONDUCTOR DEVICE INCLUDING THE WIRING STRUCTURE

CROSS-REFERENCE TO RELATED APPLICATION

This application claims priority under 35 USC §119 to Korean Patent Application No. 10-2015-0091946, filed on Jun. 29, 2015 in the Korean Intellectual Property Office (KIPO), the contents of which are herein incorporated by reference in their entirety.

BACKGROUND

1. Field

Example embodiments relate to a wiring structure and a method of forming the same, and/or to a semiconductor device including the wiring structure.

2. Description of the Related Art

A via under a wiring may be formed by forming an etching mask having an opening on an insulating interlayer, etching the insulating interlayer using the etching mask to form a via hole, and filling the via hole with a conductive material. A via hole, which may be formed with a relatively low density, may be formed to have a smaller size than the opening in the etching mask, and thus a via filling the via hole and a wiring contacting the via may contact each other at a small area, which may increase the resistance therebetween.

SUMMARY

Example embodiments provide a wiring structure having a low resistance.

Example embodiments provide a method of forming a wiring structure having a low resistance.

Example embodiments provide a semiconductor device including a wiring structure having a low resistance.

Example embodiments relate to a method of forming a wiring structure. In the example method, a first mask including a first opening may be fabricated. The first opening may include a first portion and a second portion. The first portion may extend in a second direction, and the second portion may extend in a first direction crossing the second direction and be in communication with the first portion. A second mask including a second opening and a plurality of third openings may be designed. The second opening may at least partially vertically overlap with the first portion of the first opening, and each of the third openings may a least partially vertically overlap with the second portion of the first opening. The second mask may be fabricated to include a fourth opening by enlarging the second opening. The fourth opening may at least partially vertically overlap with a boundary between the first and second portions of the first opening. An insulating interlayer on a substrate may be etched using the fabricated first and second masks to form first and second via holes at lower portions of the insulating interlayer and a trench at an upper portion of the insulating interlayer. The first and second via holes may correspond to the fourth and third openings, respectively, and the trench may correspond to the first opening and be in communication with the first and second via holes. First and second vias and a wiring may be formed. The first and second vias may fill the first and second via holes, respectively, and the wiring may fill the trench.

In example embodiments, a distance between neighboring ones of the third openings may be smaller than a shortest distance between the second opening and the third openings.

In example embodiments, the second opening may include a plurality of second openings. A first distance between neighboring ones of the second openings may be greater than a second distance between neighboring ones of the third openings.

In example embodiments, the first distance may be equal to or more than about ten times the second distance.

In example embodiments, the second opening may be enlarged in at least one of the first and second directions.

In example embodiments, when the insulating interlayer is etched to form the first and second via holes and the trench, first and second etching masks may be formed on the insulating interlayer using the first and second masks. An upper portion of the insulating interlayer may be etched using the first and second etching masks. The second etching mask may be removed. Upper and lower portions of the insulating interlayer may be etched using the first etching mask.

In example embodiments, when the upper portion of the insulating interlayer is etched using the first and second etching masks, a portion of the insulating interlayer commonly overlapping with the first and third openings or commonly overlapping with the first and fourth openings may be etched.

In example embodiments, the portion of the insulating interlayer commonly overlapping with the first and fourth openings may be partially etched to form the first via hole.

In example embodiments, in a plan view, an area of the first via hole may be equal to or greater than an area of a portion commonly overlapping with the first and second openings.

In example embodiments, in a plan view, the trench may be formed to correspond to the first opening, and a corner of the trench at the boundary between the first and second portions of the first opening may have a rounded shape.

In example embodiments, in a plan view, the rounded shape of the trench may have a protrusion protruding therefrom.

In example embodiments, the first via hole may at least partially vertically overlap with the rounded shape of the trench.

In example embodiments, the first and second directions may cross each other at a substantially right angle.

In example embodiments, when the first and second vias and the wiring are formed, a barrier layer may be formed on inner walls of the first and second via holes and the trench, the insulating interlayer and the first etching mask. A metal layer may be formed on the barrier layer to fill the first and second via holes and the trench. The metal layer and the barrier layer may be planarized until a top surface of the insulating interlayer may be exposed.

Example embodiments relate to a method of forming a wiring structure. In the example method, a first mask including a first opening may be fabricated. The first opening may include a first portion and a second portion. The first portion may extend in a second direction, and the second portion may extend in a first direction crossing the second direction and be in communication with the first portion. A second mask including a plurality of second openings and a plurality of third openings may be desired. The second openings may be in a first region at a first density, and the third openings may be in a second region at a second density that is greater than the first density. At least one of the second openings may overlap with the first portion of the first opening, and at least one of the third openings may overlap with the second portion of the first opening. The second mask may be fabricated to include a plurality of fourth openings by enlarging the second openings. At least one of the fourth openings formed by enlarging the at least one of the second openings may overlap with the first portion of the first opening overlapping with a boundary between the first and second portions of the first opening. An insulating interlayer on a substrate may be etched using the fabricated first and second masks to form via holes and a trench in communication with upper portions of the via holes. Vias and a wiring may be formed. The vias may fill the via holes, respectively, and the wiring may fill the trench.

In example embodiments, the second density may be equal to or more than about ten times the first density.

In example embodiments, each of or one or more of, the fourth openings may be formed by enlarging each of the second openings in at least one of the first and second directions.

In example embodiments, when the insulating interlayer is etched using the fabricated first and second masks to form the via holes and the trench, first and second etching masks may be formed on the insulating interlayer using the first and second masks. An upper portion of the insulating interlayer may be etched using the first and second etching masks. The second etching mask may be removed. Upper and lower portions of the insulating interlayer may be etched using the first etching mask.

In example embodiments, in a plan view, the trench may be formed to correspond to the first opening, and a corner of the trench at the boundary between the first and second portions of the first opening may have a rounded shape.

In example embodiments, in a plan view, the rounded shape of the trench may have a protrusion protruding therefrom.

Example embodiments relate to a wiring structure. The wiring structure may include an insulating interlayer, a wiring, and a via structure. The insulating interlayer may be formed on a substrate. The wiring may be formed in an upper portion of the insulating interlayer, and may include a first portion and a second portion. The first portion may extend in a second direction, and the second portion may extend in a first direction crossing the second direction and be connected to the first portion. A corner of the wiring at which the first and second portions are connected to each other may have a rounded shape. The via structure may be formed in a lower portion of the insulating interlayer. The via structure may include first vias and second vias. The first vias may be in a first region at a first density, and at least one of the first vias may contact a bottom of the first portion of the wiring. The second vias may be in a second region at a second density that is greater than the first density, and at least one of the second vias may contact a bottom of the second portion of the wiring. The at least one of the first vias contacting the bottom of the first portion of the wiring may at least partially contact the rounded corner of the wiring.

In example embodiments, in a plan view, the at least one of the first vias may have a corner with a rounded shape corresponding to the rounded shape of the corner of the wiring.

In example embodiments, the rounded corner of the wiring may include a protrusion protruding therefrom in a plan view.

In example embodiments, the at least one of the first vias may be adjacent to the protrusion of the rounded corner of the wiring, but may not contact a bottom of the protrusion.

In example embodiments, in a plan view, an area of the at least one of the first vias contacting the bottom of the first portion of the wiring may be equal to or greater than an area of the at least one of the second vias contacting the bottom of the second portion of the wiring.

In example embodiments, the second density may be equal to or more than about ten times the first density.

In example embodiments, the first and second directions may cross each other at a substantially right angle.

In example embodiments, the at least one of the first vias contacting the bottom of the first portion of the wiring may include a first metal pattern and a first barrier pattern covering a bottom and a sidewall of the first pattern. The at least one of the second vias contacting the bottom of the second portion of the wiring may include a second metal pattern and a second barrier pattern covering a bottom and a sidewall of the second metal pattern. The wiring may include a third metal pattern and a third barrier pattern covering a portion of a bottom and a sidewall of the third metal pattern.

In example embodiments, the first to third barrier patterns may include substantially the same material, and the first to third metal patterns may include substantially the same material.

Example embodiments relate to a wiring structure. The example wiring structure may include an active fin, a gate structure, a source/drain layer, a contact plug, a first insulating interlayer structure, a second insulating interlayer, a wiring, and a via structure. The active fin may be formed on a substrate, and may partially protrude from an isolation pattern on the substrate and extending in a first direction. The gate structure may be formed on the active fin and the isolation pattern, and may extend in a second direction crossing the first direction. The source/drain layer may be formed on a portion of the active fin adjacent to the gate structure. The contact plug may be formed on the source/drain layer. The first insulating interlayer structure may contain the gate structure, the source/drain layer and the contact plug. The second insulating interlayer may be formed on the first insulating interlayer structure. The wiring may be formed in an upper portion of the second insulating interlayer, and may include a first portion and a second portion. The first portion may extend in a fourth direction, and the second portion may extend in a third direction crossing the fourth direction and be connected to the first portion. A corner of the wiring at which the first and second portions may be connected to each other may have a rounded shape. The via structure may be formed in a lower portion of the second insulating interlayer, and may include first vias and second vias. The first vias may be in a first region at a first density, and at least one of the first vias may contact a bottom of the first portion of the wiring. The second vias may be in a second region at a second density that is greater than the first density, and at least one of the second vias may contact a bottom of the second portion of the wiring. The at least one of the first vias contacting the bottom of the first portion of the wiring may at least partially contact the rounded corner of the wiring.

In example embodiments, in a plan view, the at least one of the first vias may have a corner with a rounded shape corresponding to the rounded shape of the corner of the wiring.

In example embodiments, the rounded corner of the wiring may include a protrusion protruding therefrom in a plan view.

In example embodiments, the at least one of the first vias may be adjacent to the protrusion of the rounded corner of the wiring, hut may not contact a bottom of the protrusion.

In example embodiments, in a plan view, an area of the at least one of the first vias contacting the bottom of the first portion of the wiring may be equal to or greater than an area of the at least one of the second vias contacting the bottom of the second portion of the wiring.

In example embodiments, the first and third directions may be substantially parallel to each other, the second and fourth directions may be substantially parallel to each other, and the first and second directions may cross each other at a substantially right angle.

Example embodiments relate to a semiconductor device that includes an insulating interlayer on a substrate, a wiring in the insulating interlayer, the wiring including a first portion extending in a first direction, a second portion extending in a second direction, and a bent portion connecting the first portion and the second portion, and a via structure in the insulating interlayer between the wiring and the substrate. The via structure may include at least one first via in contact with the first portion of the wiring and at least partially in contact with the bent portion of the wiring, and at least one second via in contact with the second portion of the wiring.

When the wiring structure is formed in accordance with example embodiments, the contact area between the first vias with a low density and the overlying wiring may not decrease, and thus low resistance may be realized.

BRIEF DESCRIPTION OF THE DRAWINGS

Example embodiments will be more clearly understood from the following detailed description taken in conjunction with the accompanying drawings. The various figures represent non-limiting, example embodiments as described herein.

FIGS. 62 to 89 are plan views and cross-sectional views illustrating stages of a method of manufacturing a semiconductor device in accordance with example embodiments.

DESCRIPTION OF EMBODIMENTS

Figure 1:
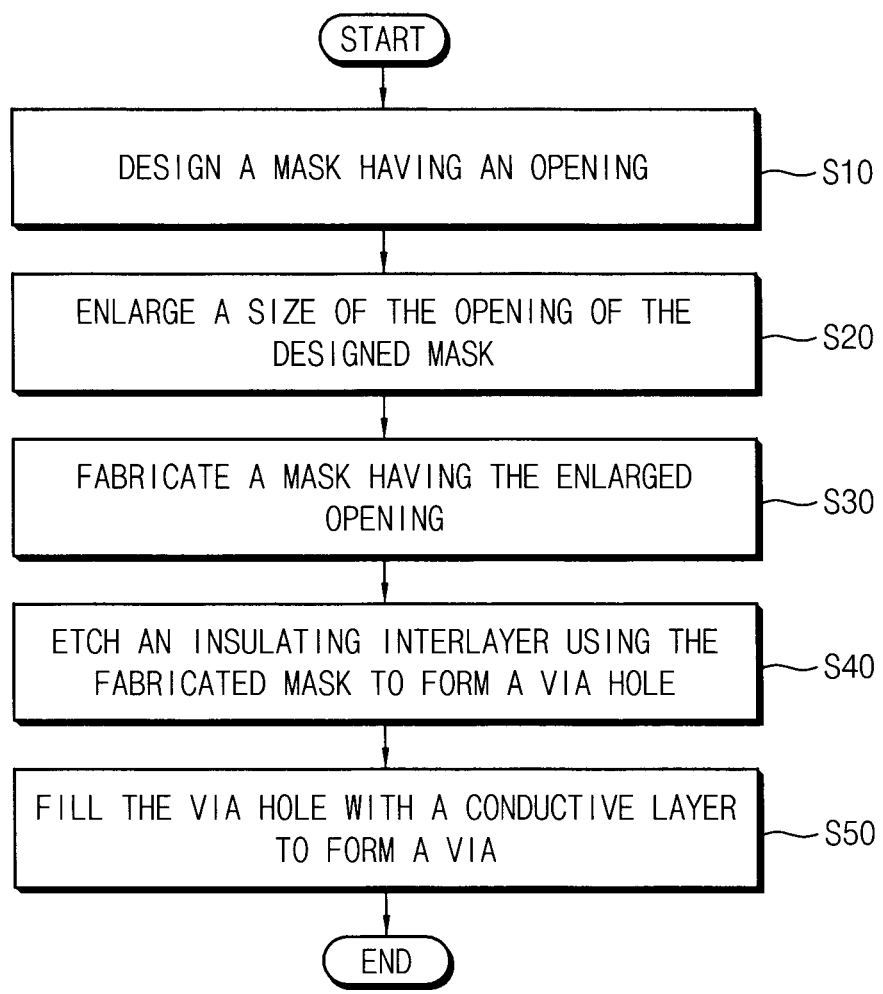
FIG. 1 is a flowchart illustrating stages of a method of forming a via in accordance with example embodiments.

Various example embodiments will be described more fully hereinafter with reference to the accompanying drawings, in which some example embodiments are shown. The present inventive concepts may, however, bodied in many different forms and should not be construed as limited to the example embodiments set forth herein. Rather, these example embodiments are provided so that this description will be thorough and complete, and will fully convey the scope of the present inventive concepts to those skilled in the art. In the drawings, the sizes and relative sizes of layers and regions may be exaggerated for clarity.

It will be understood that when an element or layer is referred to as being "on," "connected to" or "coupled to" another, element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

In the drawing figures, the dimensions of layers and regions may be exaggerated for clarity of illustration. Like reference numerals refer to like elements throughout. The same reference numbers indicate the same components throughout the specification.

The terminology used herein is for the purpose of describing particular example embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concepts.

Unless otherwise defined, all terms (including technical and scientific terms) used herein have the same meaning as commonly understood by one of ordinary skill in the art to which this inventive concepts belongs. It will be further understood that terms, such as the concepts defined in commonly used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a flowchart illustrating stages of a method of forming a via in accordance with example embodiments.

Referring to FIG. 1, in step S10, a mask having an opening may be designed.

In example embodiments, the mask may include a first region and a second region, and one or a plurality of first openings may be formed in the first region, and one or a plurality of second openings may be formed in the second region. The first openings may be formed at a first density in the first region, and the second openings may be formed at a second density that is greater than the first density in the second region. In example embodiments, the second density may be ten times or more the first density.

The first openings may be spaced apart from each other at a first distance that is greater than a second distance at which the second openings may be spaced apart from each other.

In example embodiments, at east one of the first openings and the second openings may have substantially the same size.

In step S20, the size of the opening of the designed mask may be enlarged.

Particularly, the size of the first opening in the first region may be enlarged. That is, the sizes of the second openings that are spaced apart from each other at a relatively short distance may be maintained, while the sizes of the first openings that are spaced apart from each other at a relatively large distance may be enlarged.

In example embodiments, the first opening may be enlarged in each of first and second directions, which may be substantially parallel to a top surface of the mask and substantially perpendicular to each other. Ratios of the enlargement of the first opening in the first and second directions may be substantially equal to or different from each other.

Alternatively, the first opening may be enlarged in only one of the first and second directions.

In step S30, a mask having the first opening with the enlarged size and the second openings with the original sizes may be fabricated.

The size of the first opening included in the mask originally designed may be enlarged, and a real mask including the enlarged first opening may be fabricated.

In step S40, an etch target layer on a substrate, e.g., a photoresist layer on an insulating interlayer may be etched using the fabricated real mask as an etching mask to form a photoresist pattern, and the insulating interlayer may be etched using the photoresist pattern as an etching mask to form a via hole through the insulating interlayer. The first and second openings included in the mask may be transferred to the photoresist pattern serving as the etching mask.

Portions of the insulating interlayer exposed by the first and second openings included in the mask may be removed to form first and second via holes. The etching mask may be also formed by patterning a metal nitride layer or a spin-on-hardmask (SOH) instead of the photoresist layer.

In example embodiments, the etching process may include a dry etching process using an etching gas. During the dry etching process, the portions of the insulating interlayer exposed by the first and second openings in the etching mask may be removed. Each of the portions of the insulating interlayer exposed by the second openings, which may be formed at a relatively high density, may be fully etched correspondingly to the size of each of the second openings, while each of the portions of the insulating interlayer exposed by the first openings, which may be formed at a relatively low density, may be partially etched only when compared to the size of each of the first openings.

In example embodiments, the first opening included in the fabricated real mask may have the enlarged size, and thus, even though the portion of the insulating interlayer exposed by the first opening is partially etched only, a size of the etched portion of the insulating interlayer may be substantially equal to that of the first opening originally designed. That is, in consideration of the fact that the portion of the insulating interlayer etched in the etching process may be smaller than the original size of the first opening in the etching mask, in step S20, the size of the first opening may be enlarged.

In example embodiments, by sufficiently enlarging the size of the first opening in step S20, the removed portion of the insulating interlayer in step S40 may be substantially equal to or greater than the original size of the first opening designed in step S10. Accordingly, when the sizes of the first and second openings designed in step S10 are substantially equal to each other, the first via hole, which may be formed by removing the portion of the insulating interlayer exposed by the first opening in step S40, may have a size that is substantially equal to or greater than a size of the second via hole, which may be formed by removing the portion of the insulating interlayer exposed by the second opening in step S40.

In step S50, the via hole may be filled to form a via.

For example, a barrier layer may be formed on inner walls of the first and second via holes, a conductive layer may be formed on the barrier layer to sufficiently fill the first and second via holes, and the conductive layer and the barrier layer may be planarized until a top surface of the insulating interlayer may be exposed to form first and second vias filling the first and second via holes, respectively.

By the above example processes, the first and second vias, which may be formed at different densities from each other in the first and second regions, respectively, may be formed to have substantially the same size.

FIGS. 2 to 15 are plan views and cross-sectional views illustrating stages of a method of forming a wiring structure in accordance with example embodiments. Particularly, FIGS. 2, 3, 4, 7, 10 and 13 are plan views thereof, and FIGS. 5, 6, 8, 9, 11, 12, 14 and 15 are cross-sectional views thereof. FIGS. 5, 8, 11 and 14 are cross-sectional views taken along lines A-A' of corresponding plan views, respectively, and FIGS. 6, 9, 12 and 15 are cross-sectional views taken along lines of corresponding plan views, respectively.

This example method of forming the wiring structure may include processes that are substantially the same as or similar to the processes illustrated with reference to FIG. 1, and detailed descriptions thereon are omitted herein.

Figure 2:
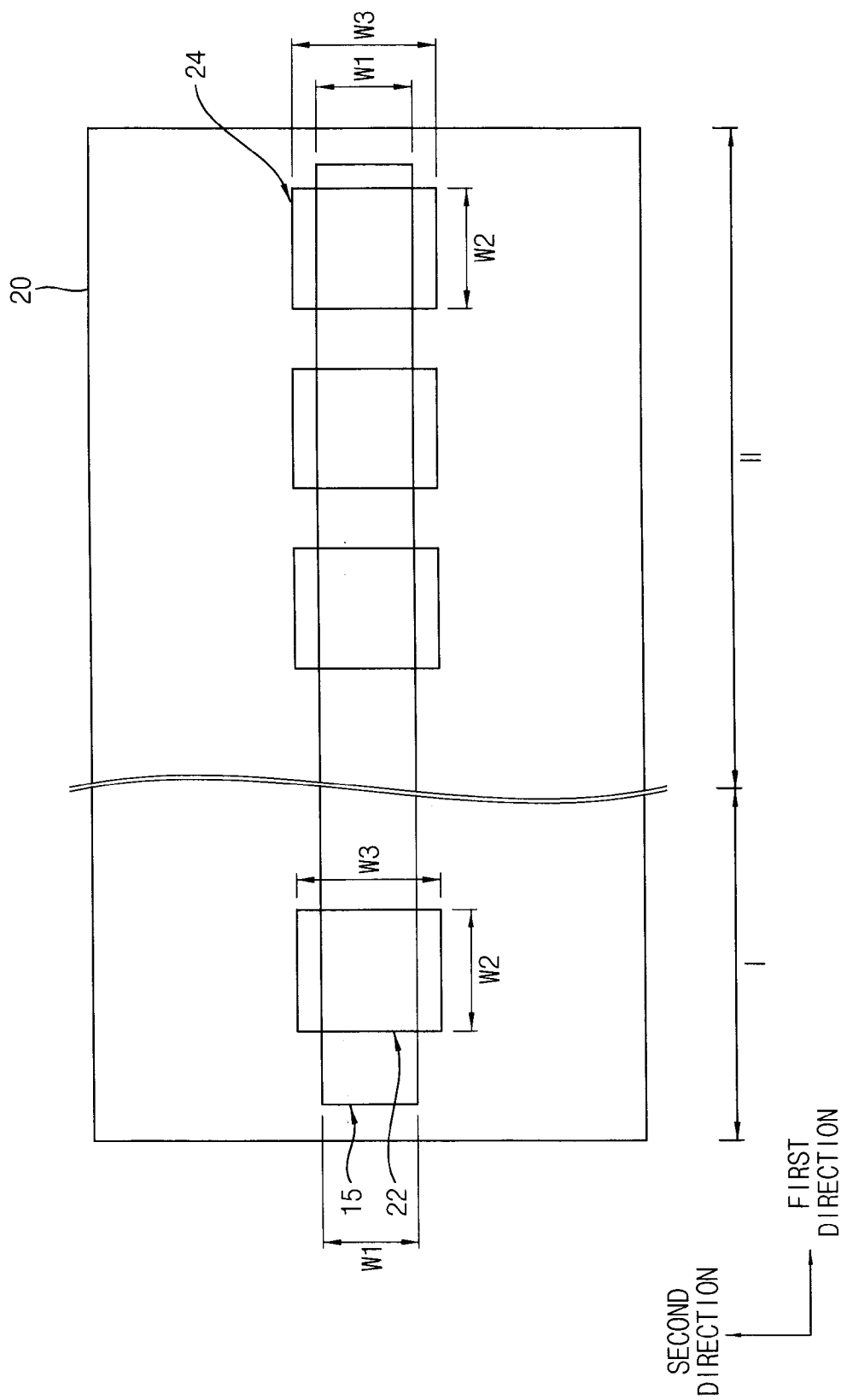
FIGS. 2 to 15 are plan views and cross-sectional views illustrating stages of a method of forming a wiring structure in accordance with example embodiments.

Referring to FIG. 2, a first mask (not shown) having a first opening 15 may be designed, and a second mask 20 having second and third openings 22 and 24 may be designed.

Each of the first mask and the second mask 20 may include first and second regions I and II. The first mask and the second mask 20 may vertically overlap with each other, and thus the first and second regions I and II of the first mask and of the second mask 20 may also vertically overlap with each other.

The first opening 15 in the first mask may extend in a first direction in the first and second regions I and II, and may have a first width W1 in a second direction that may be substantially perpendicular to the first direction.

The second and third openings 22 and 24 in the second mask 20 may be formed in the first and second regions I and II, respectively. In example embodiments, one or a plurality of second openings 22 may be formed in the first region I, and a plurality of third openings 24 may be formed in the second region II.

When one second opening 22 is formed in the first region I, a shortest distance between the second opening 22 and the third openings 24 may be greater than a distance between neighboring third openings 24. When a plurality of second openings 22 is formed, a distance between neighboring second openings 22 may be greater than a distance between neighboring third openings 24.

That is, a density of the second opening 22 in the first region I may be less than a density of the third opening 24 in the second region II. In an example embodiment, the second density may be more than about ten times the first density.

In example embodiments, the second opening 22 may have second and third widths W2 and W3 in the first and second directions, respectively, and the third opening 24 may also have the second and third widths W2 and W3 in the first and second directions, respectively. However, the inventive concepts may not be limited thereto, and the second and third openings 22 and 24 may have different openings sizes.

In example embodiments, each of the second and third openings 22 and 24 in the second mask 20 may at least partially vertically overlap with the first opening 15 in the first mask. In the figure, the third width W3 of each of the second and third openings 22 and 24 in the second direction is greater than the first width W1 of the first opening 15 in the second direction, however, the inventive concepts may not be limited thereto. If only each of the second and third openings 22 and 24 at least partially overlaps with the first opening 15, the third width W3 of each of the second and third openings 22 and 24 in the second direction may be smaller than the first width W1 of the first opening 15 in the second direction.

In FIG. 2, only second and third openings 22 and 24 at least partially overlapping with the first opening 15 are shown, however, the inventive concepts may not be limited thereto. If only a plurality of second openings 22 and a plurality of third openings 24 are formed in the first and second regions I and II, respectively, and at least one of the second openings 22 and at least one of the third openings 24 at least partially overlap with the first opening additional second and third openings 22 and 24 that are not overlapping with the first opening 15 may be further formed in the first and second regions I and II, respectively. In this case, the first density of the second opening 22 in the first region I may be smaller than the second density of the third opening 24 in the second region II. The additional second and third openings 22 and 24 that are not overlapping with the first opening 15 may overlap with other openings (not shown) in the first mask.

The designed first mask may be fabricated according to the original design.

Figure 3:
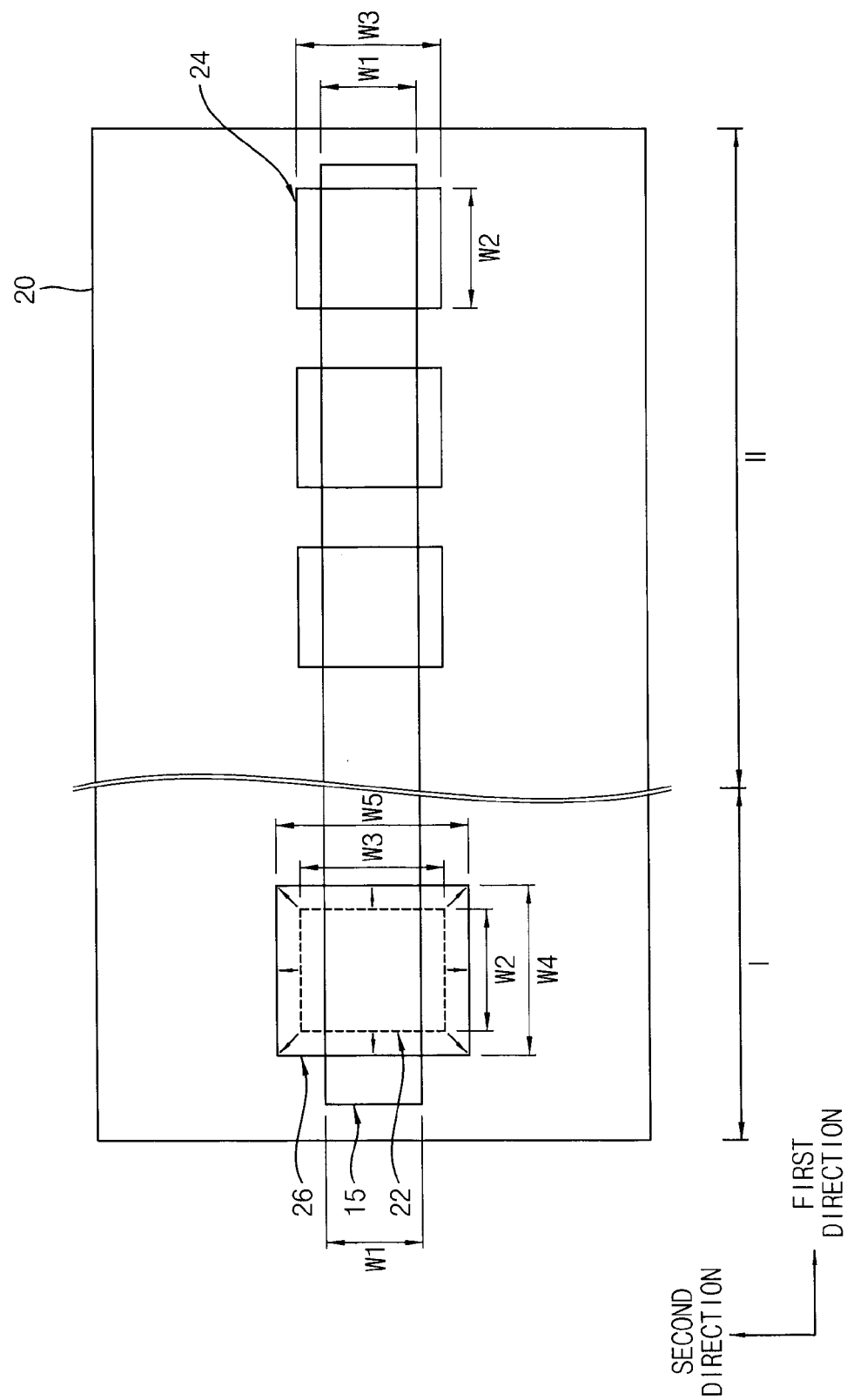

Referring to FIG. 3, the second opening 22 in the first region I may be horizontally enlarged to form a fourth opening 26, and the second mask 20 having the fourth opening 26 may be fabricated.

In example embodiments, the second opening 22 may be enlarged both in the first and second directions to form the fourth opening 26. Thus, the fourth opening 26 may have fourth and fifth widths W4 and W5 that are greater than the second and third widths W2 and W3, respectively.

Ratios of the enlargement of the second opening 22 in the first and second directions may be substantially equal to, or different from, each other.

Figure 4:
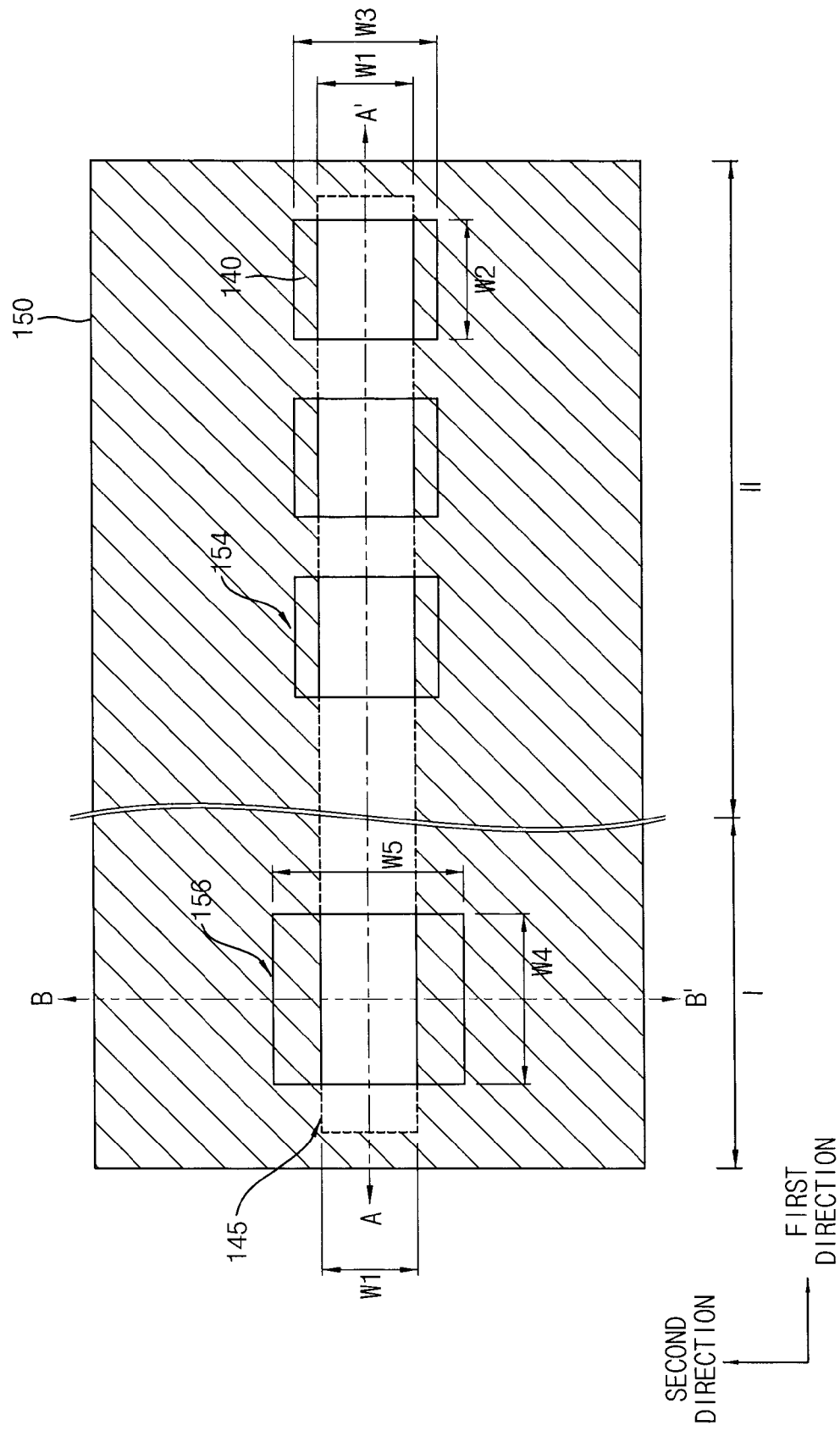
Figure 5:
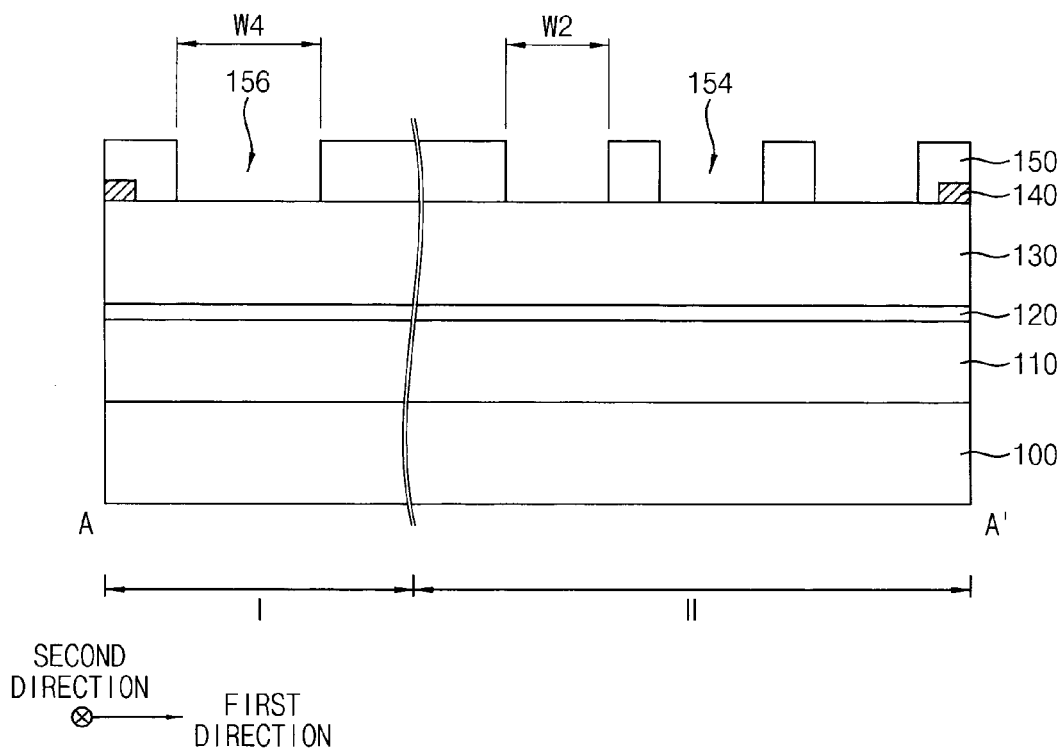
Figure 6:
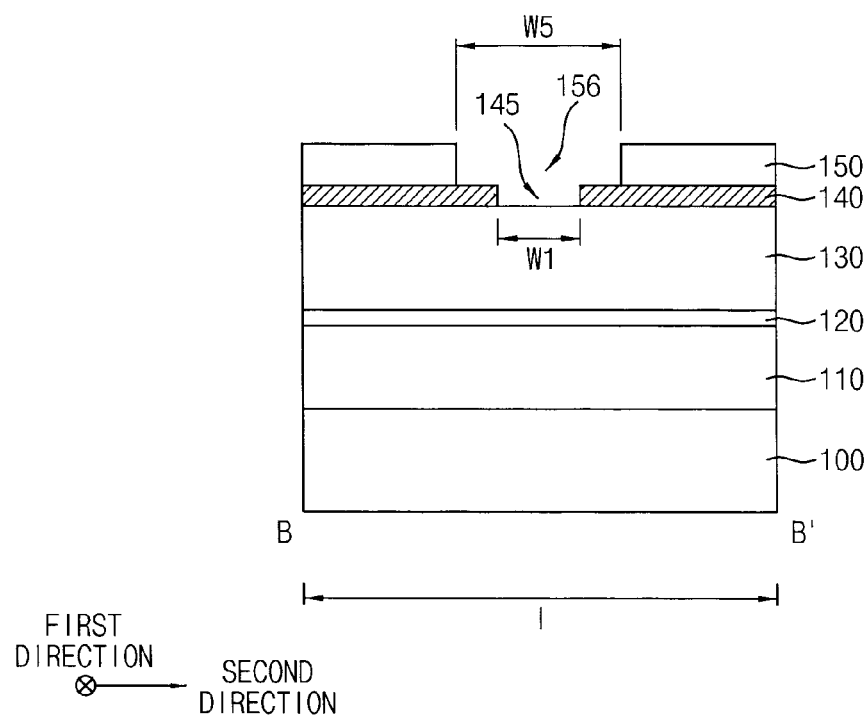

Referring to FIGS. 4 to 6, a first insulating interlayer 110, an etch stop layer 120 and a second insulating interlayer 130 may be formed, for example sequentially formed, on a substrate 100.

The substrate 100 may include a semiconductor material, e.g., silicon, germanium, silicon-germanium, etc., or III-V semiconductor compounds, e.g., GaP, GaAs, GaSb, etc. In an example embodiment, the substrate 100 may be a silicon-on-insulator (SOI) substrate or a germanium-on-insulator (GOI) substrate.

Various types of elements, e.g., a gate structure, a gate spacer, a source/drain layer, a contact plug, etc., may be formed on the substrate 100, which may be covered by the first insulting interlayer 110.

The first insulating interlayer 110 may be formed of or include an oxide, e.g., silicon oxide, the etch stop layer 120 may be formed of or include a nitride, e.g., silicon nitride, and the second insulating interlayer 130 may be formed of or include a low-k dielectric material, e.g., silicon oxide doped with carbon (SiCOH) or silicon oxide doped with fluorine (F—$SiO_2$), a porous silicon oxide, spin on organic polymer, or an inorganic polymer, e.g., hydrogen silsesquioxane (HSSQ), methyl silsesquioxane (MSSQ), etc. In some embodiments, the etch stop layer 120 may not be formed.

First and second etching masks 140 and 150 may be formed, for example sequentially formed, on the second insulating interlayer 130 using the first mask fabricated by the processes illustrated with reference to FIG. 2 and the second mask 20 fabricated by processes illustrated with reference to FIG. 3.

In an example embodiment, the first etching mask 140 may be formed by forming, for example sequentially forming, a first etching mask layer and a photoresist layer (not shown) on the second insulating interlayer 130, patterning the photoresist layer using the first mask as an etching mask to form a photoresist pattern (not shown), and etching the first etching mask layer using the photoresist pattern as an etching mask. Alternatively, the first etching mask 140 may be formed by forming a first etching mask layer on the second insulating interlayer 130, forming the first mask directly on the first etching mask layer, and etching the first etching mask layer using the first mask as an etching mask.

Accordingly, the first etching mask 140 may have a first opening 145 corresponding to the first opening 15 in the first mask. Likewise, the second mask 150 may also have third and fourth openings 154 and 156 corresponding to the third and fourth openings 24 and 26, respectively, in the second mask 20. In example embodiments, sizes of the first, third and fourth openings 145, 154 and 156 in the first and second etching masks 140 and 150 may be substantially equal to, greater than, or smaller than the sizes of the first, third and fourth openings 15, 24 and 26, respectively, in the first and second masks at given ratios. Hereinafter, only the case in which the sizes of the first, third and fourth openings 145, 154 and 156 in the first and second etching masks 140 and 150 are substantially equal to the sizes of the first, third and fourth openings 15, 24 and 26, respectively, in the first and second masks will be illustrated.

The first opening 145 may extend in a first direction that is substantially parallel to a top surface of the substrate 100 in the first and second regions I and II, and may have a first width W1 in a second direction that is substantially parallel to the top surface of the substrate 100 and substantially perpendicular to the first direction. The third opening 154 may have second and third widths W2 and W3 in the first and second directions, respectively, and the fourth opening 156 may have fourth and fifth widths W4 and W5 in the first and second directions, respectively.

In example embodiments, the third and fifth widths W3 and W5 in the second direction of the third and fourth openings 154 and 156, respectively, may be greater than the first width W1, and thus a top surface of the first etching mask 140 may be partially exposed.

In example embodiments, the first etching mask 140 may be formed of or include a metal nitride, e.g., titanium nitride, tantalum nitride, etc., and the second etching mask 150 may be formed of or include, SOH.

Figure 7:
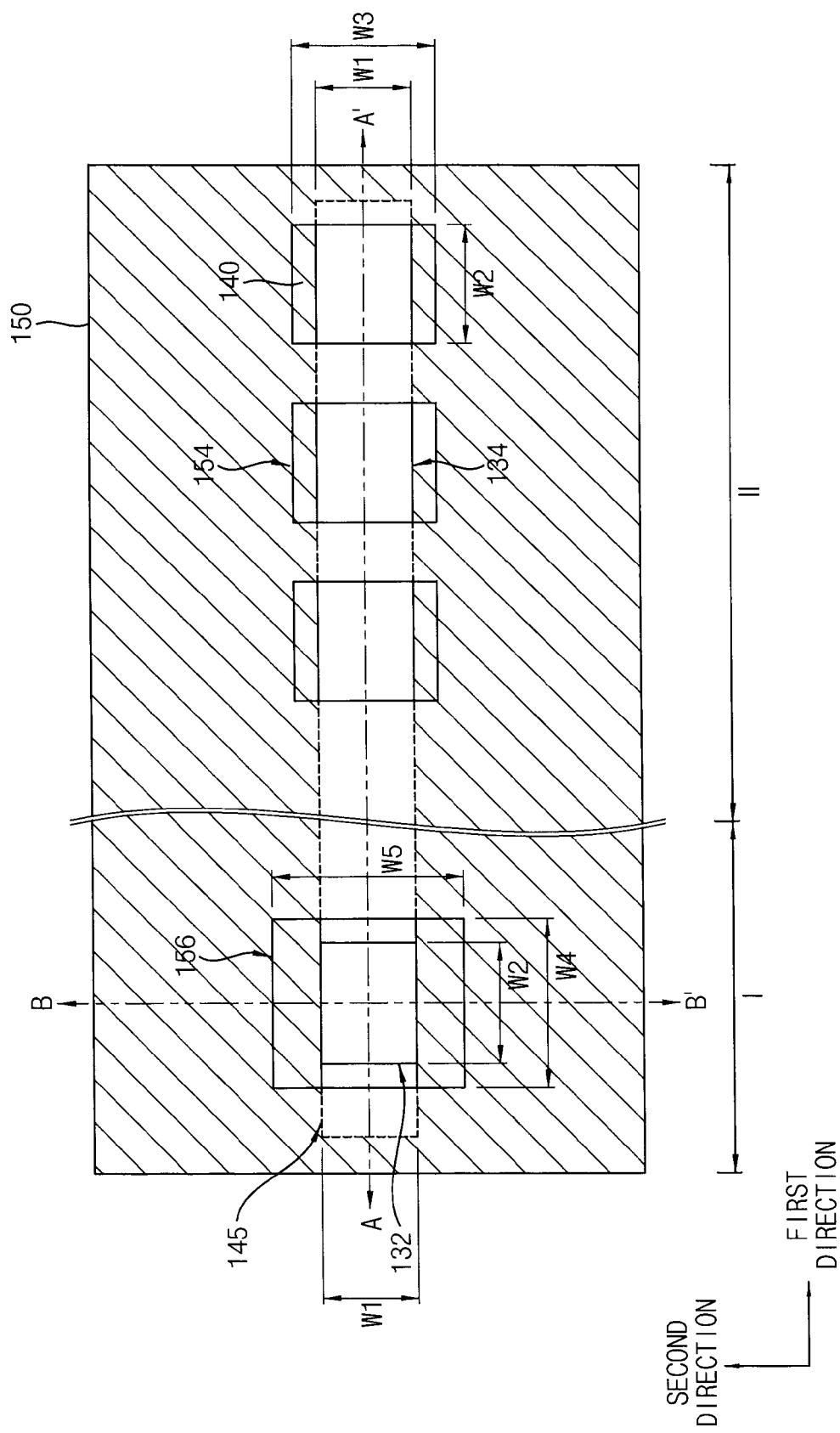
Figure 8:
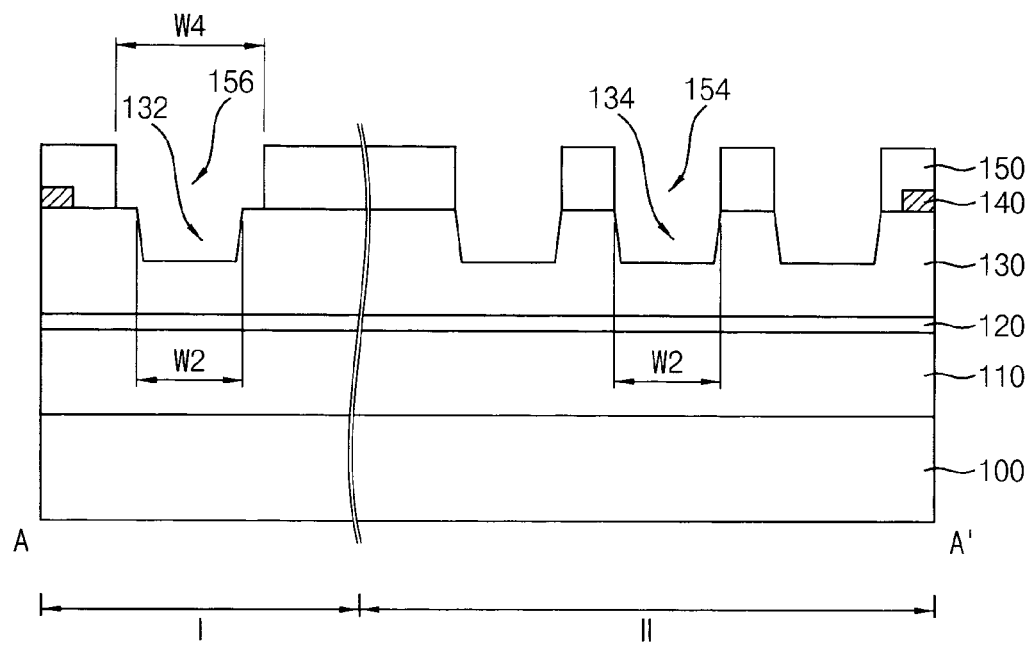
Figure 9:
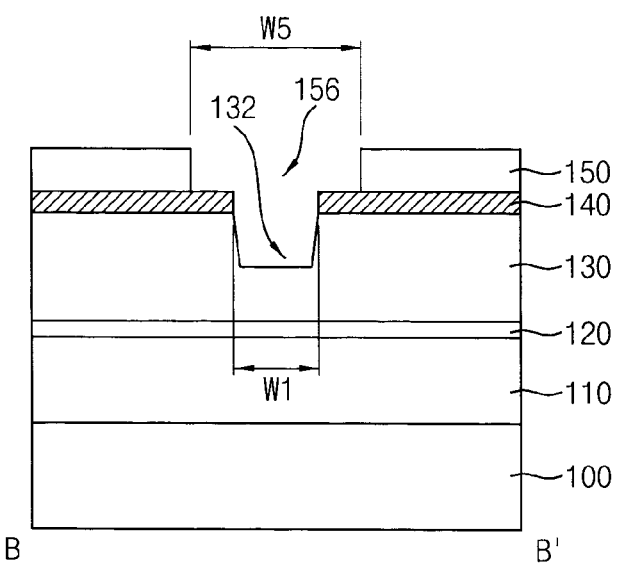

Referring to FIGS. 7 to 9, an upper portion of the second insulating interlayer 130 may be etched using the first and second etching masks 140 and 150 to form first and second recesses 132 and 134.

In example embodiments, the first recess 132 may be formed by etching a portion of the second insulating interlayer 130 commonly exposed by the first and fourth openings 145 and 156 in the first and second etching masks 140 and 150, respectively, and the second recess 134 may be formed by etching a portion of the second insulating interlayer 130 commonly exposed by the first and third openings 145 and 154 in the first and second etching masks 140 and 150, respectively.

In example embodiments, the etching process may include a dry etching process using an etching gas. During the dry etching process, a portion of the second insulating interlayer 130 exposed by each of the third openings 154, which may be formed at a relatively high density, may be fully etched correspondingly to the size of each of the third openings 154, while a portion of the second insulating interlayer 130 exposed by the fourth openings 156, which may be formed at a relatively low density, may be partially etched only when compared to the size of each of the fourth openings 156.

In example embodiments, each of the fourth openings 156 may be greater than each of the second openings 22 originally designed, and thus, a size of the etched portion of the second insulating interlayer 130 may be substantially equal to, or greater than, the size of each of the second openings 22 originally designed.

Accordingly, when the second and third openings 22 and 24 in the first and second masks, respectively, have substantially the same size, the first and second recesses 132 and 134, which may be formed using the first and second etching masks 140 and 150, may have substantially the same size, or the first recess 132 may have a size greater than the size of the second recess 134. When the fourth opening 156 is not sufficiently greater than the second opening 22, the first recess 132 may be smaller than the second recess 134.

Hereinafter, only the example in which the first and second recesses 132 and 134 have substantially the same size, that is, when each of the first and second recesses 132 and 134 has the second and first widths W2 and W1 in the first and second directions, respectively, will be illustrated.

Figure 10:
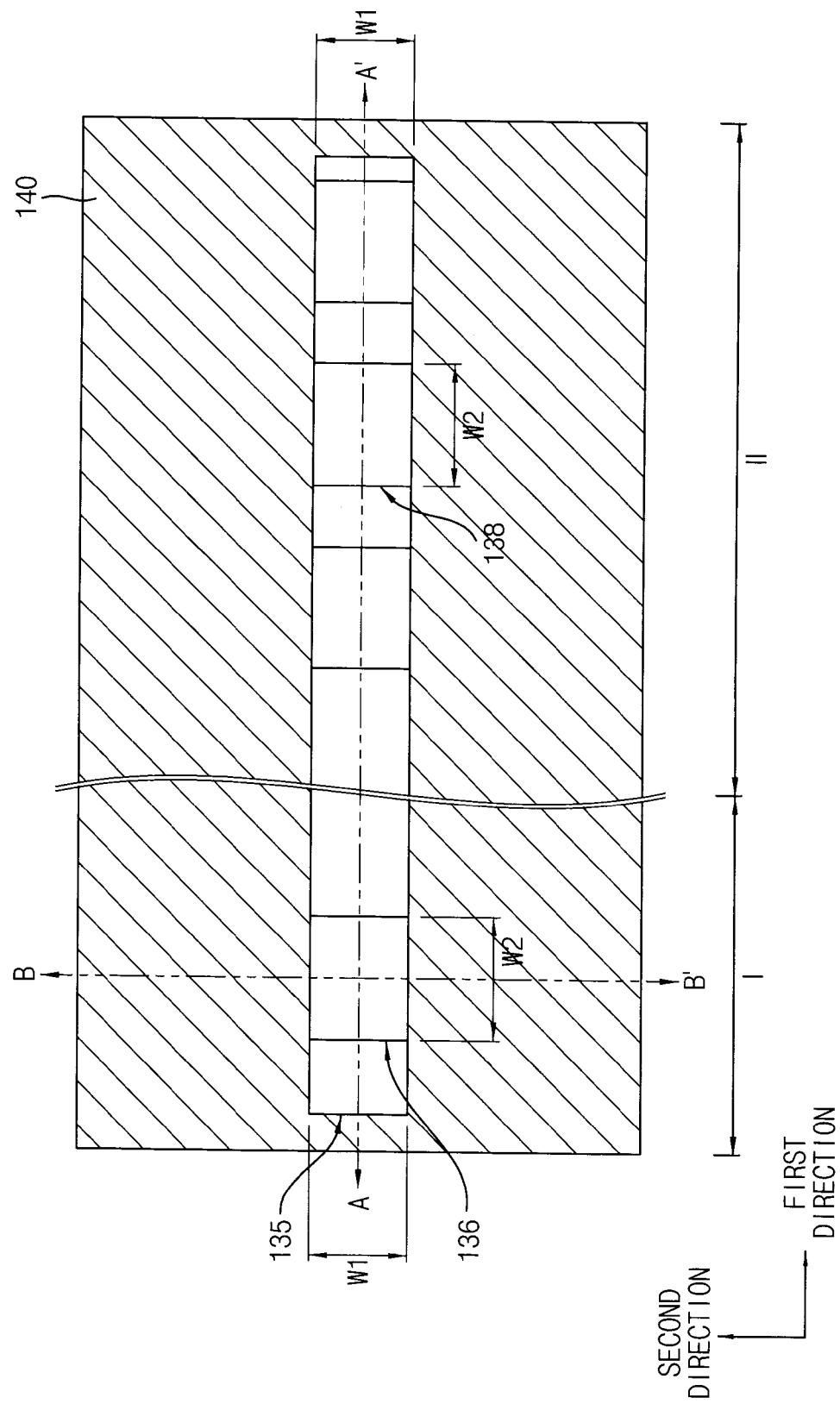
Figure 11:
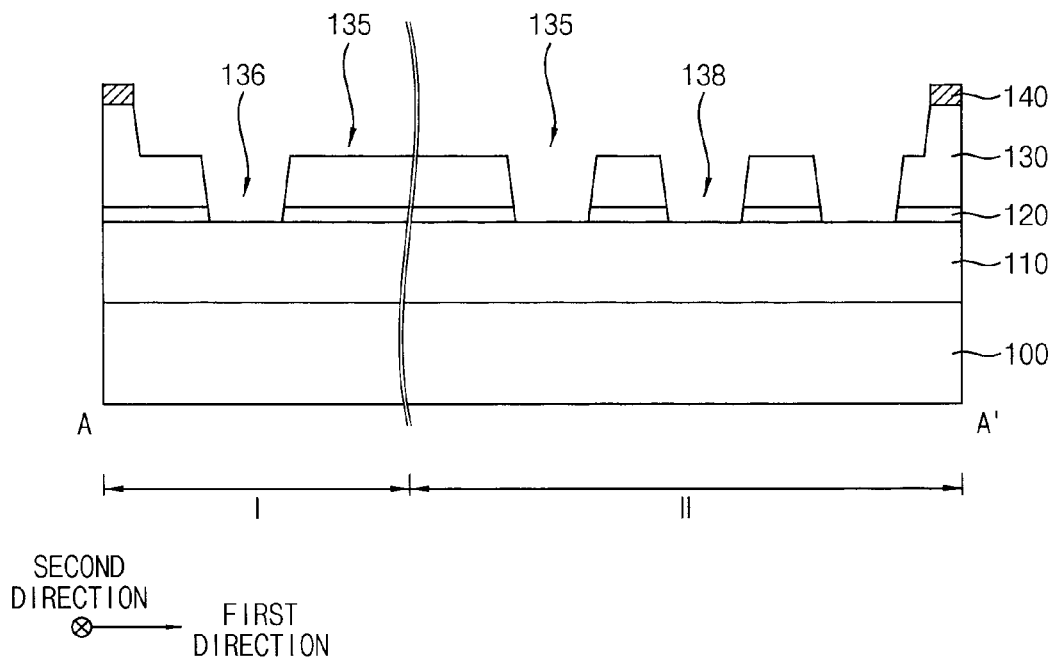
Figure 12:
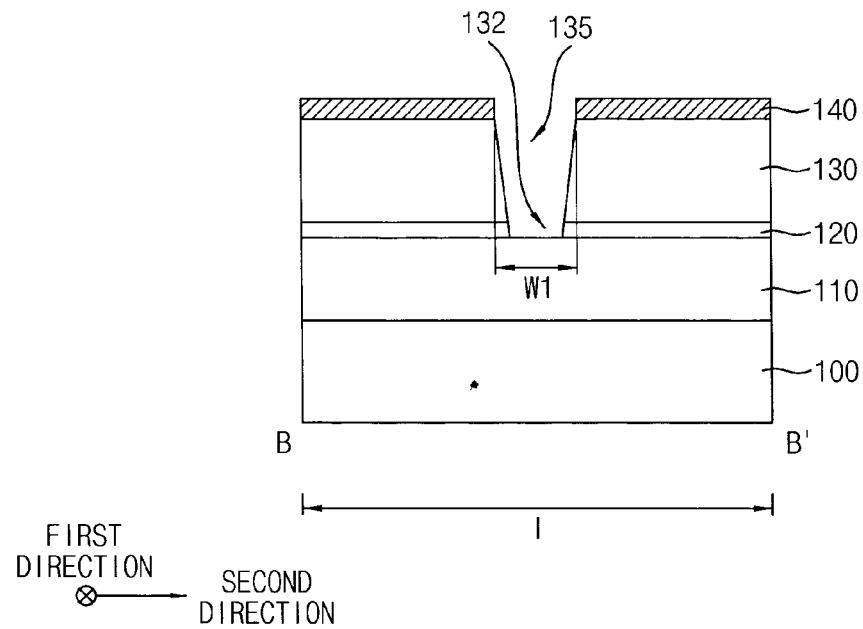

Referring to FIGS. 10 to 12, after removing the second etching mask 150, the second insulating interlayer 130 may be etched using the first etching mask 140 to form a trench 135 at an upper portion of the second insulating interlayer 130 and first and second via holes 136 and 138 at lower portions of the second insulating interlayer 130.

Each of the first and second via holes 136 and 138 may expose a top surface of the etch stop layer 120, and the exposed etch stop layer 120 may be further etched to expose a top surface of a contact plug (not shown) contained in the first insulating interlayer 110.

The trench 135 may extend in the first direction, and may have the first width W1 in the second direction. Each of the first and second via holes 136 and 138 may be formed to have the second and first widths W2 and W1 in the first and second directions, respectively.

Figure 13:
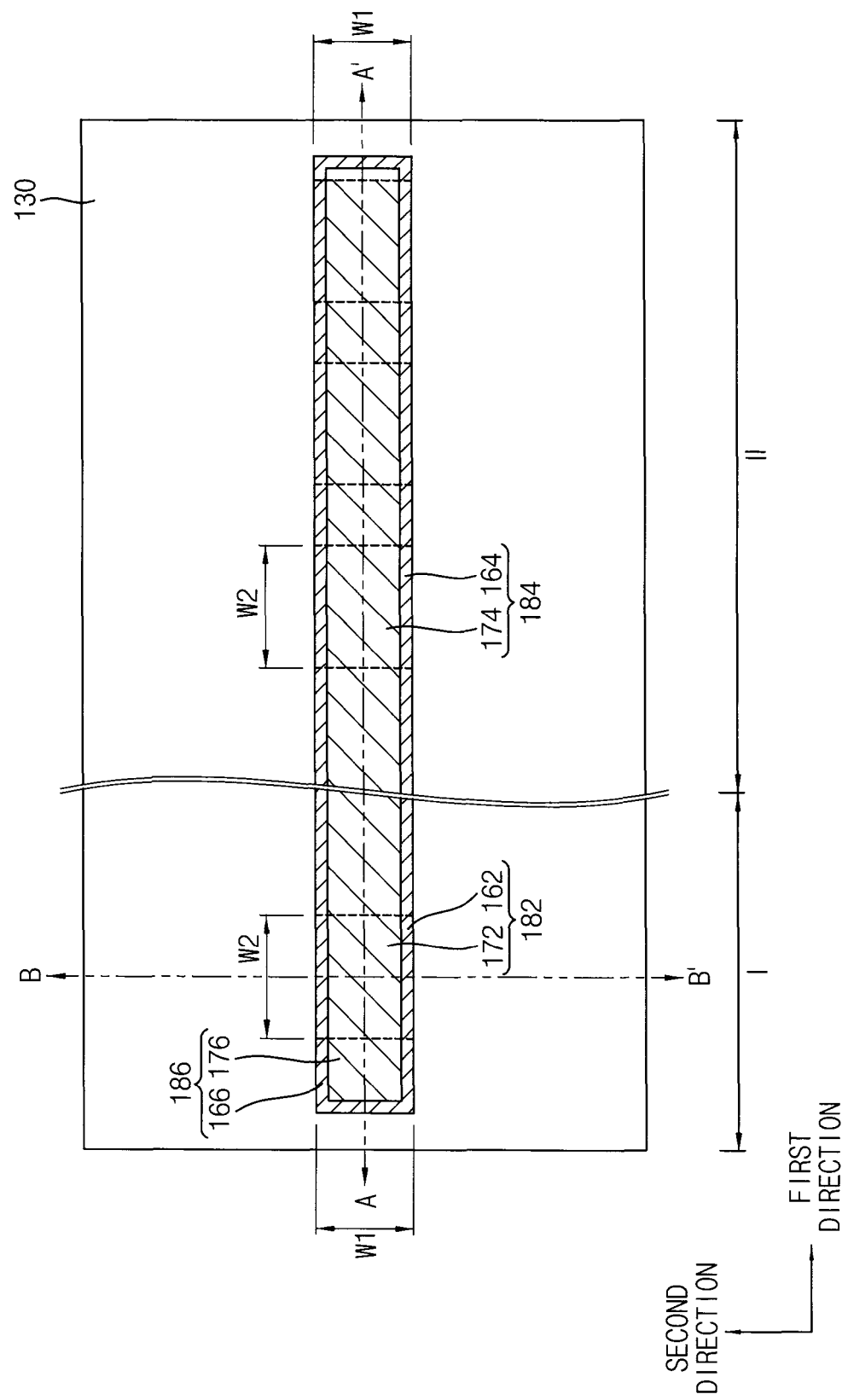
Figure 14:
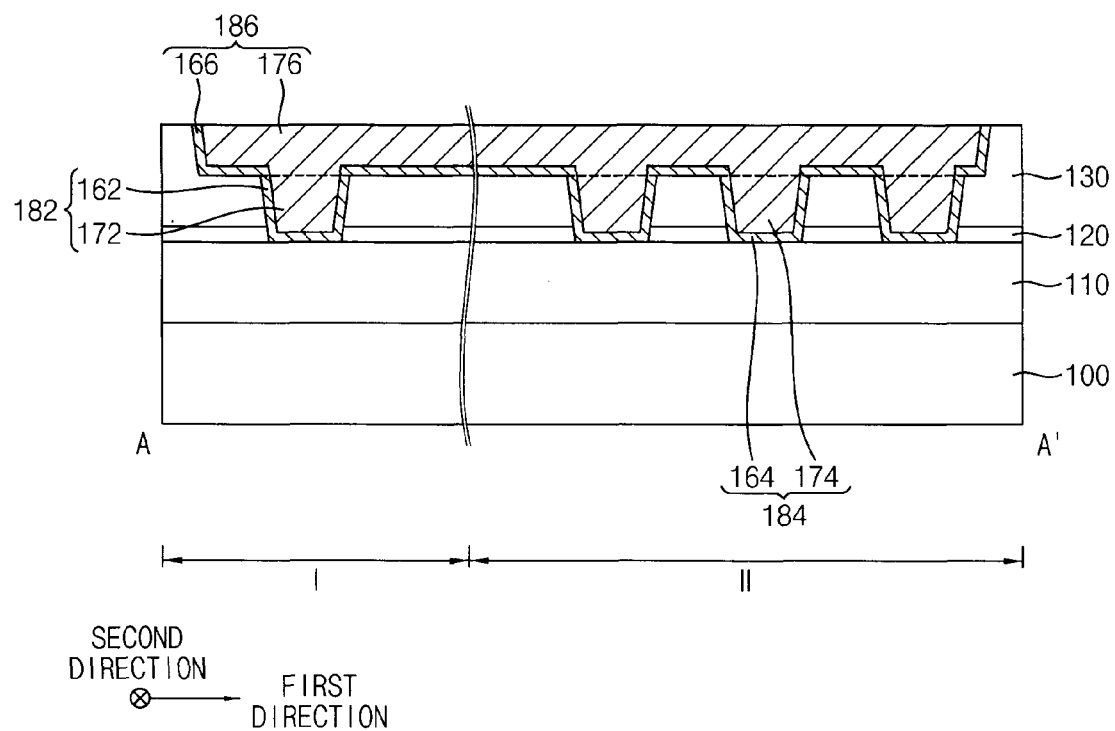
Figure 15:
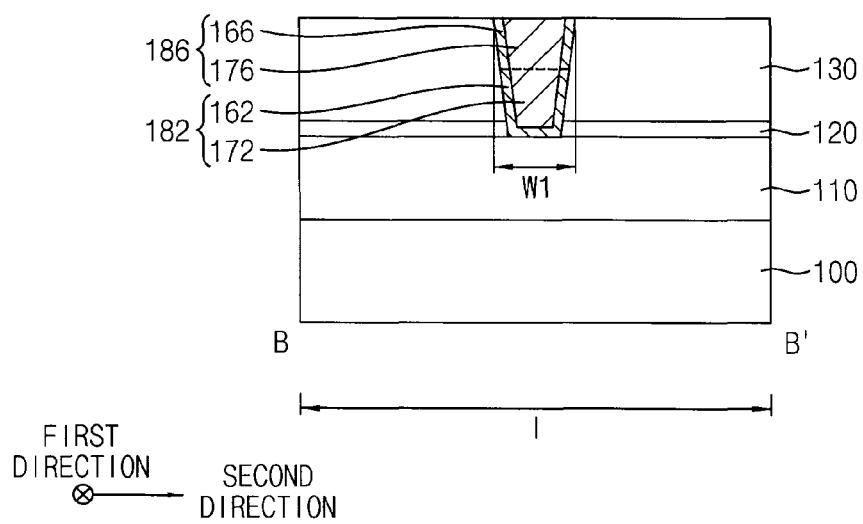

Referring to FIGS. 13 to 15, a barrier layer may be formed on inner walls of the trench 135 and the first and second via holes 136 and 138, the exposed top surface of the contact plug and the first etching mask 140, a metal layer may be formed on the barrier layer to sufficiently fill remaining portions of the trench 135 and the first and second via holes 136 and 138, and planarizing the metal layer and the barrier layer until a top surface of the second insulating interlayer 130 to form a wiring 186 and first and second vias 182 and 184 in the trench 135 and the first and second via holes 136 and 138, respectively. The first etching mask 140 may be also removed.

The barrier layer may be formed of or include a metal nitride, e.g., tantalum nitride, titanium nitride, etc., and/or a metal, e.g., tantalum, titanium, etc. The metal layer may be formed of or include a metal, e.g., copper, aluminum, tungsten, etc.

In example embodiments, the barrier layer may be formed by a chemical vapor deposition (CVD) process, an atomic layer deposition (ALD) process, a physical vapor deposition (PVD) process, etc., and thus the barrier layer may be conformally formed on the inner walls of the trench 135 and the first and second via holes 136 and 138, the exposed top surface of the contact plug and the first etching mask 140. The metal layer may be formed by forming a seed layer (not shown) on the barrier layer, and performing an electroplating process.

Before forming the metal layer, a liner (not shown) may be further formed on the barrier layer. The liner may be formed of or include, e.g., cobalt, ruthenium, etc.

In example embodiments, the planarization process may be performed by, for example, a chemical mechanical polishing (CMP) process and/or an etch back process.

The first via 182 may include a first metal pattern 172 and a first barrier pattern 162 covering a bottom and a sidewall of the first metal pattern 172, and the second first via 184 may include a second metal pattern 174 and a second barrier pattern 164 covering a bottom and a sidewall of the second metal pattern 174. The wiring 186 may include a third metal pattern 176 and a third barrier pattern 166 covering a portion of a bottom and a sidewall of the third metal pattern 166.

The first and third metal patterns 172 and 176 may be stacked, for example sequentially stacked, to contact each other, and the first and third barrier patterns 162 and 166 may be stacked, for example sequentially stacked, to contact each other. The second and third metal patterns 174 and 176 may be stacked, for example sequentially stacked, to contact each other, and the second and third barrier patterns 164 and 166 may be stacked, for example sequentially stacked, to contact each other.

The first and second vias 182 and 184 may form a via structure, and may be formed at a lower portion of the second insulating interlayer 130. The wiring 186 may be formed at an upper portion of the second insulating interlayer 130 to contact the via structure, and the wiring 186 and the via structure may form the wiring structure.

As illustrated above, when the wiring structure including both of the first vias 182 with a low density and the second vias 184 with a high density is formed, the fourth opening 156 in the second etching mask 150 for forming the first via 182 may be formed by enlarging the second opening 22 in the second mask 20 for forming the second etching mask 150, and thus, even though the first via hole 136 for forming the first via 182 may have a size smaller than the fourth opening 156 in the real etching process using the second etching mask 150, the first via hole 136 may have a size that is substantially equal to or greater than the second opening 22 in the second mask 20 originally designed. Accordingly, a contact area between the first vias 182 with a low density and the wiring 186 overlying the first vias 182 may not decrease, and thus a low contact resistance may be realized. Additionally, the first vias 182 may be formed to have sizes that are substantially equal to the sizes of the second vias 184.

Up to now each of the first to fourth openings 15, 22, 24 and 26 has a rectangular shape in a plan view, and thus each of the first and second vias 182 and 184 and the wiring 186 has a rectangular shape in a plan view, however, the inventive concepts may not be limited thereto. At least one of the first to fourth openings 15, 22, 24 and 26 may have a shape, e.g., parallelogram, ellipse, circle, etc., other than a rectangular shape, and thus at least one of the first and second vias 182 and 184 and the wiring 186 may have the corresponding shape.

Even though some or all of the first to fourth openings 15, 22, 24 and 26 have a rectangular shape, in the real etching process using the first and second etching masks 140 and 150, portions of the second insulating interlayer 130 may be etched to form the trench 135 and the first and second via holes 136 and 138, each of which may have a rounded corner or a curved shape, and thus the first and second vias 182 and 184 and the wiring 186 may be also formed to have a rounded corner or a curved shape.

Figure 16:
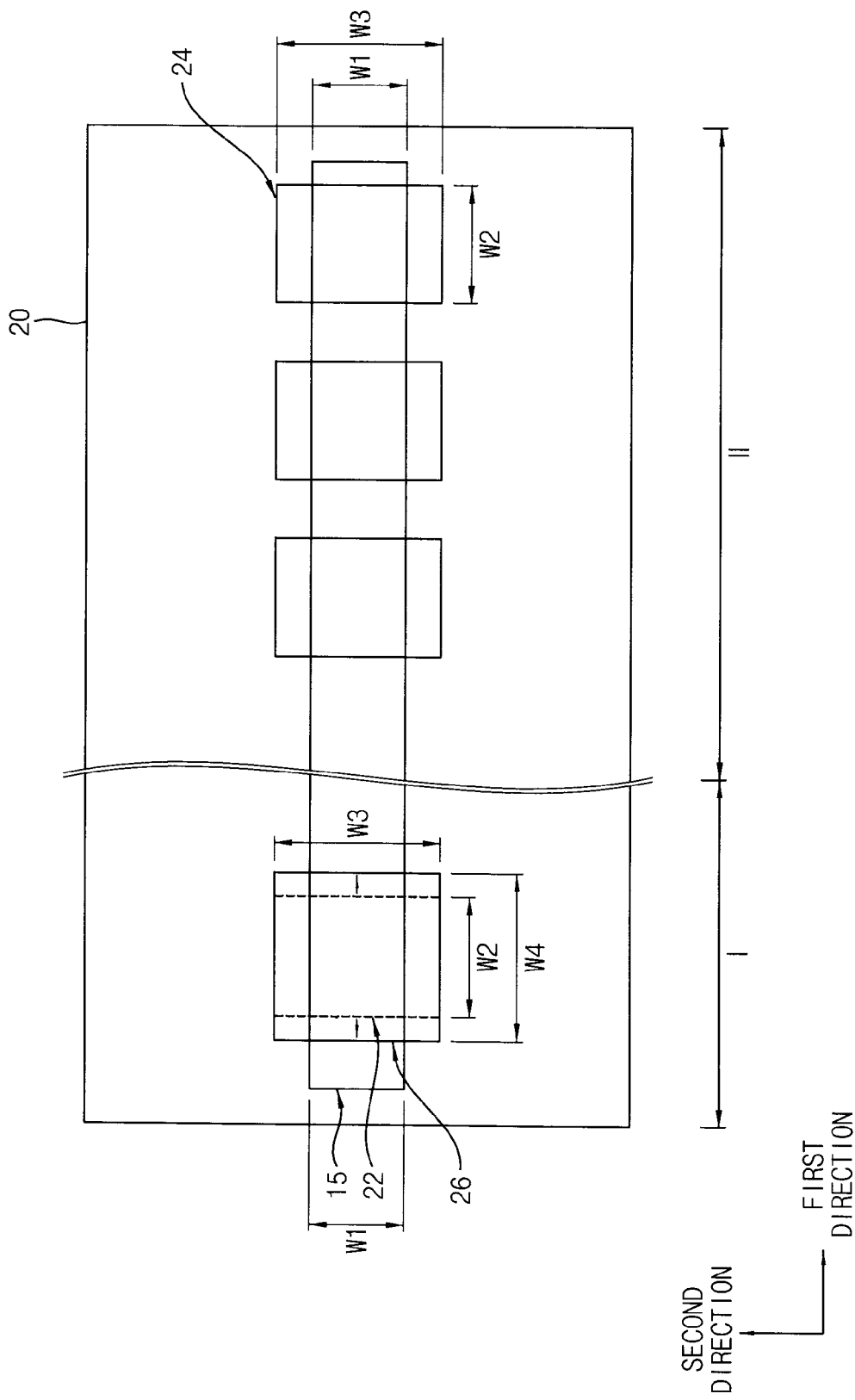
FIGS. 16 to 18 are plan views illustrating stages of a method of forming a wiring structure in accordance with example embodiments.
Figure 17:
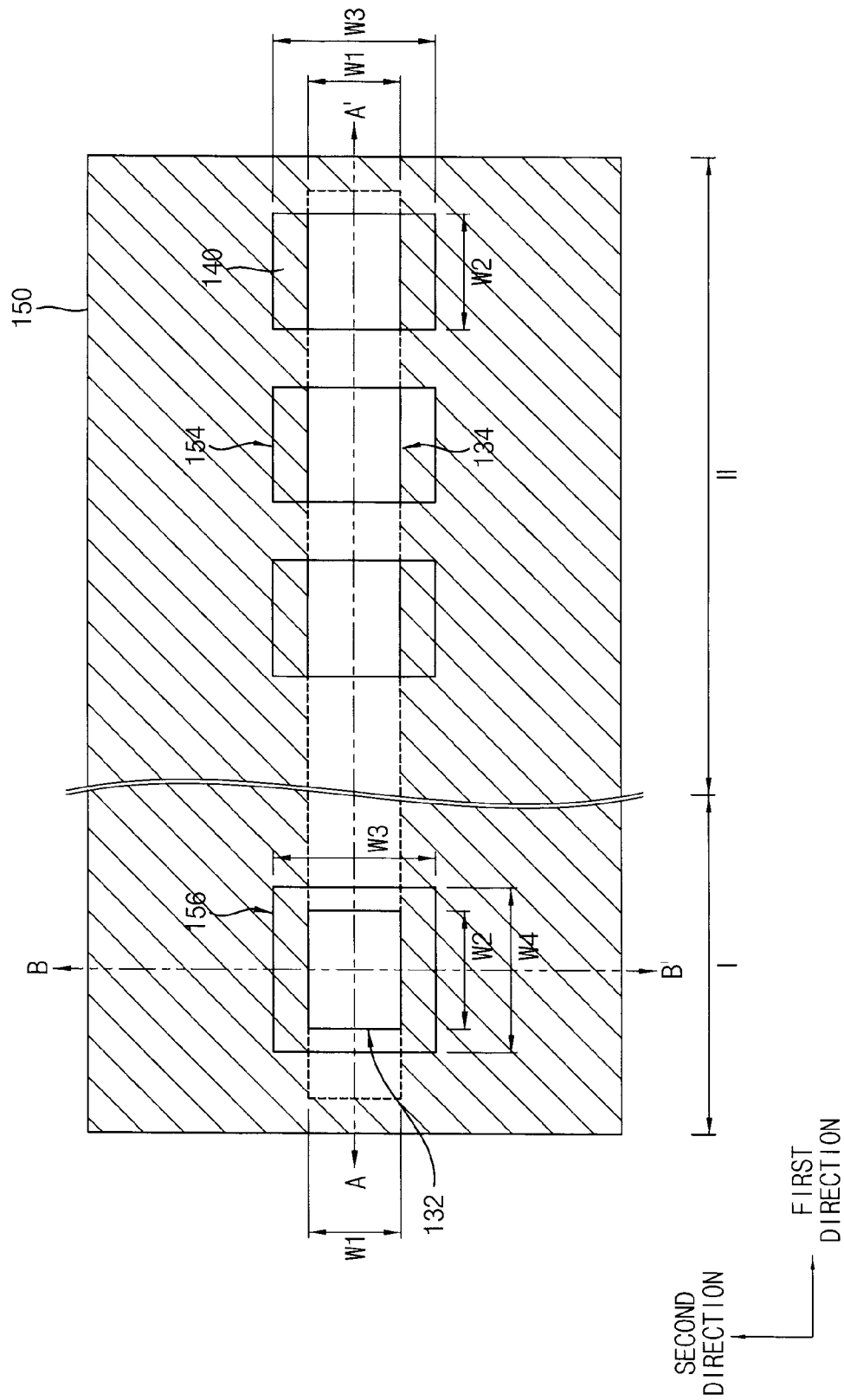
Figure 18:
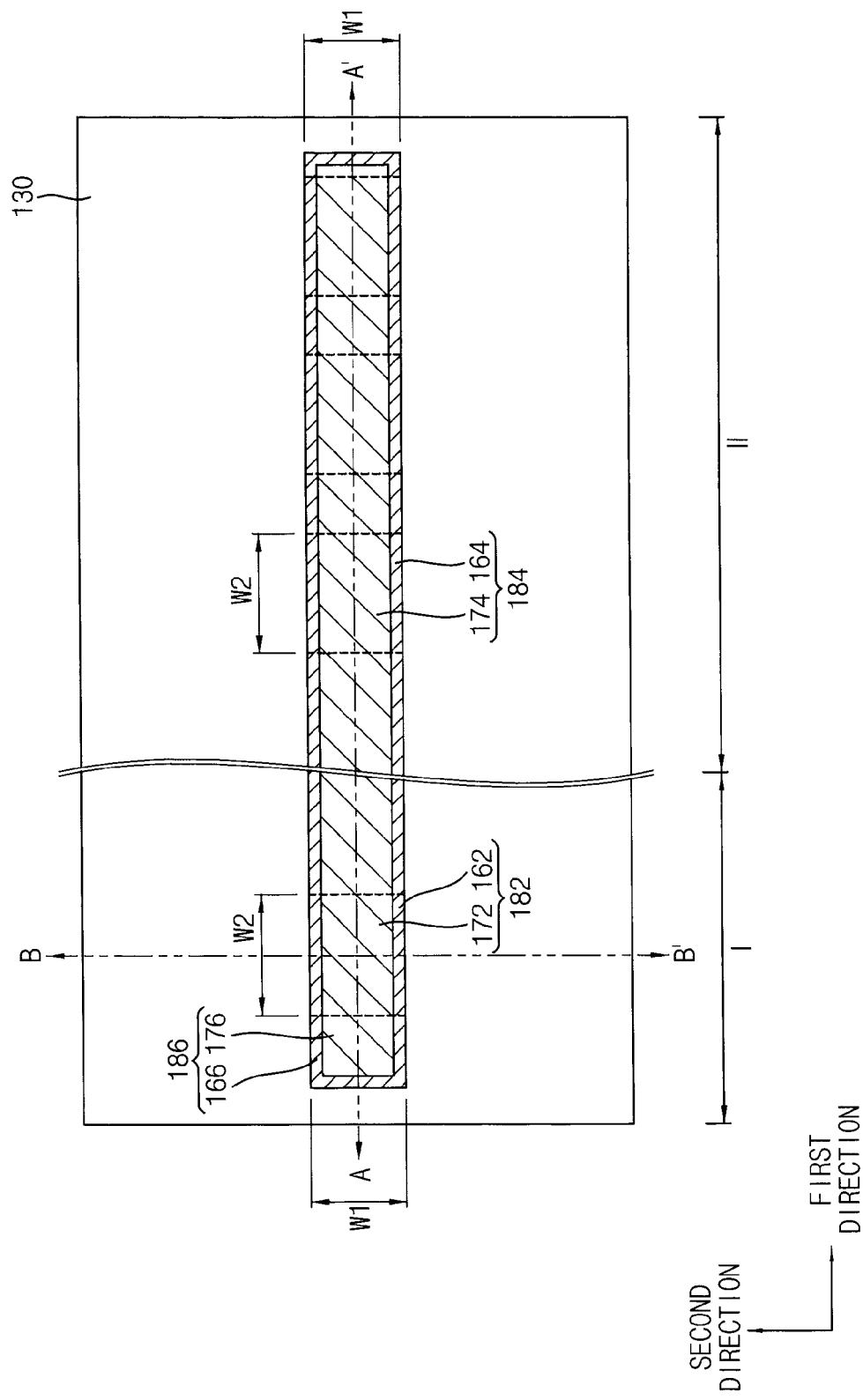

FIGS. 16 to 18 are plan views illustrating stages of a method of forming a wiring structure in accordance with example embodiments. This example method of forming the wiring structure may include processes that are substantially the same as or similar to the processes illustrated with reference to FIGS. 2 to 15, and detailed descriptions thereon are omitted herein.

Referring to FIG. 16, processes that are substantially the same as or similar to the processes illustrated with reference to FIGS. 2 and 3 may be performed. Thus, a first opening 15 may be formed in a first mask (not shown), second and third openings 22 and 24 may be formed in first and second regions I and II, respectively, of a second mask 20, and the second opening 22 may be enlarged to form a fourth opening 26.

Unlike that of FIG. 3, the fourth opening 26 may be formed by enlarging the second opening 22 only in the first direction. Thus, the third opening 24 may have second and third widths W2 and W3 in the first and second directions, respectively, and the fourth opening 26 may have fourth and third widths W4 and W3 in the first and second directions, respectively.

Referring to FIG. 17, processes that are substantially the same as or similar to the processes illustrated with reference to FIGS. 4 to 9 may be performed.

Thus, a first insulating interlayer 110, an etch stop layer 120 and a second insulating interlayer 130 may be formed, for example sequentially formed, on a substrate 100, first and second etching masks 140 and 150 may be formed on the second insulating interlayer 130 using the first mask and the second mask 20, and an upper portion of the second insulating interlayer 130 may be etched using the first and second etching masks 140 and 150 to form first and second recesses 132 and 134.

Each of the first and second recesses 132 and 134 may have second and first widths W2 and W1 in the first and second directions, respectively.

Referring to FIG. 18, processes that are substantially the same as or similar to the processes illustrated with reference to FIGS. 10 to 15 may be performed.

Thus, after removing the second etching mask 150, the second insulating interlayer 130 may be etched using the first etching mask 140 to form a trench 135 (refer to FIGS. 10 to 12) at an upper portion of the second insulating interlayer 130 and first and second via holes 136 and 138 (refer to FIGS. 10 to 12) at lower portions of the second insulating interlayer 130. A wiring 186 and first and second vias 182 and 184 may be formed in the trench 135 and the first and second via holes 136 and 138, respectively.

The first vias 182, which may be formed at a relatively low density, may be formed to have an area that is substantially equal to or greater than an area of the second vias 184, which may be formed at a relatively high density. Thus, a contact area between the first vias 182 and the wiring 186 overlying the first vias 182 may not decrease, and a low contact resistance may be realized.

Figure 19:
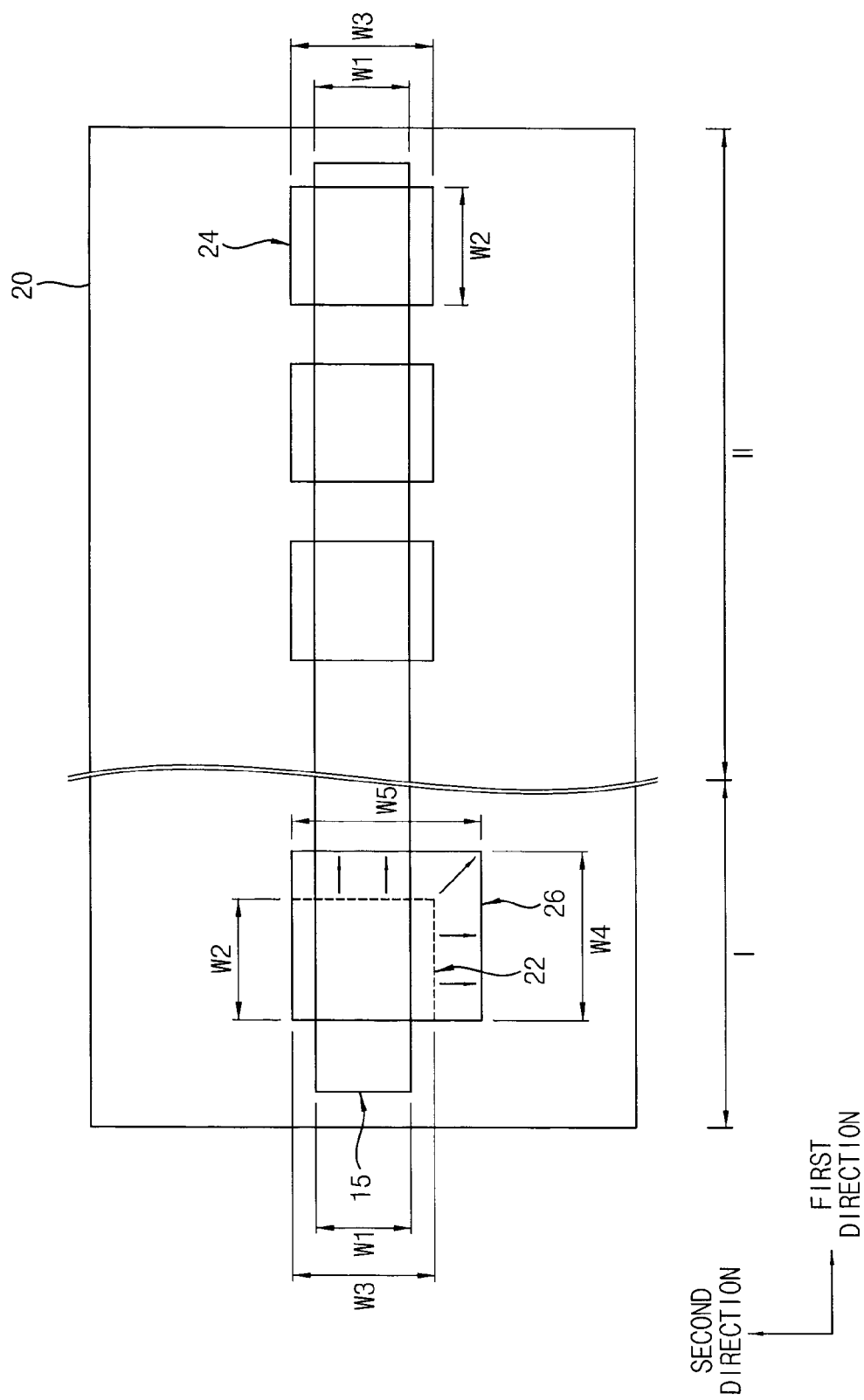
FIGS. 19 to 21 are plan views illustrating stages of a method of forming a wiring structure in accordance with example embodiments.
Figure 20:
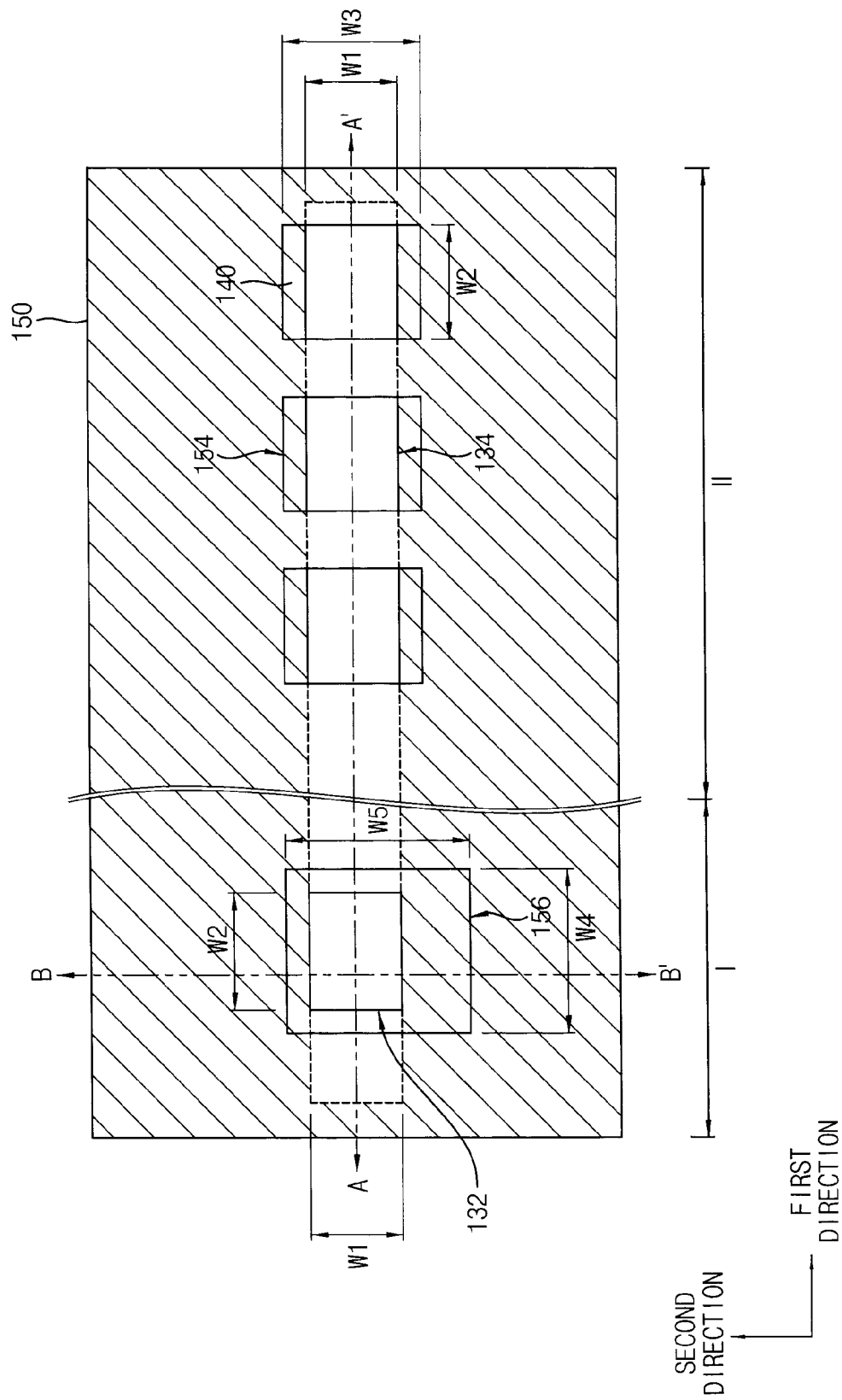
Figure 21:
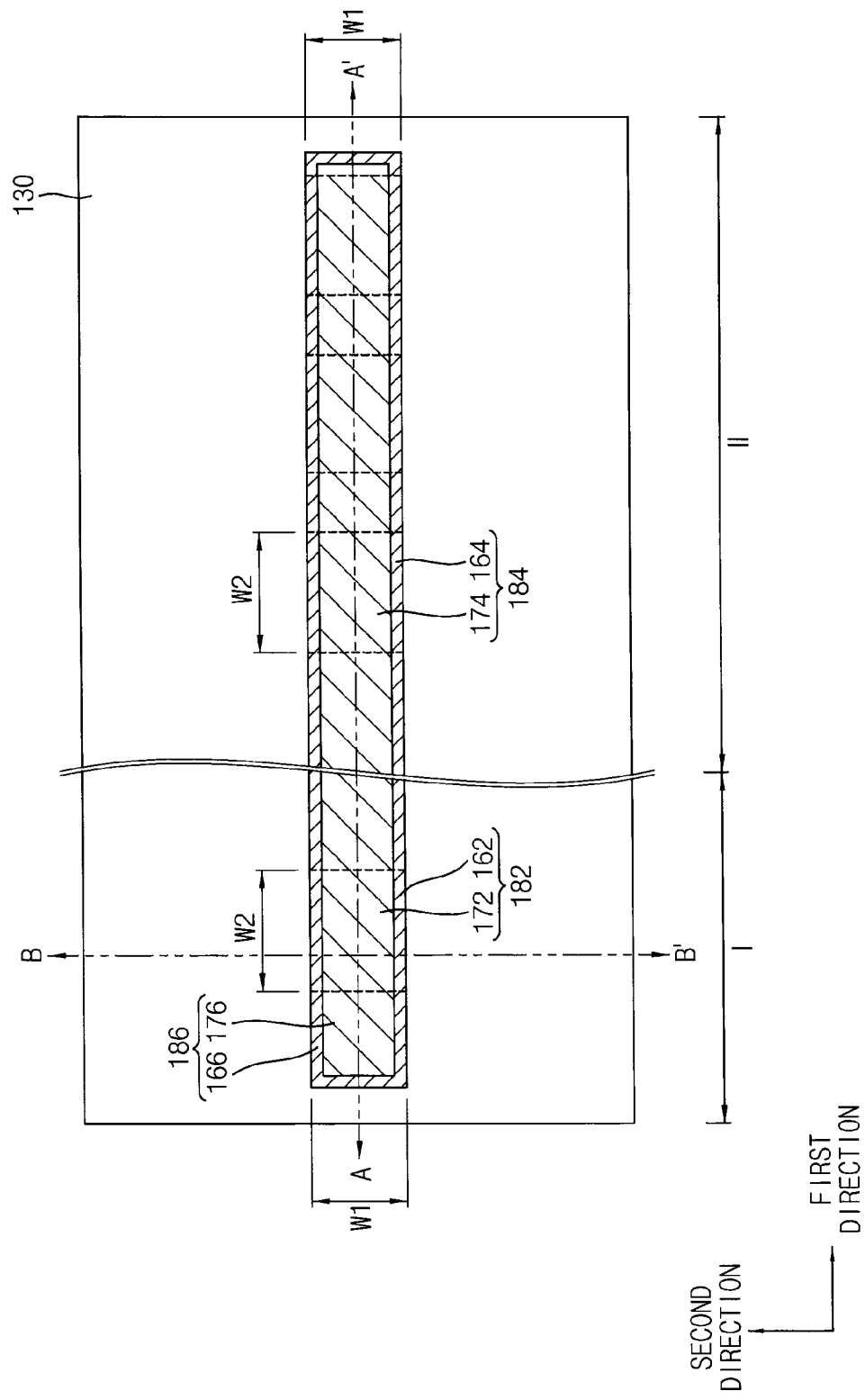

FIGS. 19 to 21 are plan views illustrating stages of a method of forming a wiring structure, in accordance with example embodiments. This method of forming the wiring structure may include processes that are substantially the same as or similar to the processes illustrated with reference to FIGS. 2 to 15, and detailed descriptions thereon are omitted herein.

Referring to FIG. 19, processes that are substantially the same as or similar to the processes illustrated with reference to FIGS. 2 and 3 may be performed. Thus, a first opening 15 may be formed in a first mask (not shown), second and third openings 22 and 24 may be formed in first and second regions I and II, respectively, of a second mask 20, and the second opening 22 may be enlarged to form a fourth opening 26.

The fourth opening 26 may be formed by enlarging the second opening 22 in the first and second directions. However, unlike in FIG. 3, both sides of the second opening 22 opposite to each other may not be enlarged, but only one of sides of the second opening 22 opposite to each other may be enlarged. For example, a right side of the second opening may be enlarged along the first direction, and a lower side of the second opening 22 may be enlarged along the second direction.

In an example embodiment, a length to which one of opposite sides of the second opening 22 is enlarged in each of the first and second directions in FIG. 19 may be about twice a length to which each of opposite sides of the second opening 22 is enlarged in each of the first and second directions in FIG. 3. Thus, the third opening 24 may have second and third widths W2 and W3 in the first and second directions, respectively, and the fourth opening 26 may have fourth and fifth widths W4 and W5 in the first and second directions, respectively.

Referring to FIG. 20, processes that are substantially the same as or similar to the processes illustrated with reference to FIGS. 4 to 9 may be performed.

For example, a first insulating interlayer 110, an etch stop layer 120 and a second insulating interlayer 130 may be formed, for example sequentially formed, on a substrate 100, first and second etching masks 140 and 150 may be formed on the second insulating interlayer 130 using the first mask and the second mask 20, and an upper portion of the second insulating interlayer 130 may be etched using the first and second etching masks 140 and 150 to form first and second recesses 132 and 134.

Each of the first and second recesses 132 and 134 may have second and first widths W2 and W1 in the first and second directions, respectively. However, the position of the first recess 132 may be moved from the position of the original opening 22 to a given distance in the first direction.

Referring to FIG. 21, processes that are substantially the same as or similar to the processes illustrated with reference to FIGS. 10 to 15 may be performed.

For example, after removing the second etching mask 150, the second insulating interlayer 130 may be etched using the first etching mask 140 to form a trench 135 (refer to FIGS. 10 to 12) at an upper portion of the second insulating interlayer 130 and first and second via holes 136 and 138 (refer to FIGS. 10 to 12) at lower portions of the second insulating interlayer 130. A wiring 186 and first and second vias 182 and 184 may be formed in the trench 135 and the first and second via holes 136 and 138, respectively.

The first vias 182, which may be formed at a relatively low density, may be formed to have an area that is substantially equal to or greater than an area of the second vias 184, which may be formed at a relatively high density. Thus, a contact area between the first vias 182 and the wiring 186 overlying the first vias 182 may not decrease, and a low contact resistance may be realized.

FIGS. 22 to 39 are plan views and cross-sectional views illustrating stages of a method of forming a wiring structure, in accordance with example embodiments. Particularly, FIGS. 22, 23, 24, 28, 32 and 36 are plan views thereof, and FIGS. 25-27, 29-31, 33-35 and 37-39 are cross-sectional views thereof. FIGS. 25, 29, 33 and 37 are cross-sectional views taken along lines C-C' of corresponding plan views, respectively, FIGS. 26, 30, 34 and 38 are cross-sectional views taken along lines D-D' of corresponding plan views, respectively, and FIGS. 27, 31, 35 and 39 are cross-sectional views taken along lines E-E' of corresponding plan views, respectively.

This method of forming the wiring structure may include processes that are substantially the same as or similar to the processes illustrated with reference to FIGS. 2 to 15, and detailed descriptions thereon are omitted herein.

Figure 22:
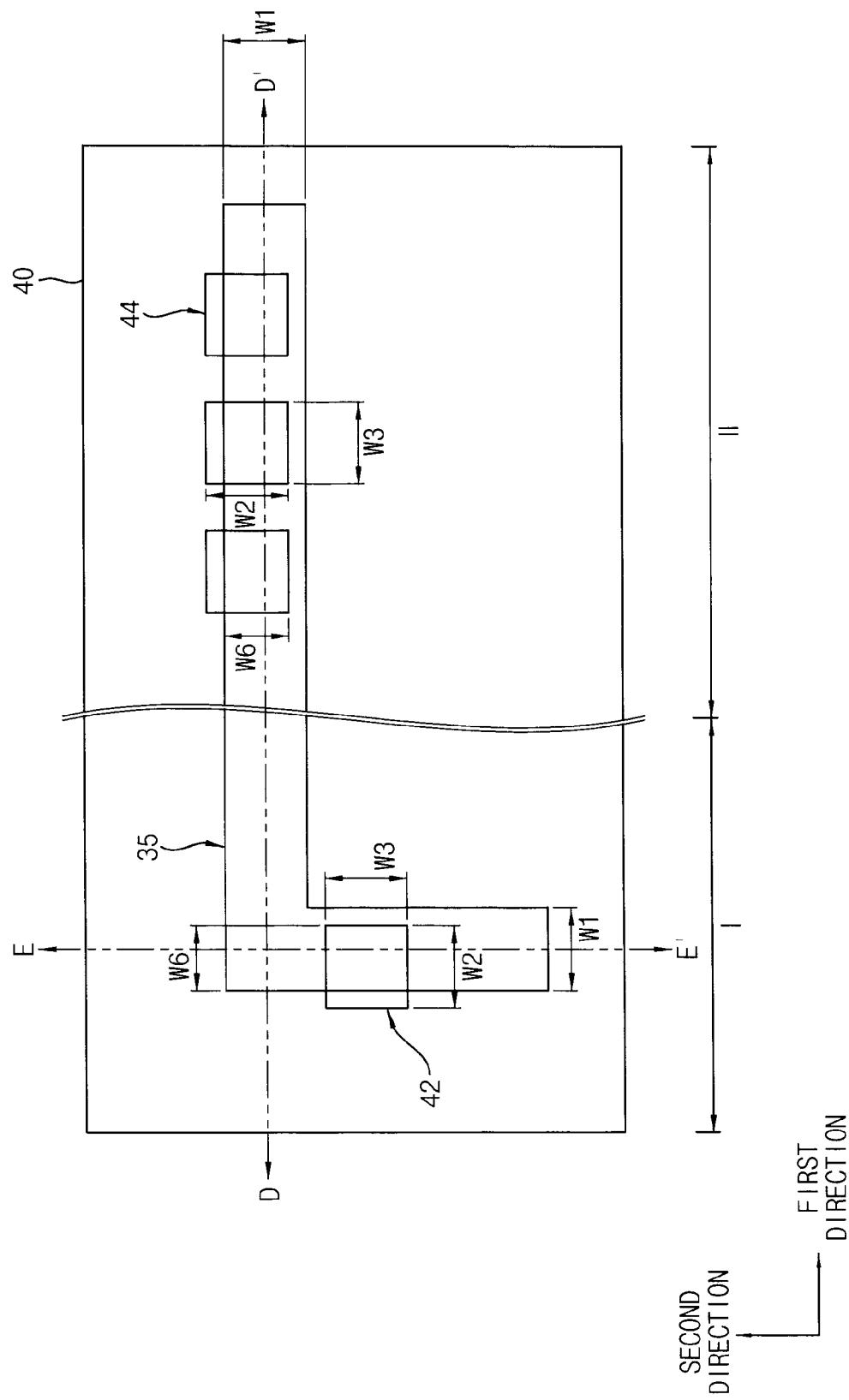
FIGS. 22 to 39 are plan views and cross-sectional views illustrating stages of a method of forming a wiring structure in accordance with example embodiments.

Referring to FIG. 22, processes that are substantially the same as or similar to the processes illustrated with reference to FIG. 2 may be performed.

Thus, a first opening 35 may be formed in a first mask (not shown), and second and third openings 42 and 44 may be formed in first and second regions I and II, respectively, of a second mask 40.

The first opening 35 may include a first portion extending in a second direction, and a second portion extending in a first direction that is substantially perpendicular to the second direction and in communication with the first portion. In an example embodiment, the first portion of the first opening 35 may have a first width W1 in the first direction, and the second portion of the first opening 35 may have the first width W1 in the second direction. Alternatively, the second portion of the first opening 35 may have a width different from the first width W1. Hereinafter, for the convenience of explanation, only the first opening 35 including the second portion having the first width W1 in the second direction will be illustrated.

Each of the second and third openings 42 and 44 may at least partially vertically overlap with the first opening 35. Particularly, the second opening 42 may at least partially vertically overlap with the first portion of the first opening 35, and the third opening 44 may at least partially vertically overlap with the second portion of the first opening 35.

A density of the second opening 42 in the first region I may be less than a density of the third opening 44 in the second region II. Other second openings (not shown) not vertically overlapping with the first opening 35 may be further formed in the first region I, and other third openings (not shown) not vertically overlapping with the first opening 35 may be further formed in the second region II, however, a total density of the second opening 42 including the other second openings in the first region I may be less than a total density of the third opening 44 including the other third openings in the second region II.

In example embodiments, the second opening 42 may have second and third widths W2 and W3 in the first and second directions, respectively, and the third opening 44 may have the second and third widths W2 and W3 in the second and first directions, respectively. A portion of the second opening 42 overlapping with the first opening 35 may have a sixth width W6 in the first direction, and a portion of the third opening 44 overlapping with the first opening 35 may have the sixth width W6 in the second direction.

In example embodiments, the second opening 42 may be adjacent or partially overlap with a boundary between the first and second portions of the first opening 35.

Figure 23:
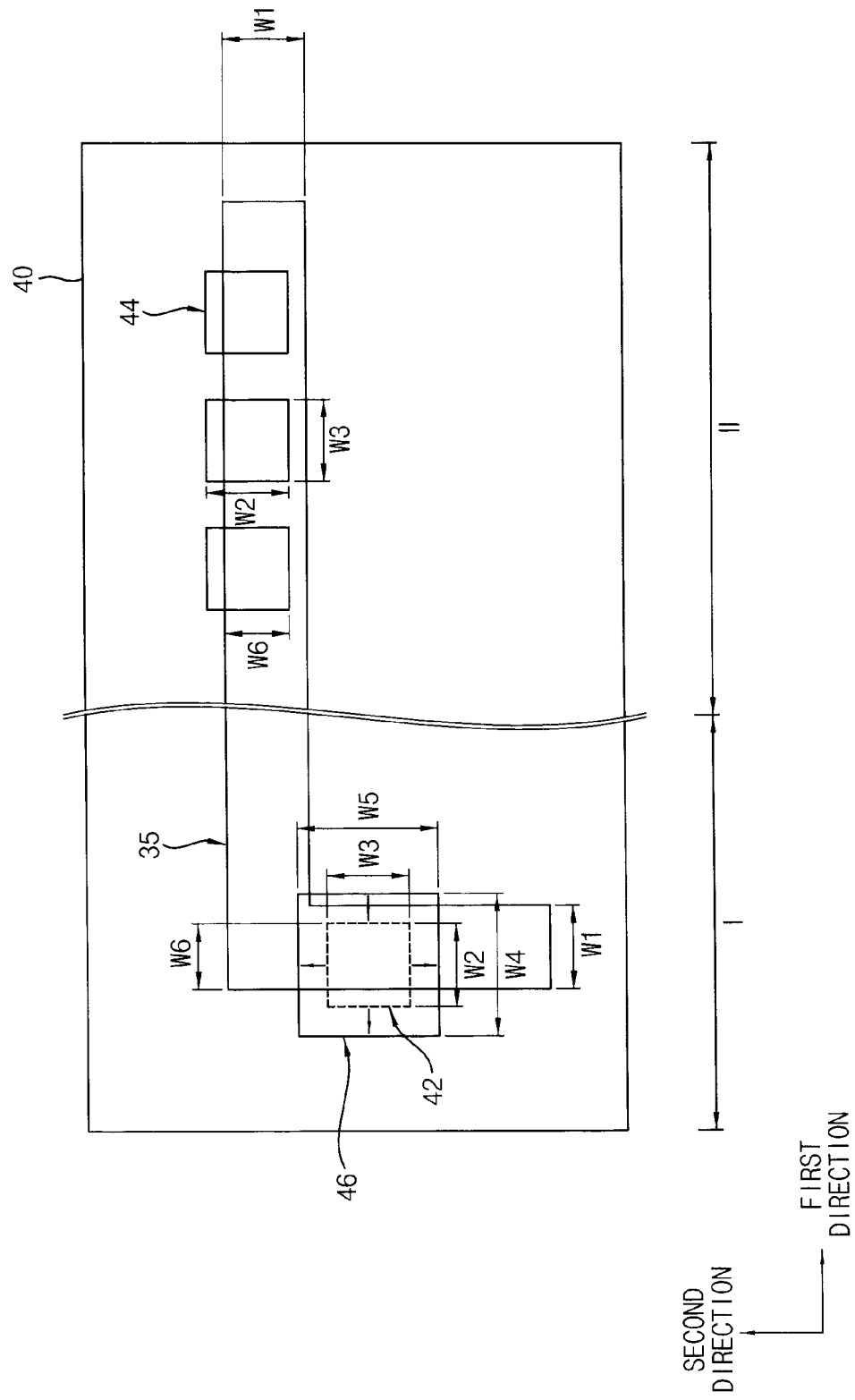
Figure 24:
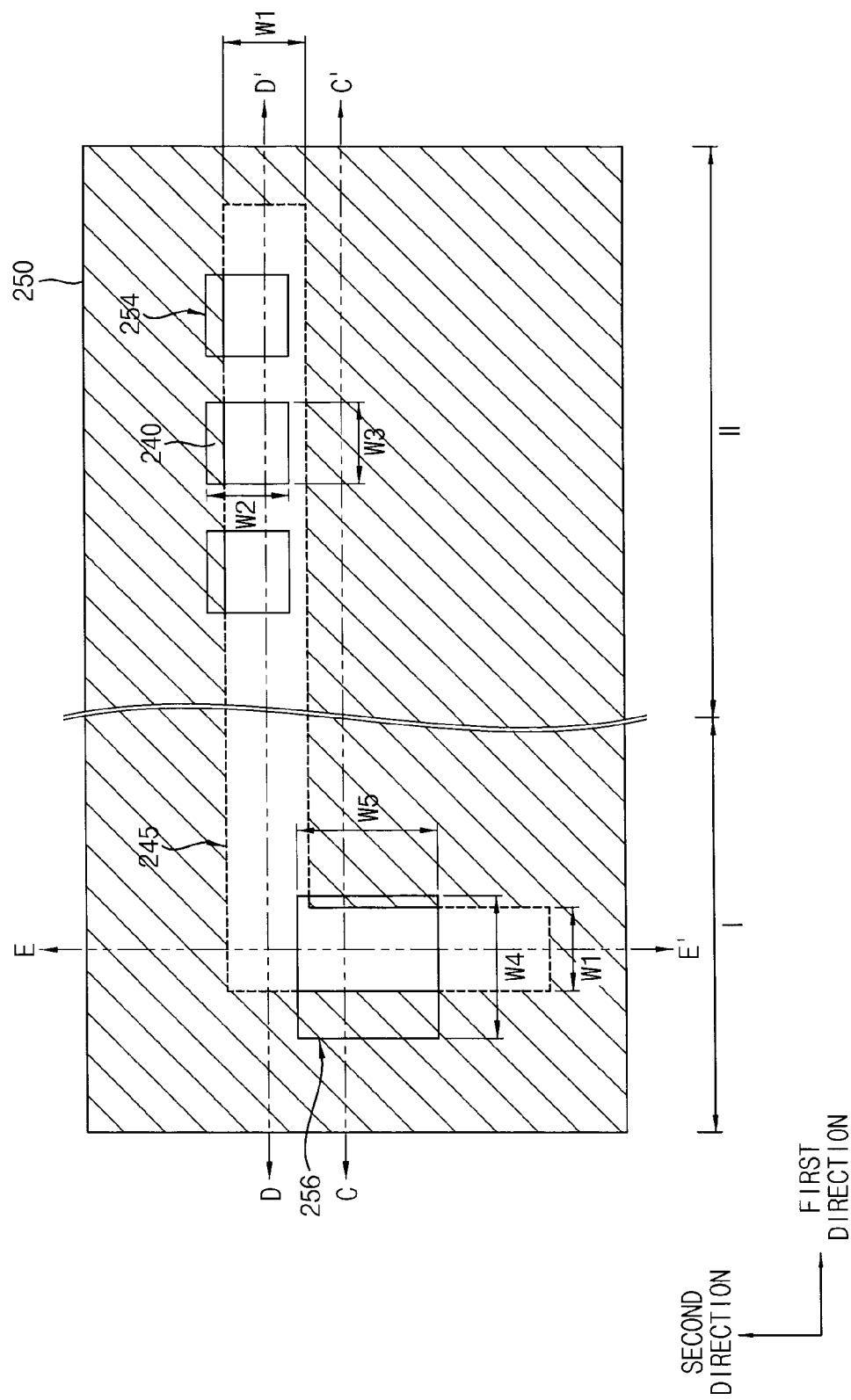
Figure 25:
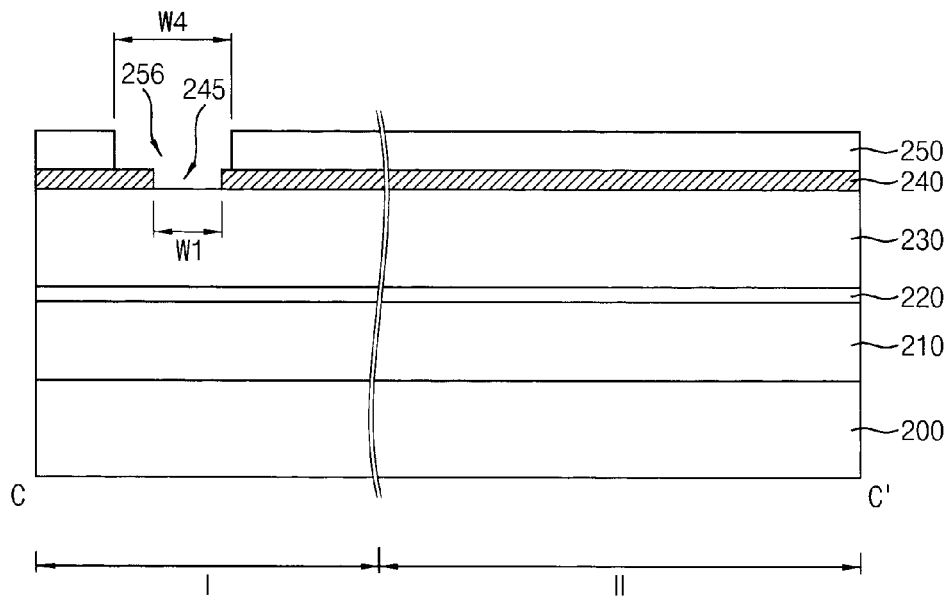
Figure 26:
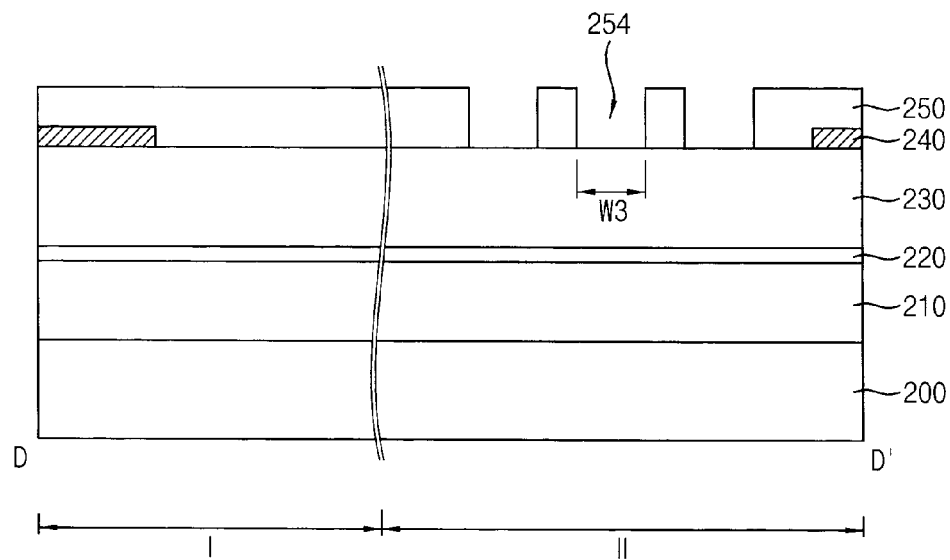
Figure 27:
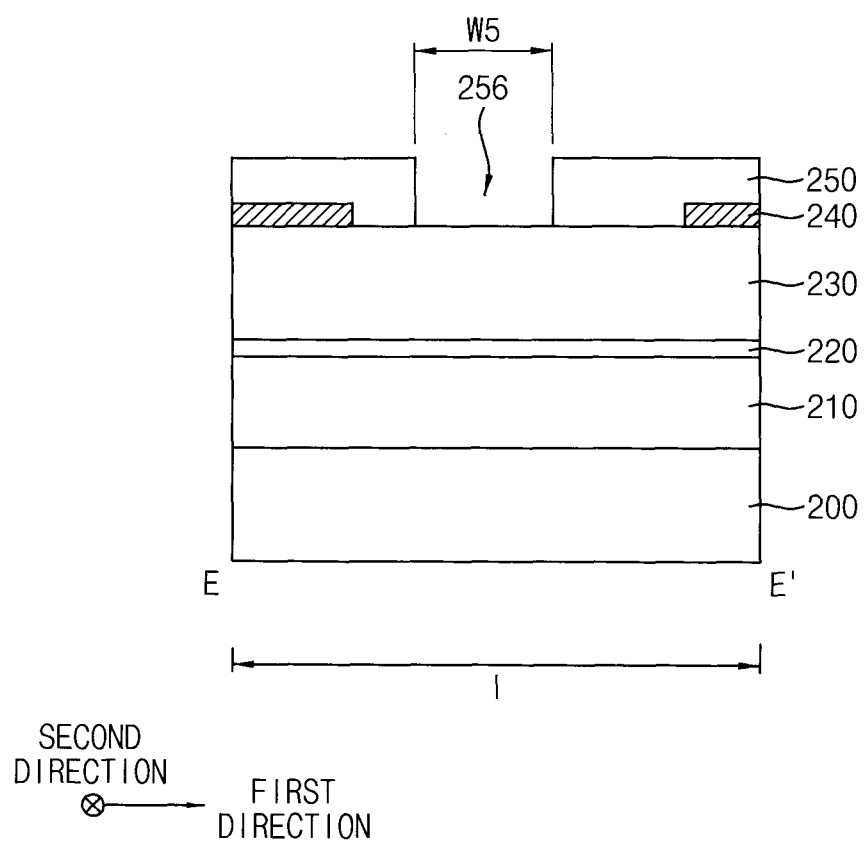
Figure 28:
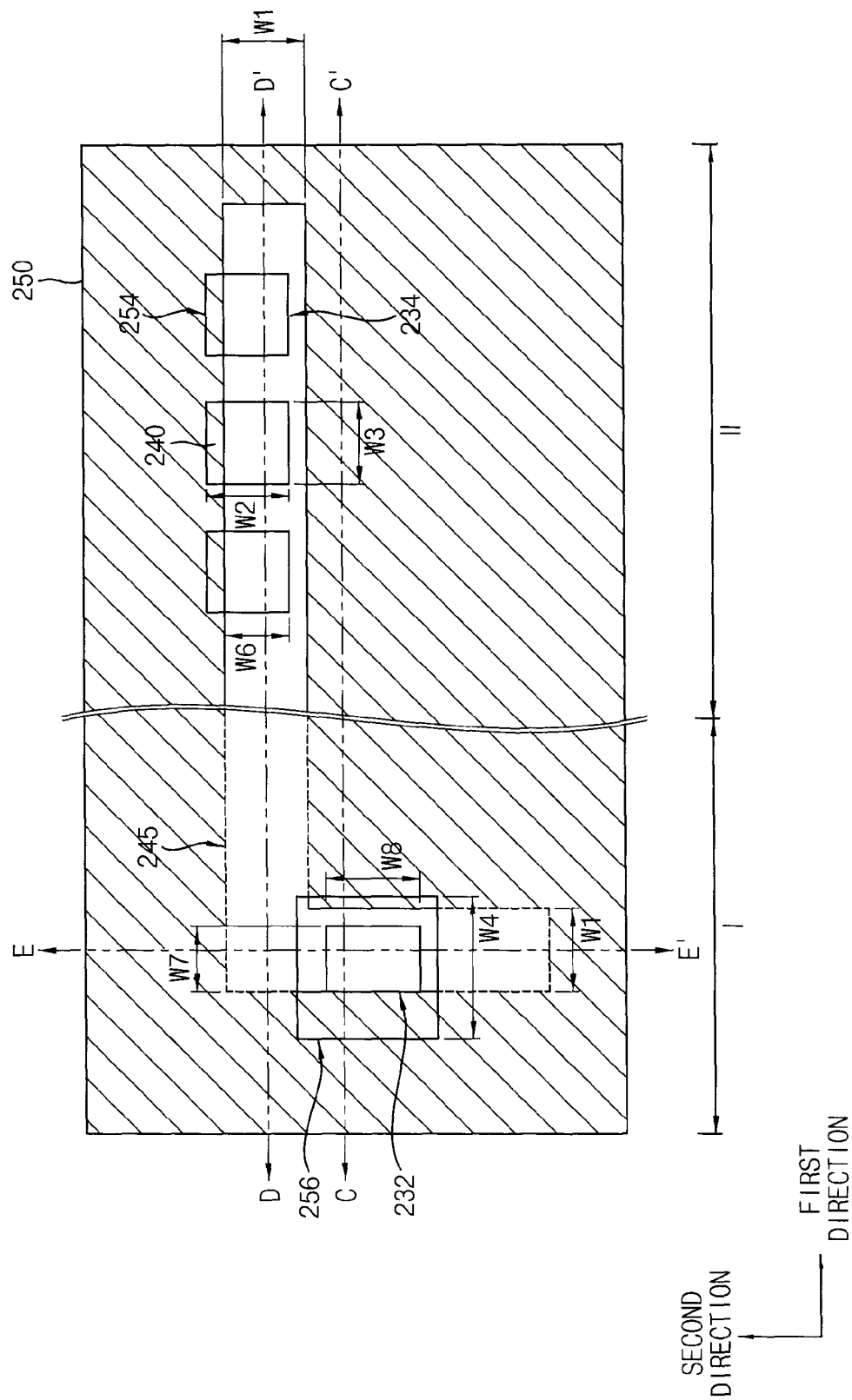
Figure 29:
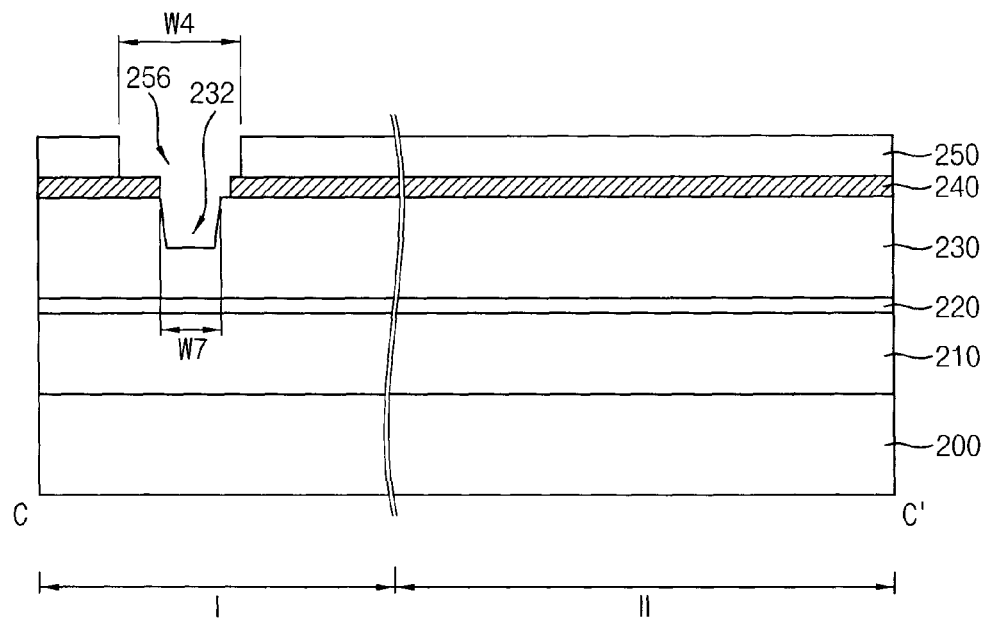
Figure 30:
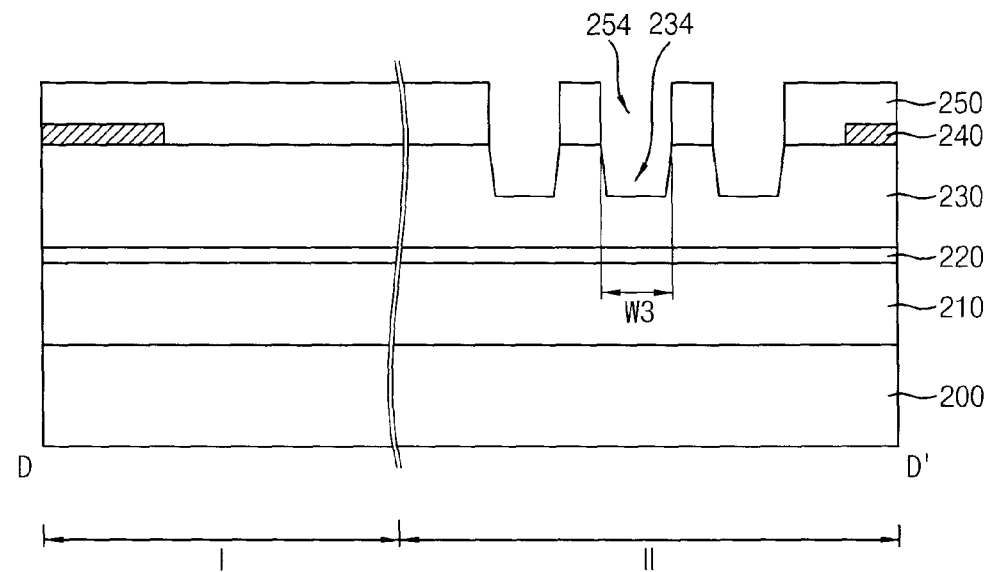
Figure 31:
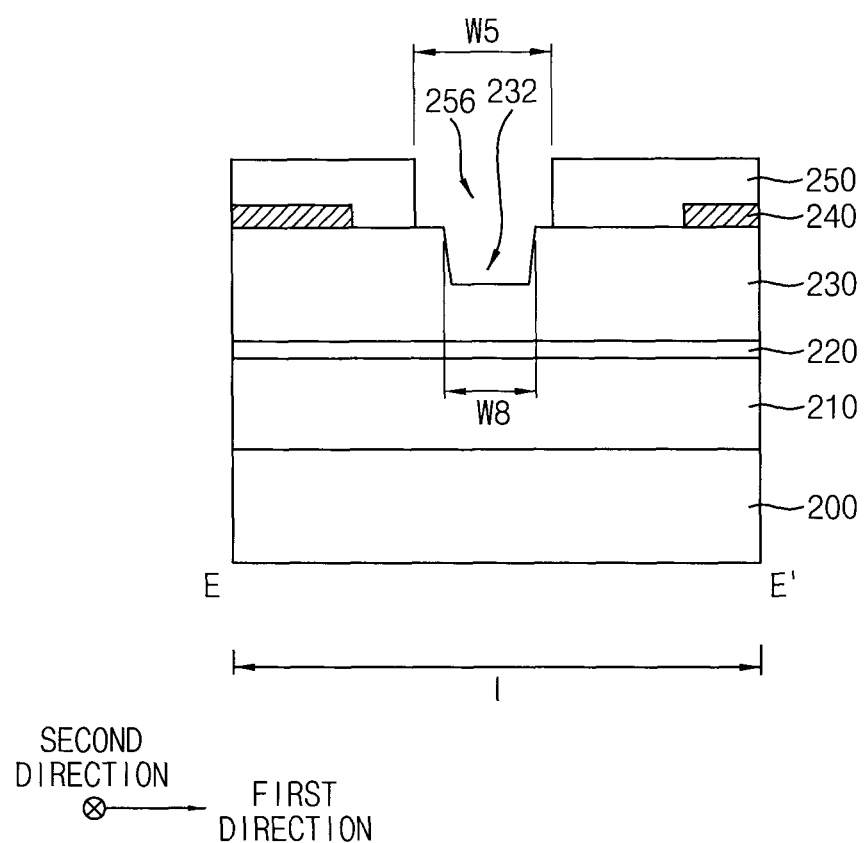
Figure 32:
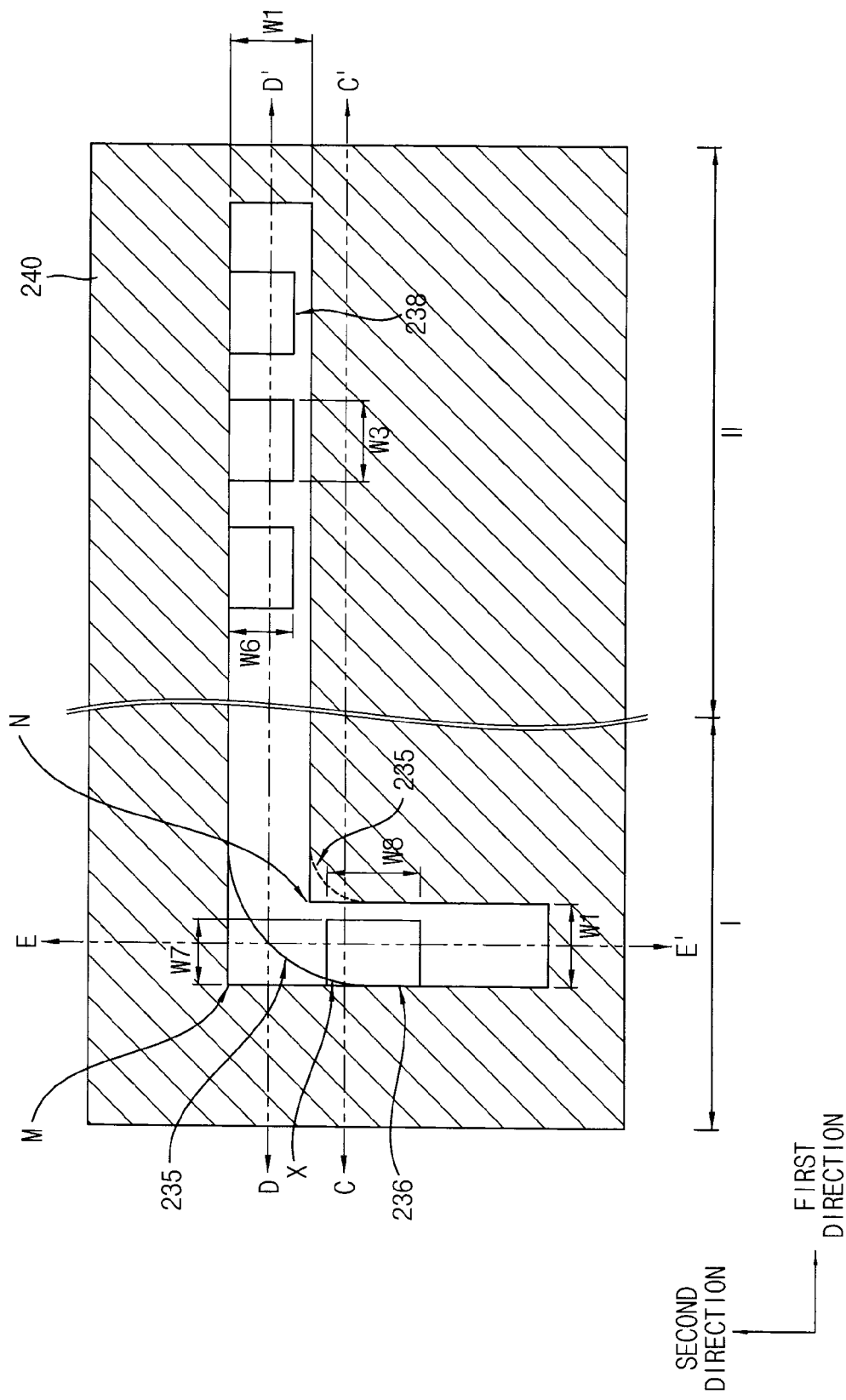
Figure 33:
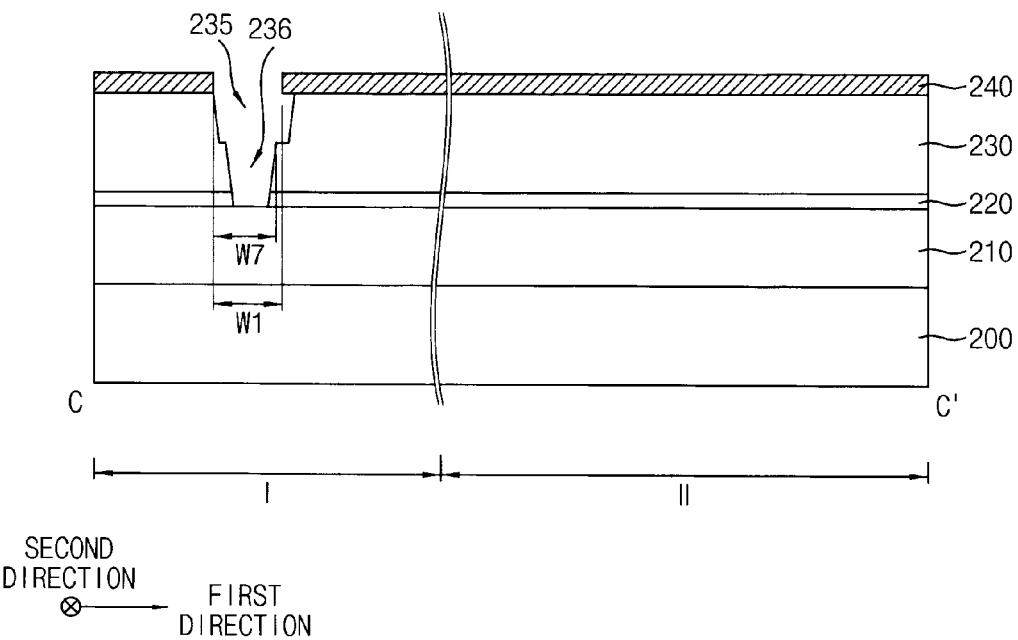
Figure 34:
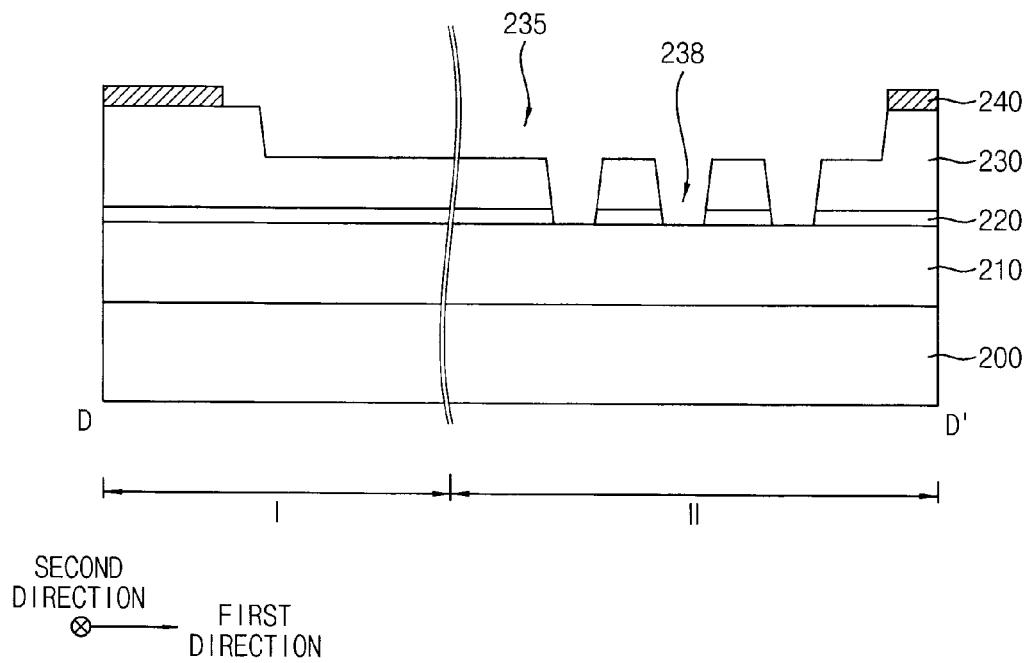
Figure 35:
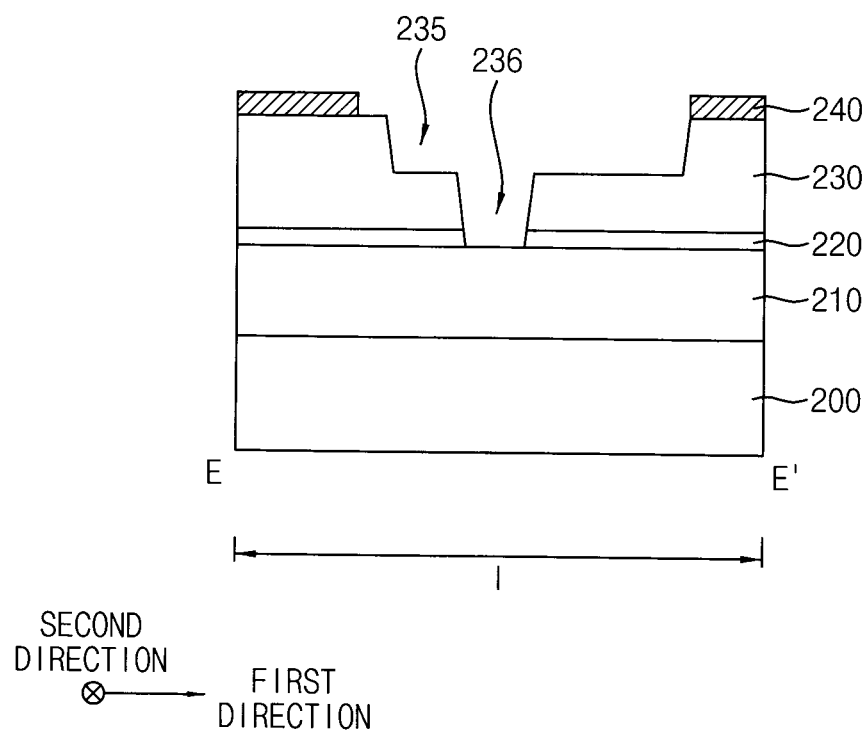
Figure 36:
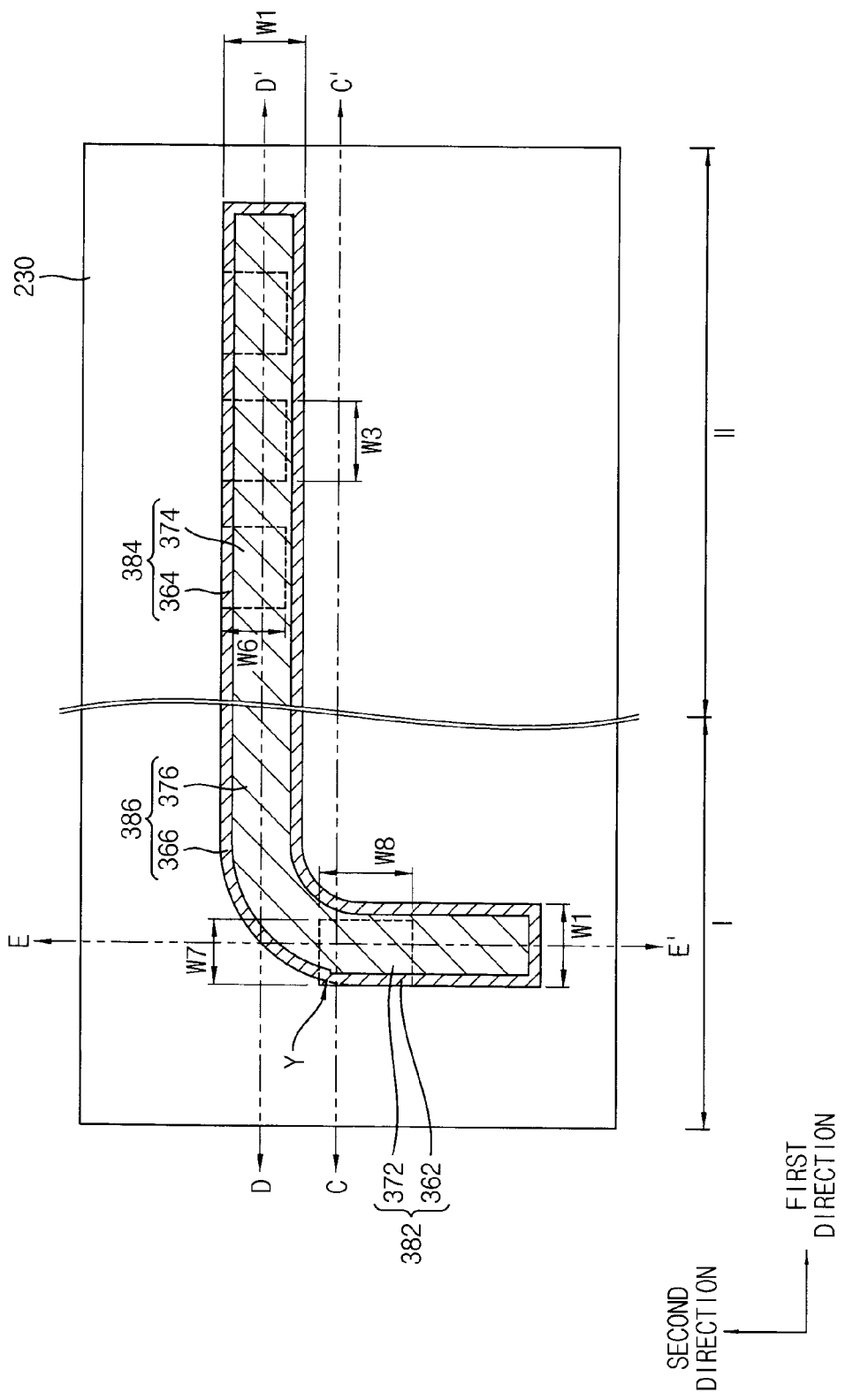
Figure 37:
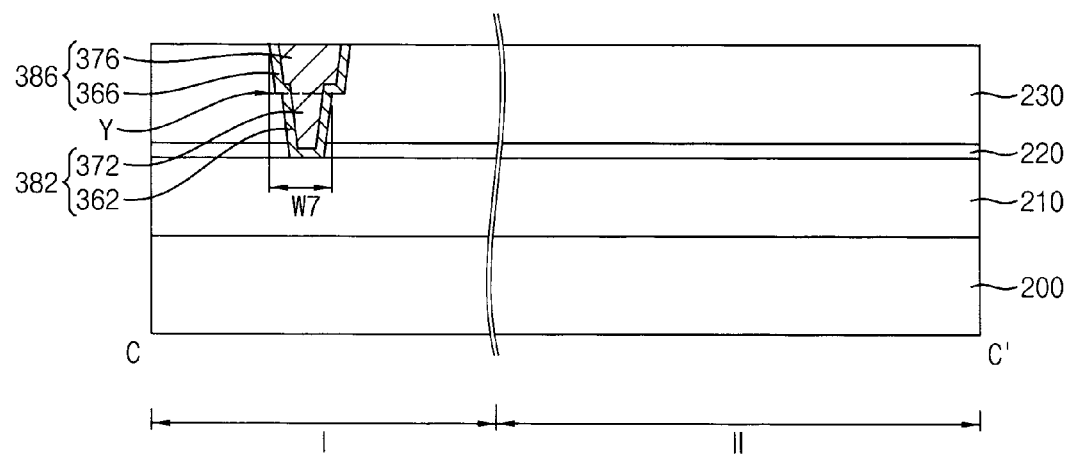
Figure 38:
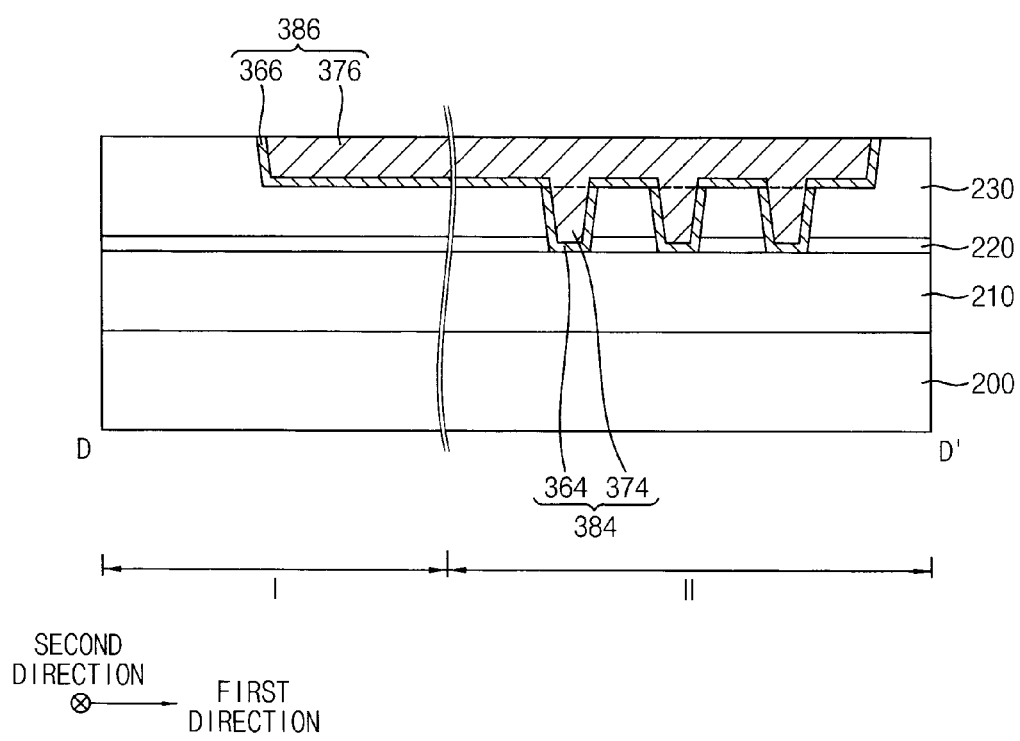
Figure 39:
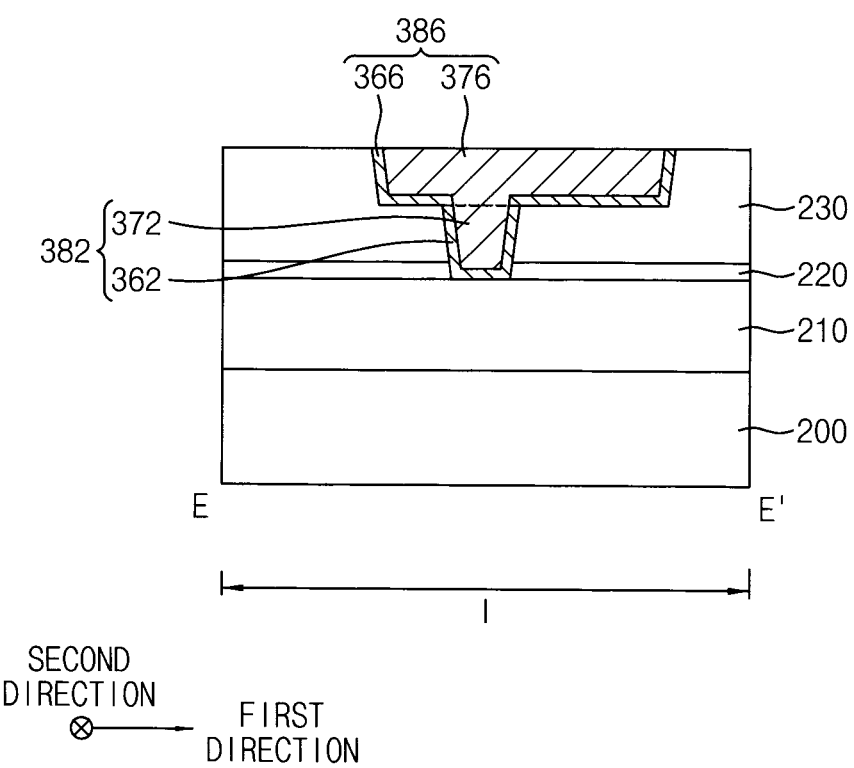

Referring to FIG. 23, processes that are substantially the same as or similar to the processes illustrated with reference to FIG. 3 may be performed.

Thus, the second opening 42 may be enlarged to form a fourth opening 46.

In example embodiments, the fourth opening 46 may be formed by enlarging the second opening 42 both in the first and second directions. Alternatively, the fourth opening 46 may be formed by enlarging the second opening 42 only in one direction of the first and second directions.

The fourth opening 46 may have fourth and fifth widths W4 and W5 in the first and second directions, respectively.

Referring to FIGS. 24 to 27, processes that are substantially the same as or similar to the processes illustrated with reference to FIGS. 4 to 6 may be performed.

Thus, a first insulating interlayer 210, an etch stop layer 220 and a second insulating interlayer 230 may be formed, for example sequentially formed, on a substrate 200, and first and second etching masks 240 and 250 may be formed on the second insulating interlayer 230 using the first mask and the second mask 40.

A first opening 245 in the first etching mask 240 may include a first portion extending in a second direction substantially parallel to a top surface of the substrate 200, and a second portion extending in a first direction substantially parallel to the top surface of the substrate 200 and substantially perpendicular to the second direction and in communication with the first portion. In an example embodiment, the first portion of the first opening 245 may have the first width W1 in the first direction, and the second portion of the first opening 245 may have the first width W1 in the second direction.

A third opening 254 in the second etching mask 250 may at least partially vertically overlap with the first opening 245, and may have the second and third widths W2 and W3 in the second and first directions, respectively. The fourth opening 256 may be adjacent or partially overlap with a boundary between the first and second portions of the first opening 245, and may have the fourth and fifth widths W4 and W5 in the first and second directions, respectively.

In example embodiments, the fourth width W4 of the fourth opening 256 in the first direction may be greater than the first width W1 of the first opening 245 in the first direction, and a top surface of the first etching mask 240 may be partially exposed.

Referring to FIGS. 28 to 31, processes that are substantially the same as or similar to the processes illustrated with reference to FIGS. 7 to 9 may be performed.

Thus, an upper portion of the second insulating interlayer 230 may be etched using the first and second etching masks 240 and 250 to form first and second recesses 232 and 234.

The first recess 232 in the first region I may have seventh and eighth widths W7 and W8 in the first and second directions, respectively. The second recess 234 in the second region II may have sixth and third widths W6 and W3 in the second and first directions, respectively.

In example embodiments, the seventh and eighth widths W7 and W8 may be less than the fourth and fifth widths W4 and W5, respectively, and may be more than the sixth and third widths W6 and W3, respectively.

Referring to FIGS. 32 to 35, processes that are substantially the same as or similar to the processes illustrated with reference to FIGS. 10 to 12 may be performed.

Thus, after removing the second etching mask 250, the second insulating interlayer 230 may be etched using the first etching mask 240 to form a trench 235 at an upper portion of the second insulating interlayer 230 and first and second via holes 236 and 238 at lower portions of the second insulating interlayer 230.

Each of the first and second via holes 236 and 238 may expose a top surface of the etch stop layer 220, and the exposed etch stop layer 220 may be further etched to expose a contact plug (not shown) contained in the first insulating interlayer 210.

The trench 235 may include a first portion extending in the second direction, and a second portion extending in the first direction and in communication with the first portion. The first portion of the trench 235 may have the first width W1 in the first direction, and the second portion of the trench 235 may have the first width W1 in the second direction.

At a boundary between the first and second portions of the first opening 245 in the first etching mask 240, an amount of etching gas provided onto the second insulating interlayer 230 through the first opening 245 may not be uniform, and thus the second insulating interlayer 230 may not be etched according to the exact shape, or substantially exact shape, of the first opening 245.

Particularly, in the boundary between the first and second portions of the first opening 245, the etching gas may not be well provided onto a first point M, while the etching gas may be excessively provided onto a second point N. Thus, in a plan view, the trench 235 may have a shape of which a corner is rounded.

However, the first recess 232 already formed in the process illustrated with reference to FIGS. 28 to 31 may have a rectangular shape in a plan view, and thus a portion of the trench 235 corresponding thereto may have a shape of a portion of the rectangular shape. Accordingly, a portion of the rounded corner of the shape of the trench 235 may protrude to form a protrusion X.

The first via hole 236 may have seventh and eighth widths W7 and W8 in the first and second directions, respectively, and the second via hole 238 may have the sixth and third widths W6 and W3 in the second and first directions, respectively.

In example embodiments, according to the rounded corner shape of the trench 235, a portion of a corner of the first via hole 236 may also have a rounded shape. Particularly, the first via hole 236 may have a rounded corner shape similar to an imaginary extension of the rounded corner shape of the trench 235 under the protrusion X of the trench 235. Thus, the protrusion X of the trench 235 may not be in communication with the underlying first via hole 236.

Even though the first via hole 236 has a rectangular shape of which a portion is rounded, the first via hole 236 may have the seventh and eighth widths W7 and W8 greater than the sixth and third widths W6 and W3, respectively, and thus an area of the first via hole 236 may be substantially equal to or greater than an area of the second via hole 238.

Referring to FIGS. 36 to 39, processes that are substantially the same as or similar to the processes illustrated with reference to FIGS. 13 to 15 may be performed.

Thus, a wiring 386 and first and second vias 382 and 384 may be formed in the trench 235 and the first and second via holes 236 and 238, respectively.

The first via 382 may include a first metal pattern 372 and a first barrier pattern 362 covering a bottom and a sidewall of the first metal pattern 372 in the first via hole 236, and the second via 384 may include a second metal pattern 374 and a second barrier pattern 364 covering a bottom and a sidewall of the second metal pattern 374 in the second via hole 238. The wiring 386 may include a third metal pattern 376 and a third barrier pattern 366 covering a portion of a bottom and a sidewall of the third metal pattern 376 in the trench 235.

The first and third metal patterns 372 and 376 may be stacked, for example sequentially stacked, to contact each other, and the first and third barrier patterns 362 and 366 may be stacked, for example sequentially stacked, to contact each other. The second and third metal patterns 374 and 376 may be stacked, for example sequentially stacked, to contact each other, and the second and third barrier patterns 364 and 366 may be stacked, for example sequentially stacked, to contact each other.

The first and second vias 382 and 384 may form a via structure, and may be formed at a lower portion of the second insulating interlayer 230. The wiring 386 may be formed at an upper portion of the second insulating interlayer 230 to contact the via structure, and the wiring 386 and the via structure may form the wiring structure.

The wiring 386 may include a first portion extending in the first direction and a second direction extending in the second direction, and may have a rounded shape at a boundary between the first and second portions, i.e., at a corner thereof. In example embodiments, the wiring 386 may include a protrusion Y protruding from the corner having the rounded shape.

The first via 382 may partially contact the boundary between the first and second portions of the wiring 386. In example embodiments, the first via 382 may at least partially contact the corner of the wiring 386 The first via 382 may be adjacent to the protrusion Y of the wiring 386, however, may not contact a bottom of the protrusion Y of the wiring 386. That is, a corner of the first via 382 may have a rounded shape corresponding to the rounded shape of the corner of the wiring 386 except for the protrusion Y, and thus the bottom of the protrusion Y of the wiring 386 may not contact the first via 382 but may be covered by the second insulating interlayer 230.

Accordingly, a contact area between the first via 382 and the wiring 386 may have a rectangular shape of which a corner is rounded, and thus may be smaller than an area of a simple rectangular shape. However, in example embodiments, the seventh and eighth widths W7 and W8 of the first via 382 may be greater than the sixth and third widths W6 and W3, respectively, of the second via 284, and thus the contact area between the first via 382 and the wiring 386 may be substantially equal to or greater than a contact area between the second via 384 and the wiring 386. Thus, the contact area between the first vias 382 and the overlying the wiring 386 may not be reduced, which may realize a low contact resistance.

Figure 40:
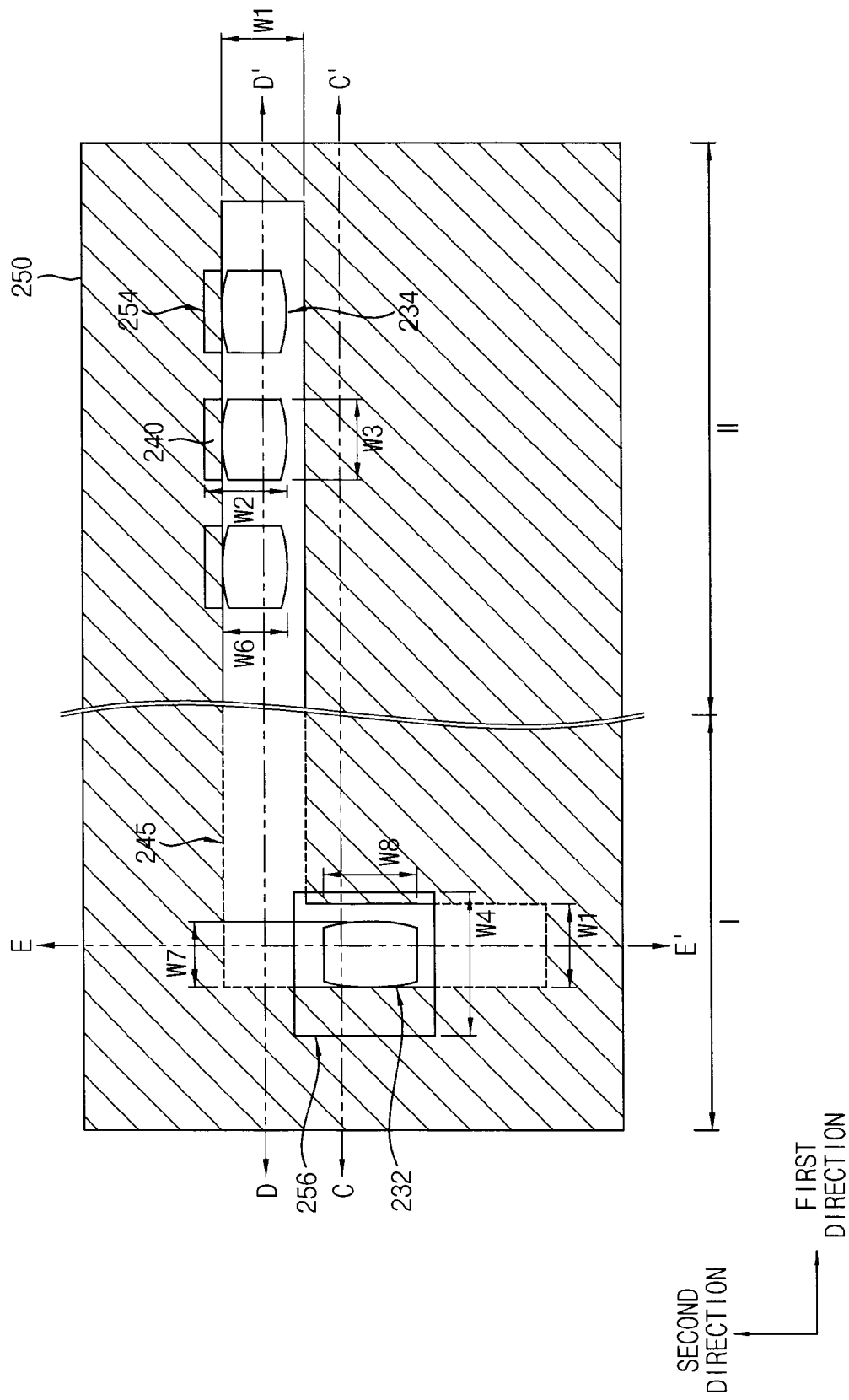
FIGS. 40 to 45 are plan views and cross-sectional views illustrating stages of a method of forming a wiring structure in accordance with example embodiments.
Figure 41:
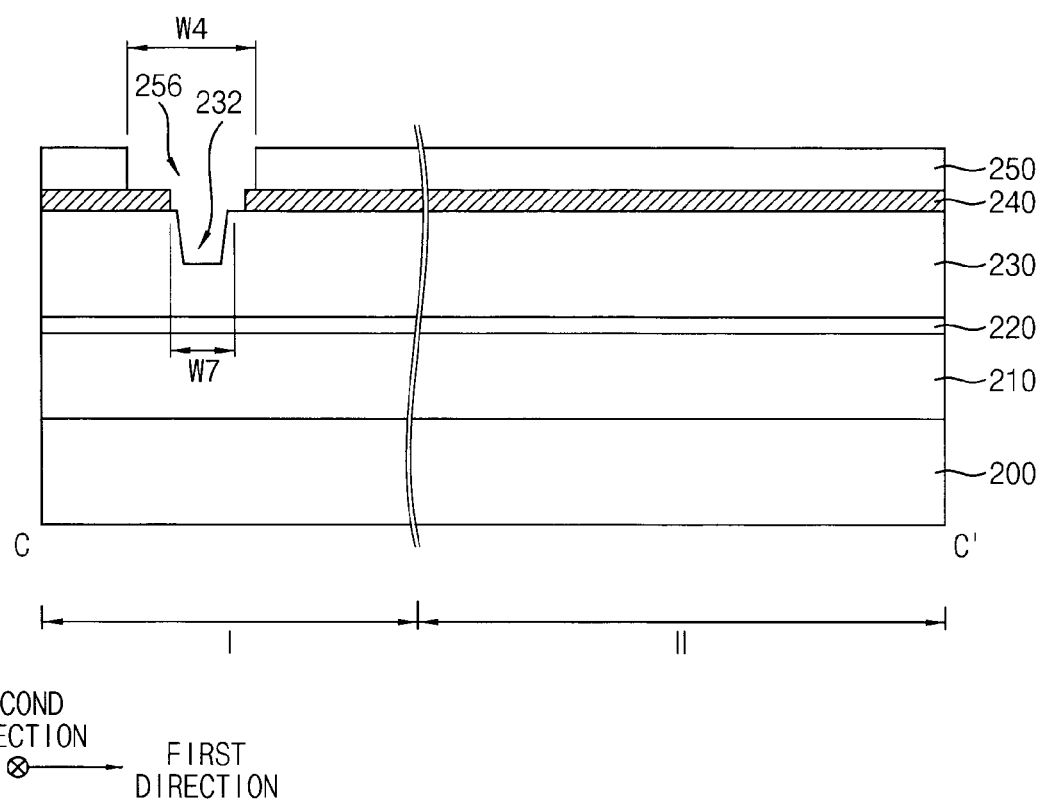
Figure 42:
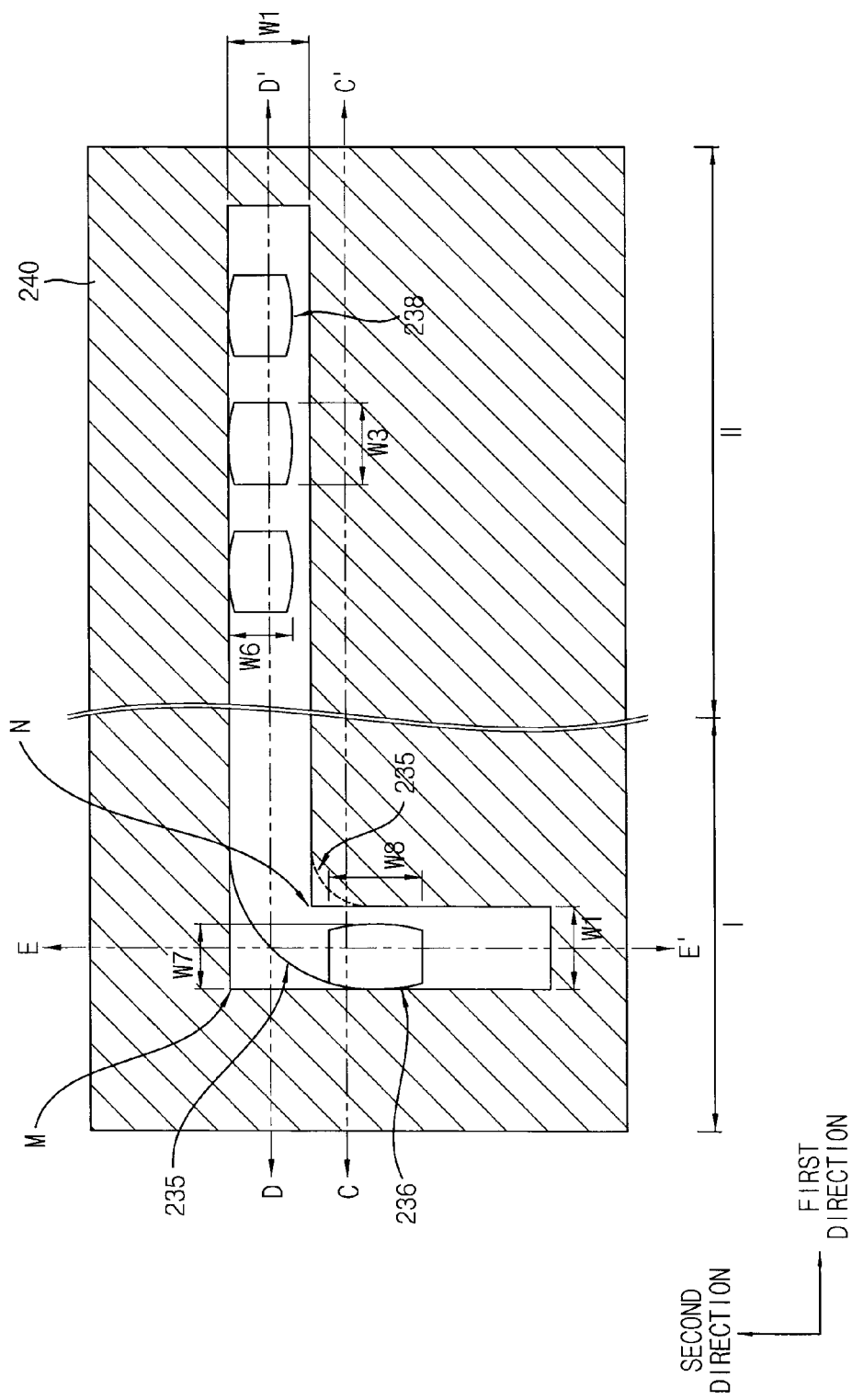
Figure 43:
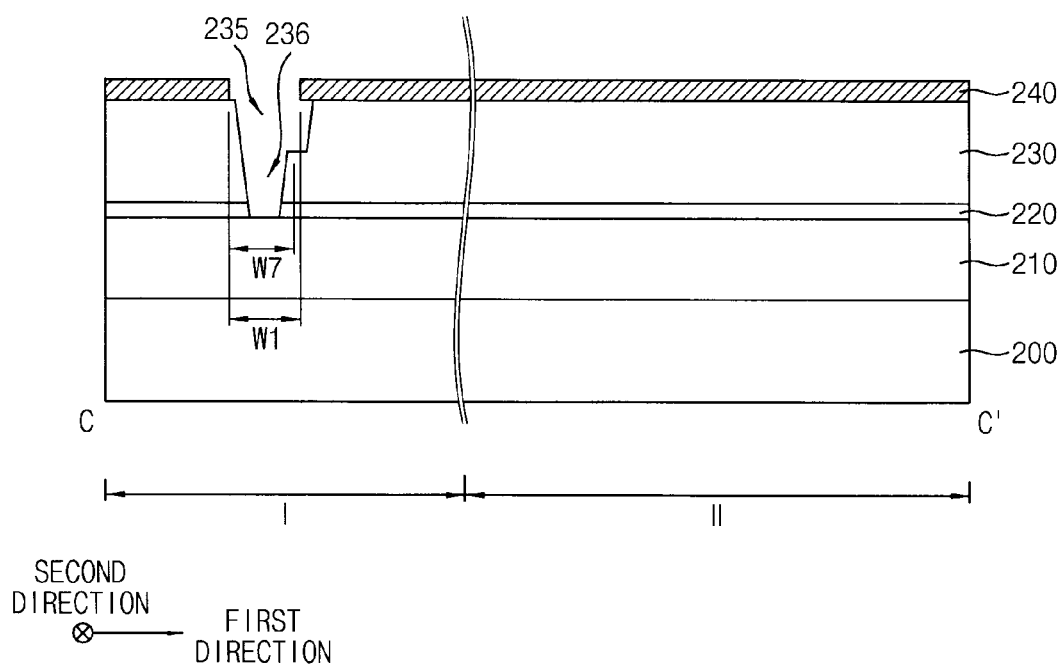
Figure 44:
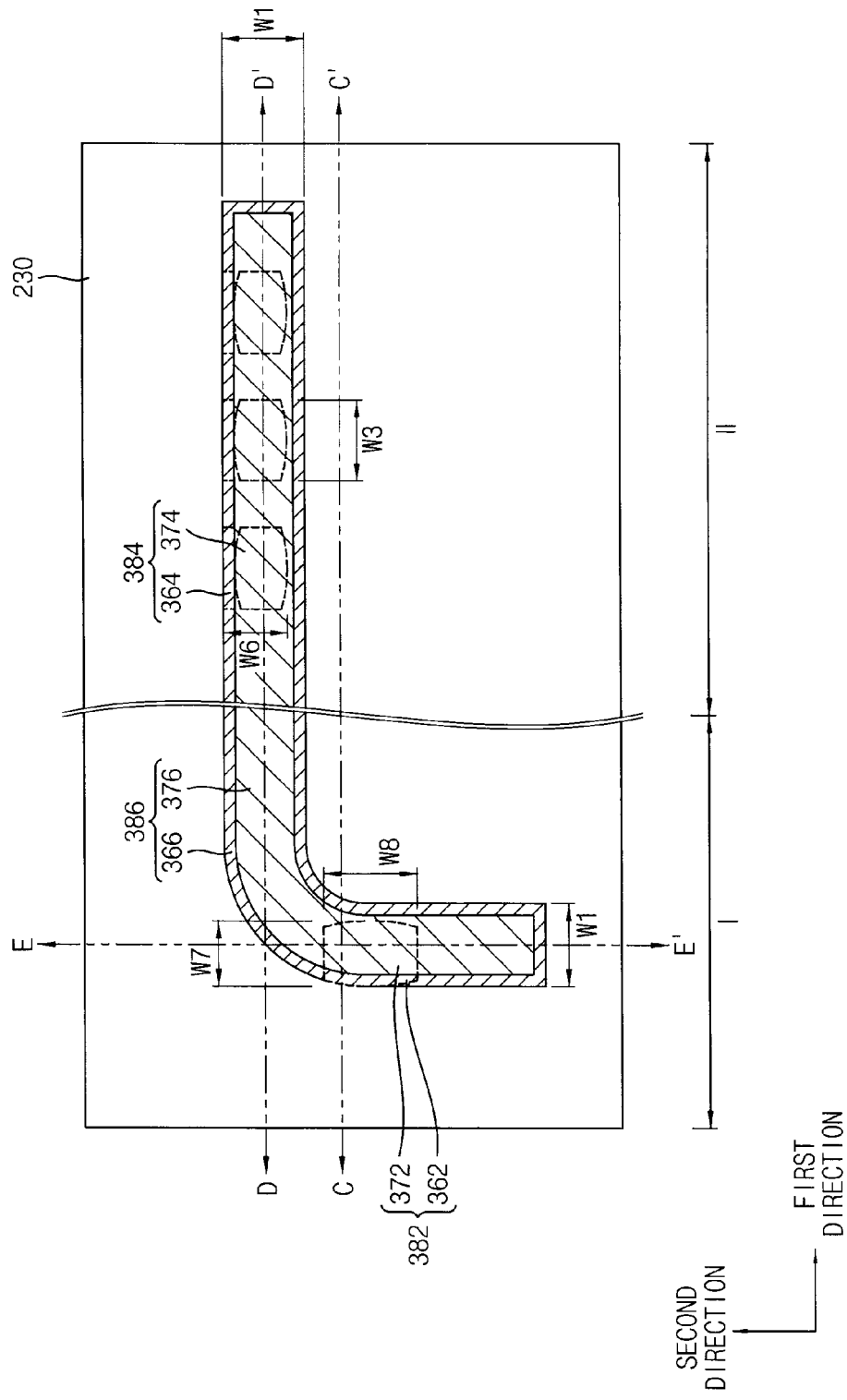
Figure 45:
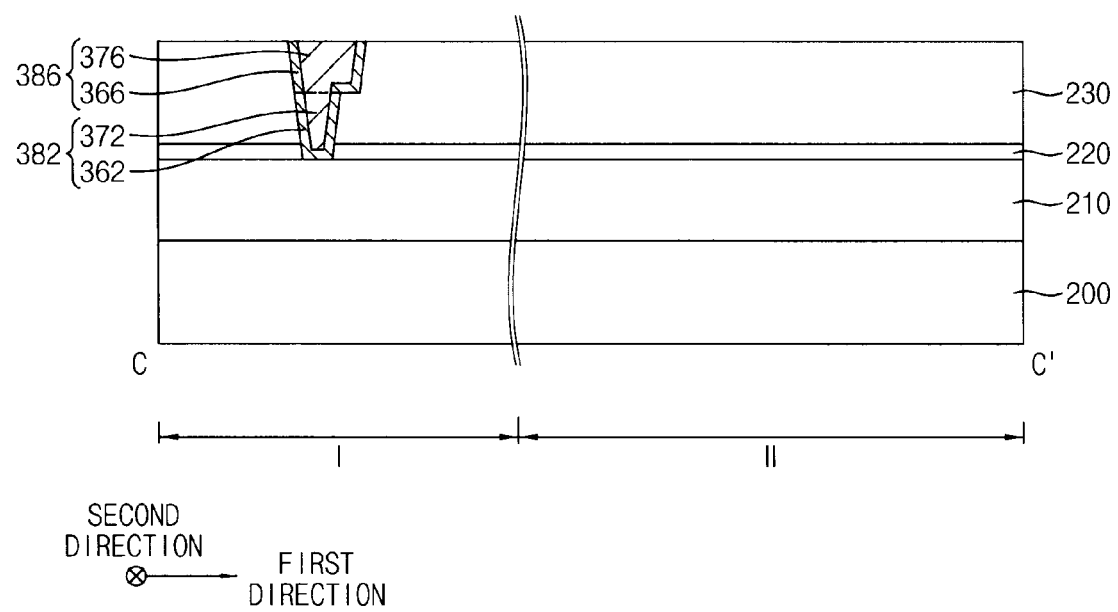

FIGS. 40 to 45 are plan views and cross-sectional views illustrating stages of a method of forming a wiring structure, in accordance with example embodiments. Particularly, FIGS. 40, 42 and 44 are plan views thereof, and FIGS. 41, 43 and 45 are cross-sectional views thereof.

This example method of forming the wiring structure may include processes that are substantially the same as or similar to the processes illustrated with reference to FIGS. 22 to 39, and detailed descriptions thereon are omitted herein.

First, processes that are substantially the same as or similar to the processes illustrated with reference to FIGS. 22 to 27 may be performed.

Referring to FIGS. 40 and 41, processes that are substantially the same as or similar to the processes illustrated with reference to FIGS. 28 to 31 may be performed.

Thus, upper portions of a second insulating interlayer 230 may be etched using first and second etching masks 240 and 250 to form first and second recesses 232 and 234.

However, each of the first and second recesses 232 and 234 may include a corner having a rounded shape.

Referring to FIGS. 42 and 43, processes that are substantially the same as or similar to the processes illustrated with reference to FIGS. 32 to 35 may be performed.

Thus, a trench 235 may be formed at an upper portion of the second insulating interlayer 230, and first and second via holes 236 and 238 may be formed at lower portions of the second insulating interlayer 230.

The trench 235 may include a first portion extending in the second direction and a second portion extending in the first direction and being in communication with the first portion. The trench 235 may include a corner having a rounded shape in a plan view. Unlike the trenches illustrated in FIGS. 32 to 35, the trench 235 may have no protrusion protruding from the rounded corner.

That is, as illustrated with reference to FIGS. 40 and 41, the first recess 232 may not have a simple rectangular shape, but may have a rectangular shape, a corner of which being rounded, and thus, when the trench 235 is formed to have a rounded shape, there may be no protrusion protruding from the rounded shape.

Referring to FIGS. 44 and 45, processes that are substantially the same as or similar to the processes illustrated with reference to FIGS. 36 to 39 may be performed.

Thus, a wiring 386 and first and second vias 382 and 384 may be formed in the trench 235 and the first and second via holes 236 and 238, respectively.

The wiring 386 may include a first portion extending in the first direction and a second direction extending in the second direction, and may have a rounded shape at a boundary between the first and second portions, i.e., at a corner thereof. The first via 382 may also have a rounded shape corresponding to the rounded shape of the corner of the wiring 386.

Accordingly, even though a contact area between the first via 382 and the wiring 386 may have a rectangular shape, a corner of which being rounded, the first via 382 may have widths in the first and second directions, respectively, greater than the widths of the second via 384. Thus, the contact area between the first via 382 and the wiring 386 may be substantially equal to or greater than a contact area between the second via 384 and the wiring 386.

FIGS. 46 to 55 are plan views and cross-sectional views illustrating stages of a method of forming a wiring structure, in accordance with example embodiments. Particularly, FIGS. 46, 47, 48, 50, 52 and 54 are plan views thereof, and FIGS. 49, 51, 53 and 55 are cross-sectional views thereof.

This example method of forming the wiring structure may include processes that are substantially the same as or similar to the processes illustrated with reference to FIGS. 22 to 39, and detailed descriptions thereon are omitted herein.

Figure 46:
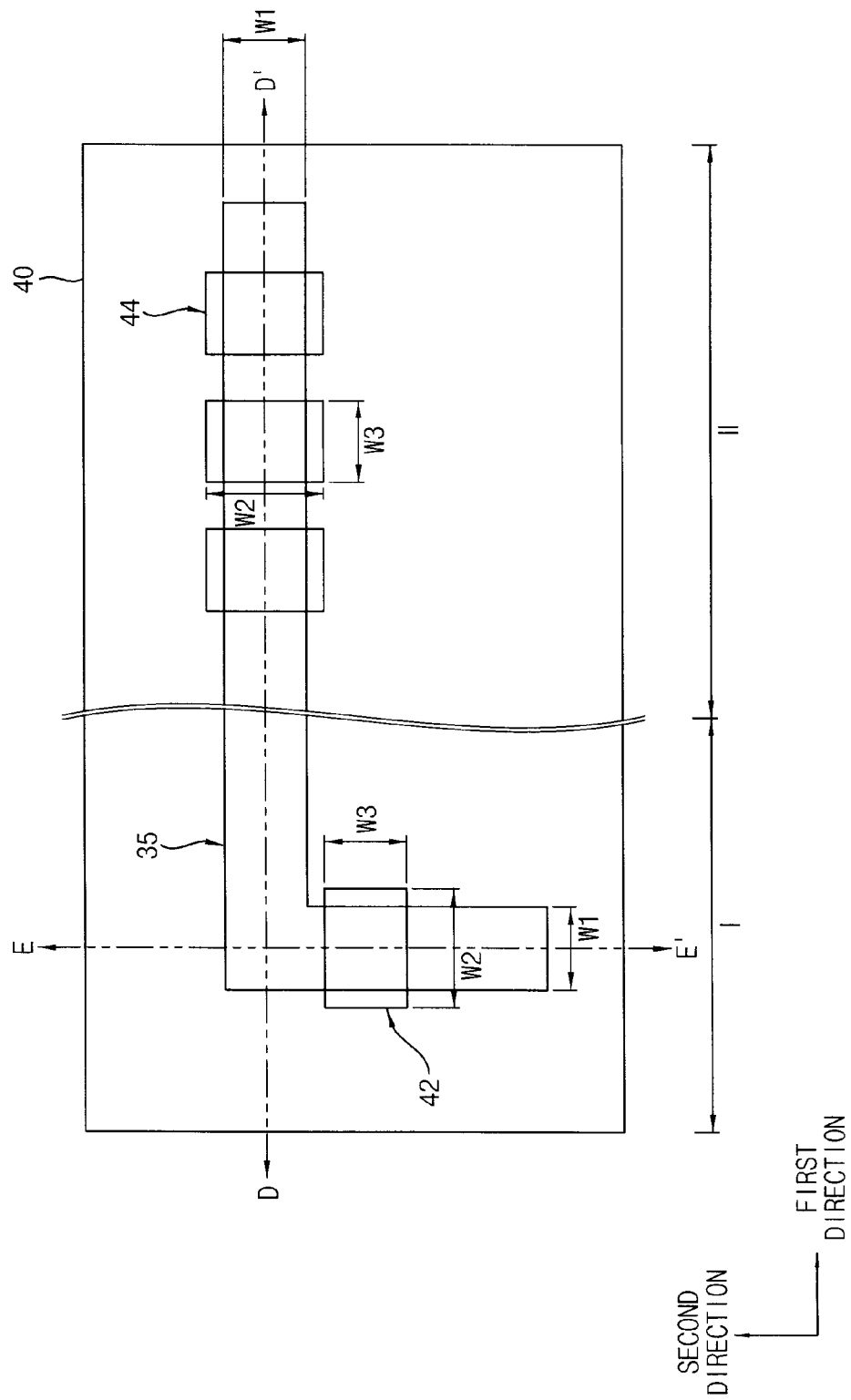
FIGS. 46 to 55 are plan views and cross-sectional views illustrating stages of a method of forming a wiring structure in accordance with example embodiments.

Referring to FIG. 46, processes that are substantially the same as or similar to the processes illustrated with reference to FIG. 22 may be performed.

Thus, a first opening 35 may be formed in a first mask (not shown), and second and third openings 42 and 44 may be formed in first and second regions I and II, respectively, of a second mask 40.

The first opening 35 may include a first portion extending in a second direction, and a second portion extending in a first direction that is substantially perpendicular to the second direction and in communication with the first portion. In an example embodiment, the first portion of the first opening 35 may have a first width W1 in the first direction, and the second portion of the first opening 35 may have the first width W1 in the second direction. The second opening 42 may second and third widths W2 and W3 in the first and second directions, respectively, and the third opening 44 may have the second and third widths W2 and W3 in the second and first directions, respectively. The second width W2 may be greater than the first width W11.

In example embodiments, each of the second and third openings 42 and 44 may at least partially vertically overlap with the first opening 35 Particularly, the second opening 42 may at least partially vertically overlap with the first portion of the first opening 35, and may expose both portions of the first mask adjacent to the first opening 35 and opposite to each other in the first direction. The third opening 44 may at least partially vertically overlap with the second portion of the first opening 35 and may expose both portions of the first mask adjacent to the first opening 35 and opposite to each other in the second direction.

Like that of FIG. 22, the second opening 42 may be adjacent or partially overlap a boundary between the first and second portions of the first opening 35.

Figure 47:
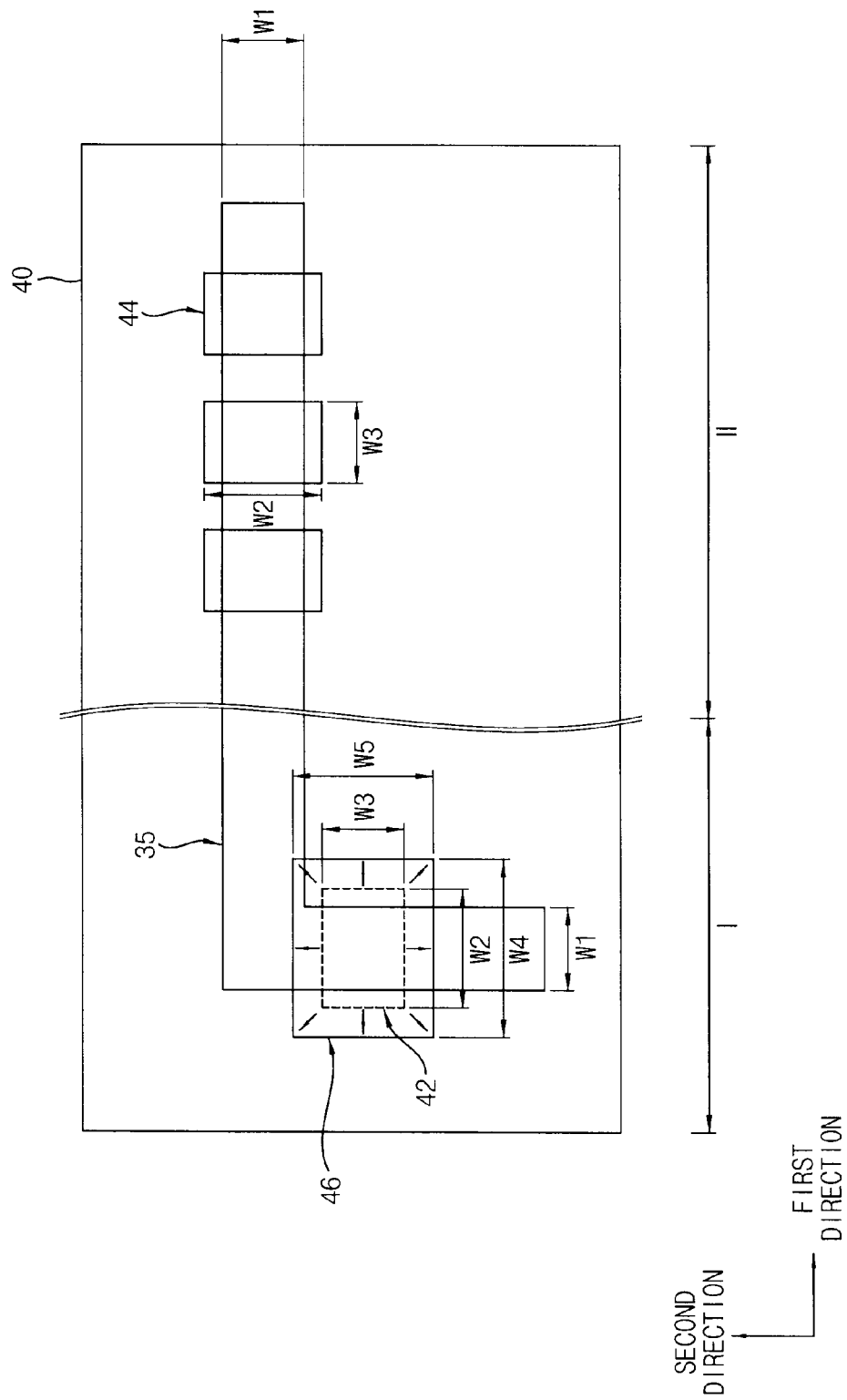

Referring to FIG. 47, processes that are substantially the same as or similar to the processes illustrated with reference to FIG. 23 may be performed.

Thus, the second opening 42 may be enlarged to form a fourth opening 46.

In example embodiments, the fourth opening 46 may be formed by enlarging the second opening 42 both in the first and second directions, and thus may have fourth and fifth widths W4 and W5 in the first and second directions, respectively.

Figure 48:
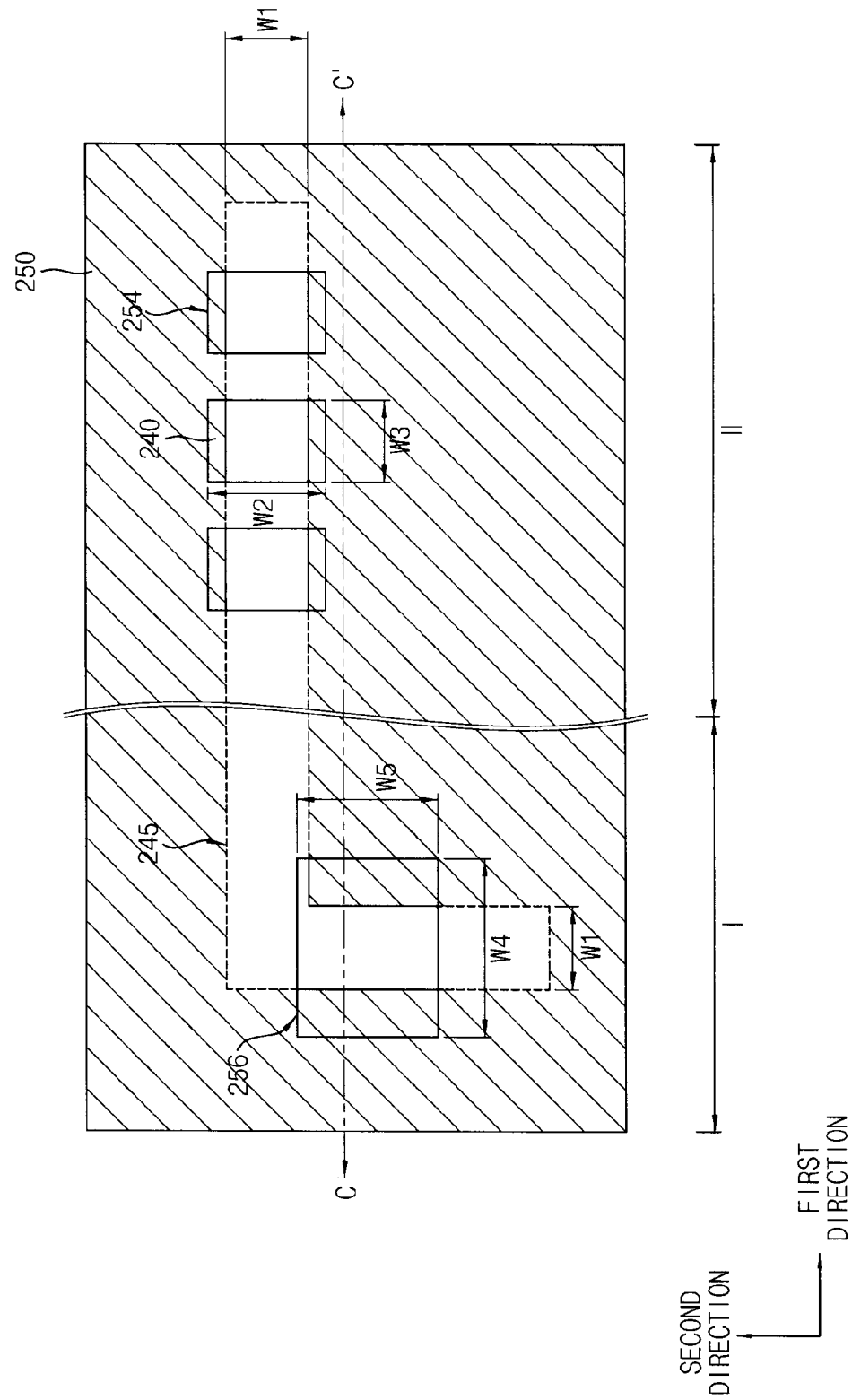
Figure 49:
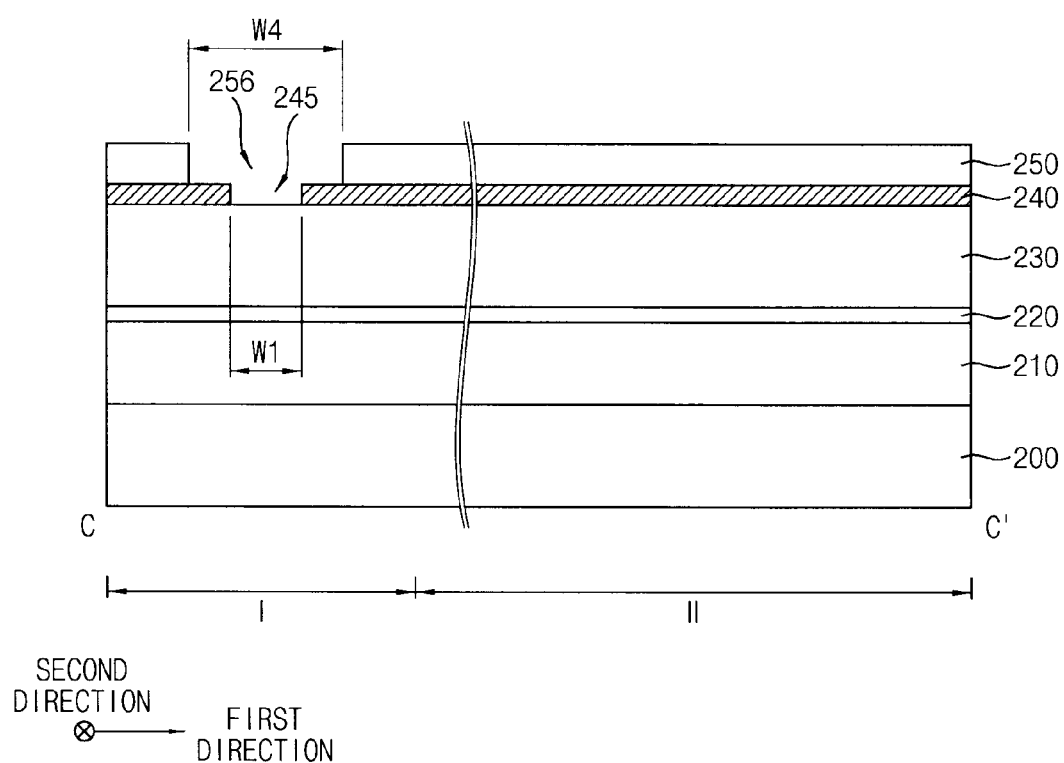

Referring to FIGS. 48 and 49, processes that are substantially the same as or similar to the processes illustrated with reference to FIGS. 24 to 27 may be performed.

Thus, a first insulating interlayer 210, an etch stop layer 220 and a second insulating interlayer 230 may be formed, for example sequentially formed, on a substrate 200, and first and second etching masks 240 and 250 may be formed on the second insulating interlayer 230 using the first mask and the second mask 40.

Figure 50:
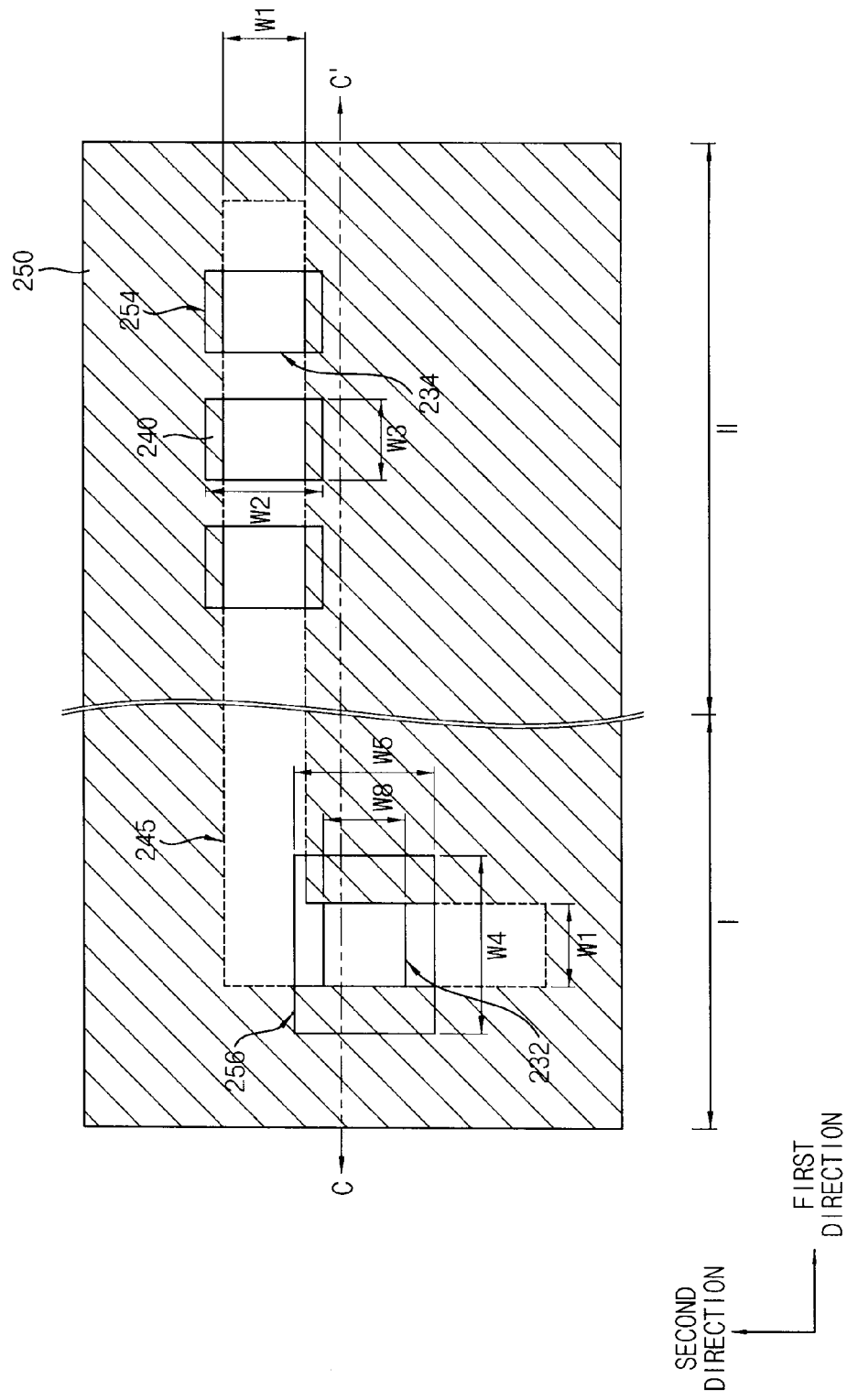
Figure 51:
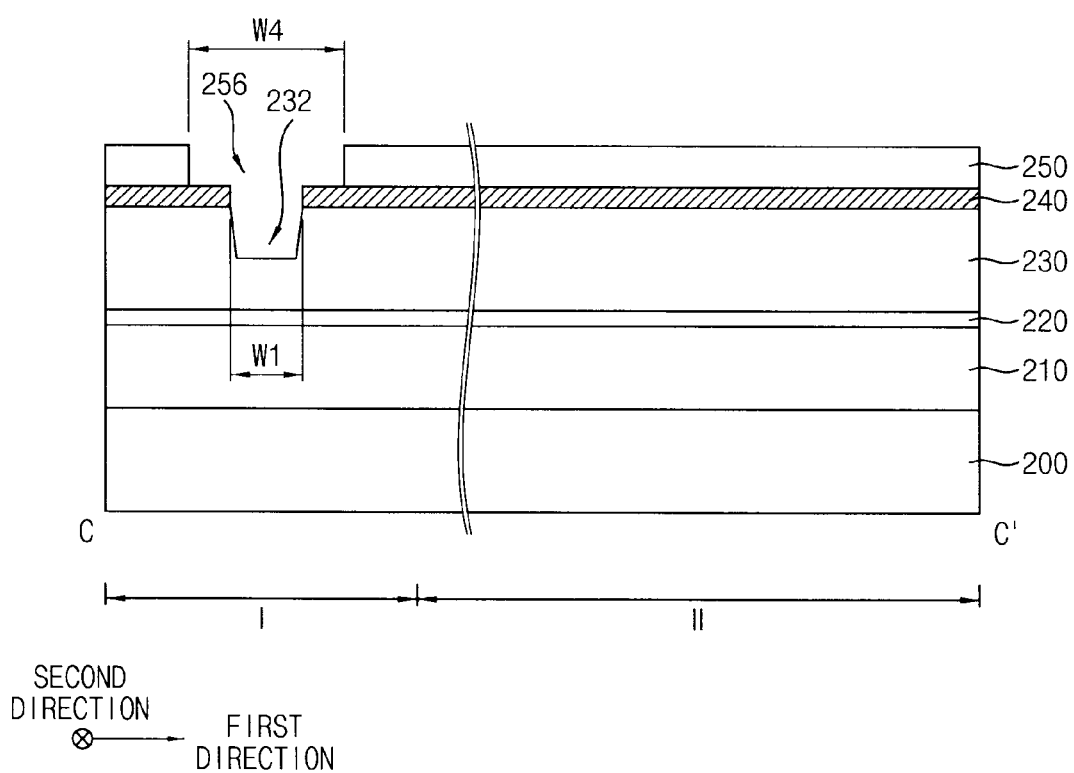

Referring to FIGS. 50 and 51, processes that are substantially the same as or similar to the processes illustrated with reference to FIGS. 28 to 31 may be performed.

Thus, upper portions of the second insulating interlayer 230 may be etched using the first and second etching masks 240 and 250 to form first and second recesses 232 and 234.

The first recess 232 in the first region I may have seventh and eighth widths W7 and W8 in the first and second directions, respectively. The second recess 234 in the second region ii may have sixth and third widths W6 and W3 in the second and first directions, respectively.

In example embodiments, the eighth width W8 may be smaller than the fifth width W5, and may be greater than the third width W3.

Figure 52:
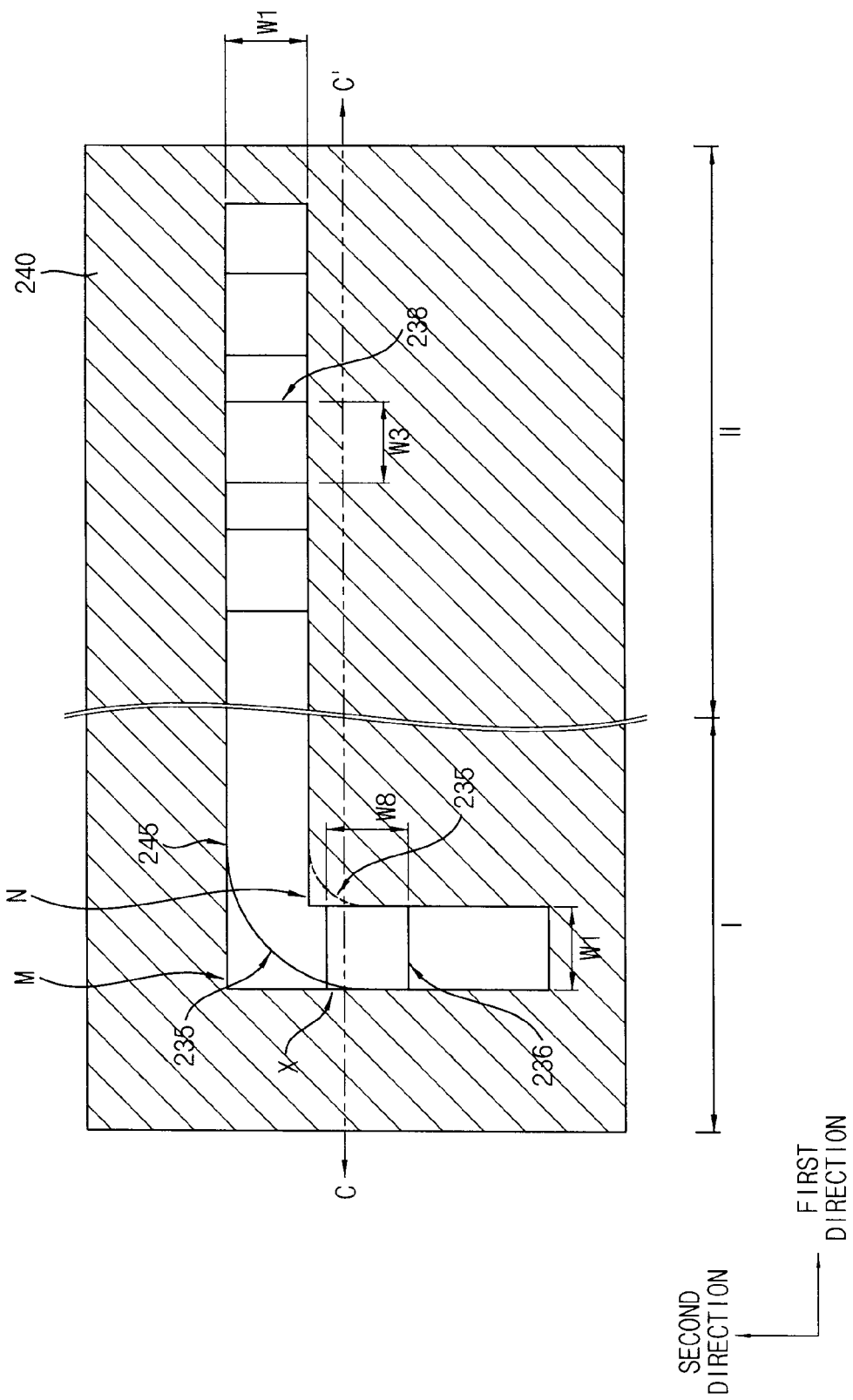
Figure 53:
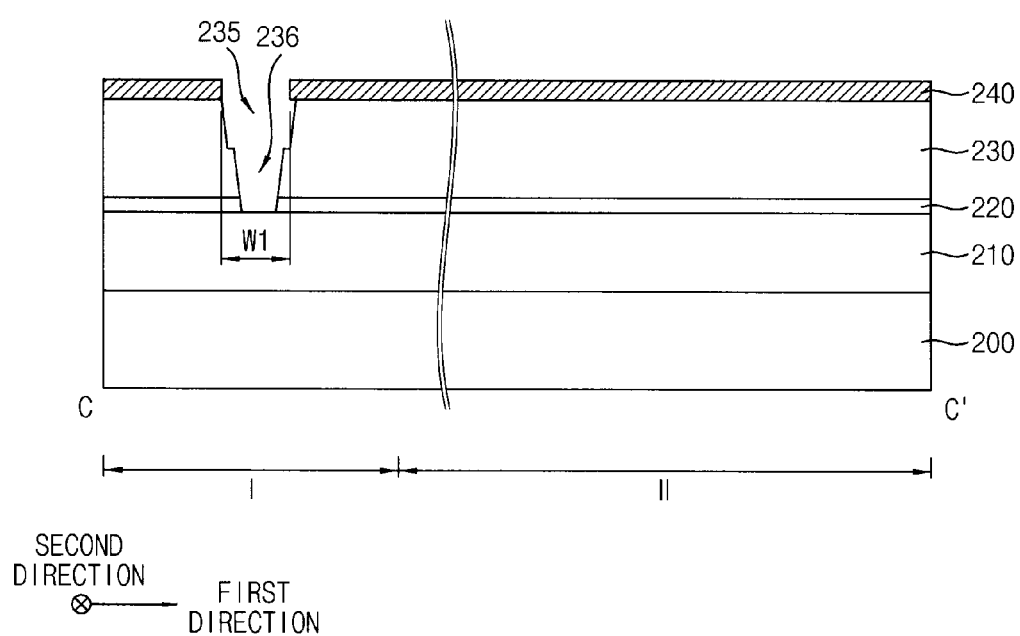

Referring to FIGS. 52 and 53, processes that are substantially the same as or similar to the processes illustrated with reference to FIGS. 32 to 35 may be performed.

Thus, a trench 235 may be formed at an upper portion of the second insulating interlayer 230, and first and second via holes 236 and 238 may be formed at lower portions of the second insulating interlayer 230.

The trench 235 may include a first portion extending in the second direction, and a second portion extending in the first direction and being in communication with the first portion. The trench 235 may have a rounded corner shape, and a portion of the rounded corner may protrude to form a protrusion X.

The first via hole 236 in the first region I may have the first and eighth widths W1 and W8 in the first and second directions, respectively, and the second via hole 238 in the second region II may have the first and third widths W1 and W3 in the second and first directions, respectively.

In example embodiments, according to the rounded corner shape of the trench 235, a portion of a corner of the first via hole 236 may also have a rounded shape. Particularly, the first via hole 236 may have a rounded corner shape similar to an imaginary extension of the rounded corner shape of the trench 235 under the protrusion X of the trench 235. Thus, the protrusion X of the trench 235 may not be in communication with the underlying first via hole 236.

Figure 54:
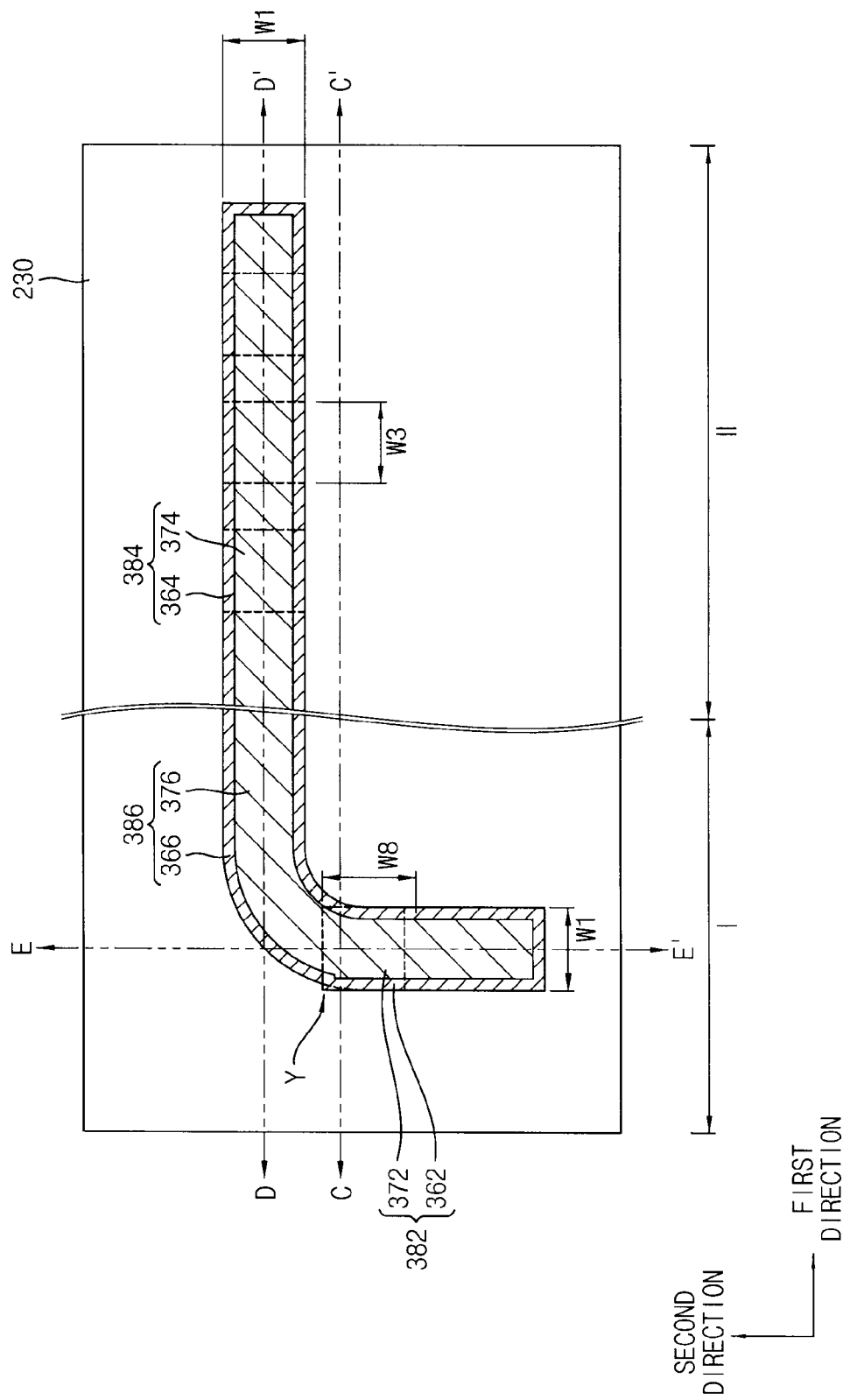
Figure 55:
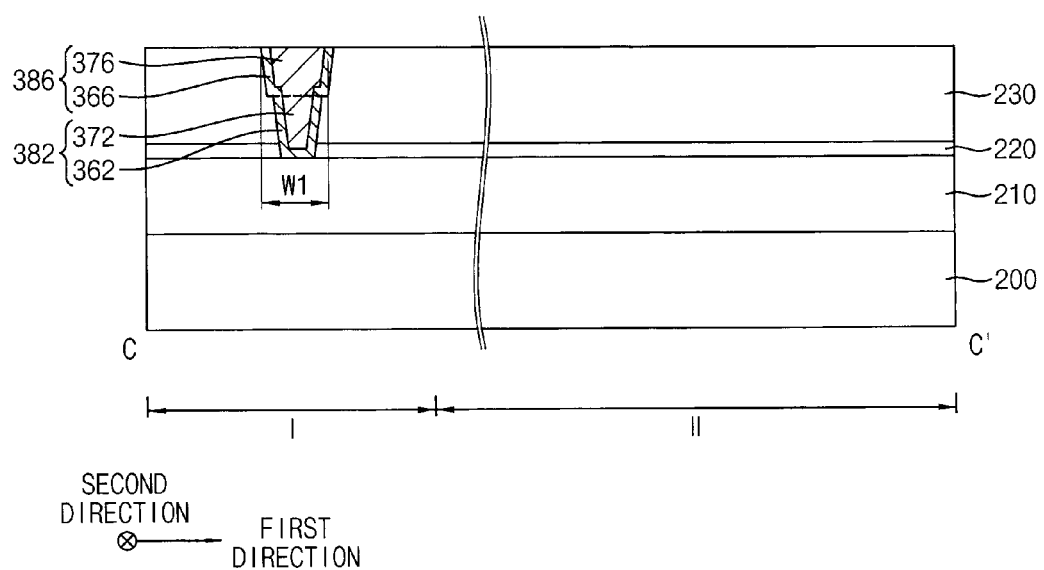

Referring to FIGS. 54 to 55, processes that are substantially the same as or similar to the processes illustrated with reference to FIGS. 36 to 39 may be performed.

Thus, a wiring 386 and first and second vias 382 and 384 may be formed in the trench 235 and the first and second via holes 236 and 238, respectively.

The wiring 386 may include a first portion extending in the first direction and a second direction extending in the second direction, and may have a rounded shape at a boundary between the first and second portions, i.e., at a corner thereof. In example embodiments, the wiring 386 may include a protrusion Y protruding from the corner having the rounded shape.

In example embodiments, the first via 382 may be formed to at least partially contact the corner of the wiring 386 The first via 382 may be adjacent to the protrusion Y of the wiring 386, however, may not contact a bottom of the protrusion Y of the wiring 386. That is, a corner of the first via 382 may have a rounded shape corresponding to the rounded shape of the corner of the wiring 386 except for the protrusion Y, and thus the bottom of the protrusion Y of the wiring 386 may not contact the first via 382 but may be covered by the second insulating interlayer 230.

Accordingly, a contact area between the first via 382 and the wiring 386 may have a rectangular shape of which a corner is rounded, and thus may be than an area of a simple rectangular shape. However, in example embodiments, the eighth width W8 of the first via 382 may be greater than the third width W3 of the second via 284, and thus the contact area between the first via 382 and the wiring 386 may be substantially equal to or greater than a contact area between the second via 384 and the wiring 386. Thus, the contact area between the first vias 382 and the overlying the wiring 386 may not be reduced, which may realize a low contact resistance.

Figure 56:
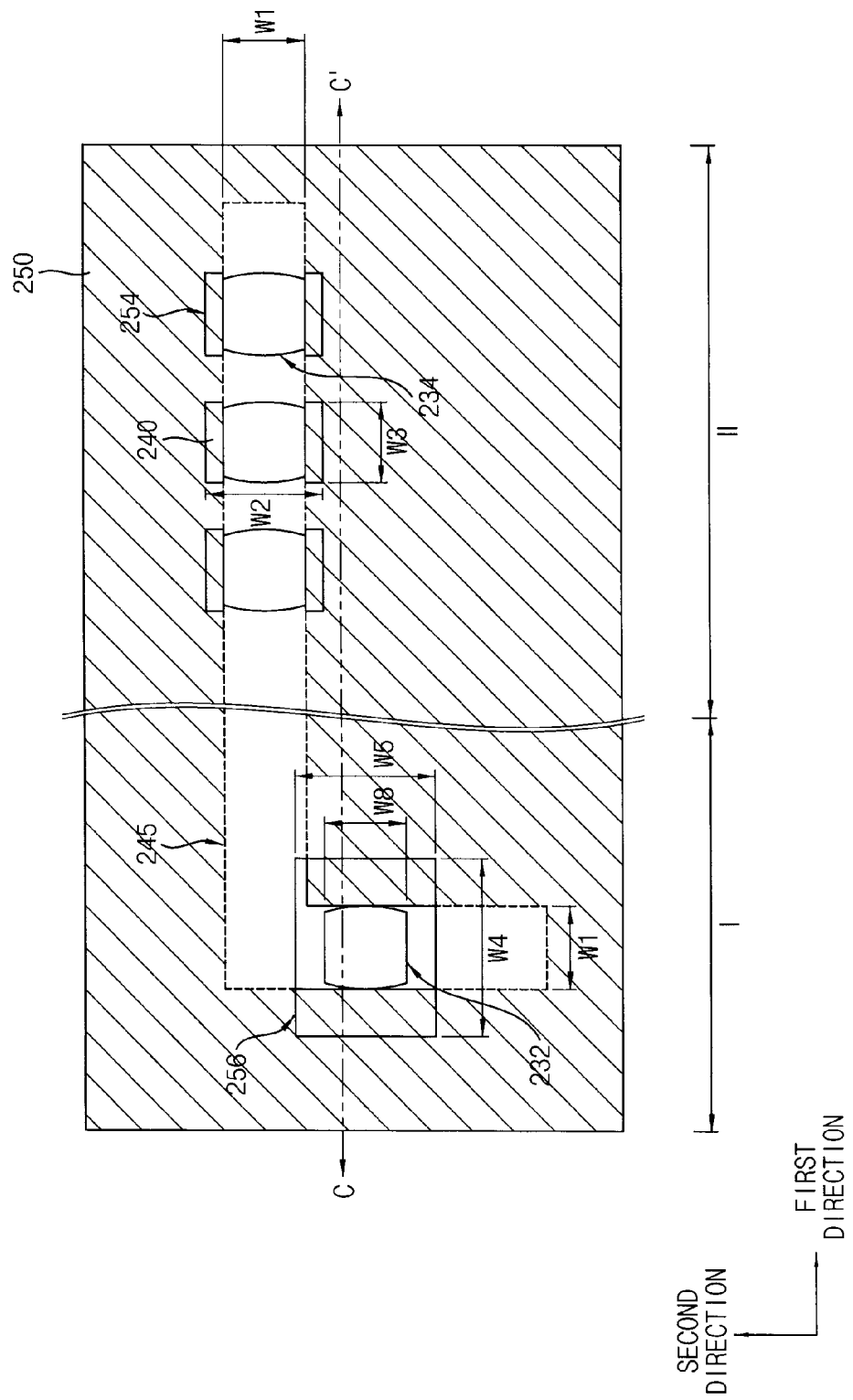
FIGS. 56 to 61 are plan views and cross-sectional views illustrating stages of a method of forming a wiring structure in accordance with example embodiments.
Figure 57:
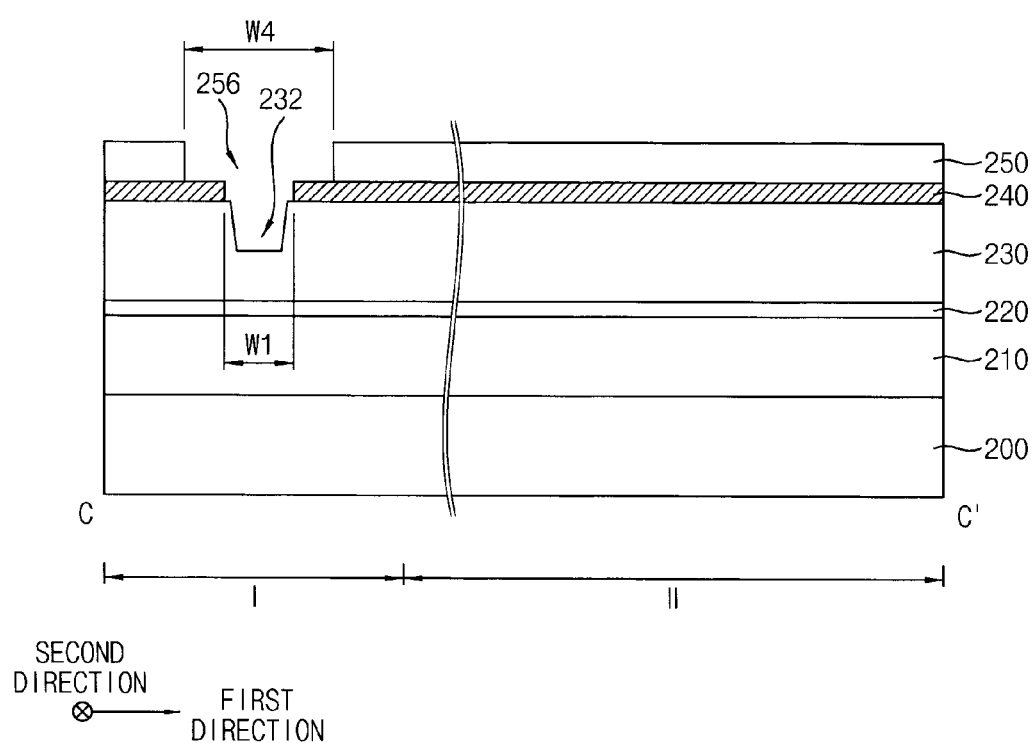
Figure 58:
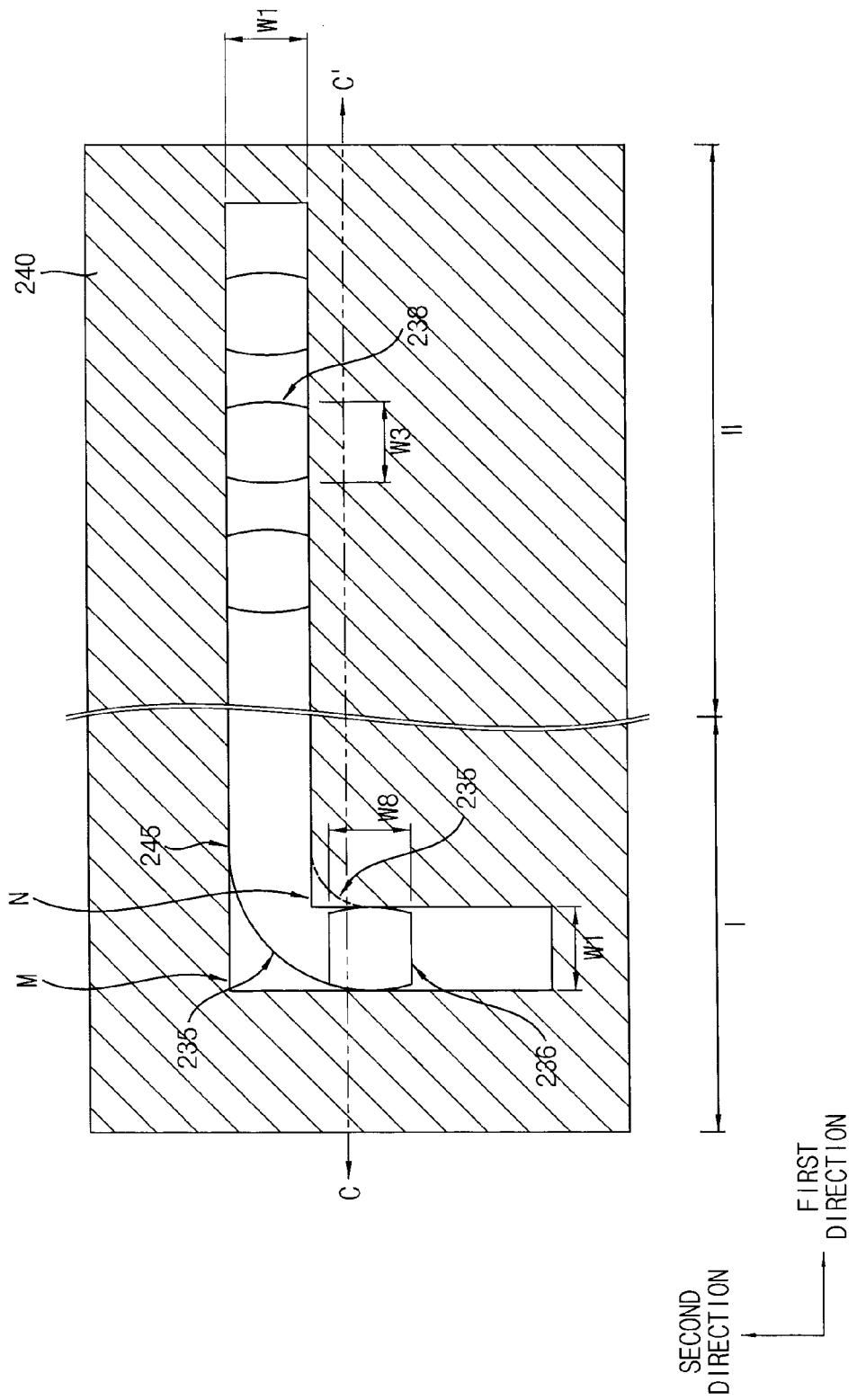
Figure 59:
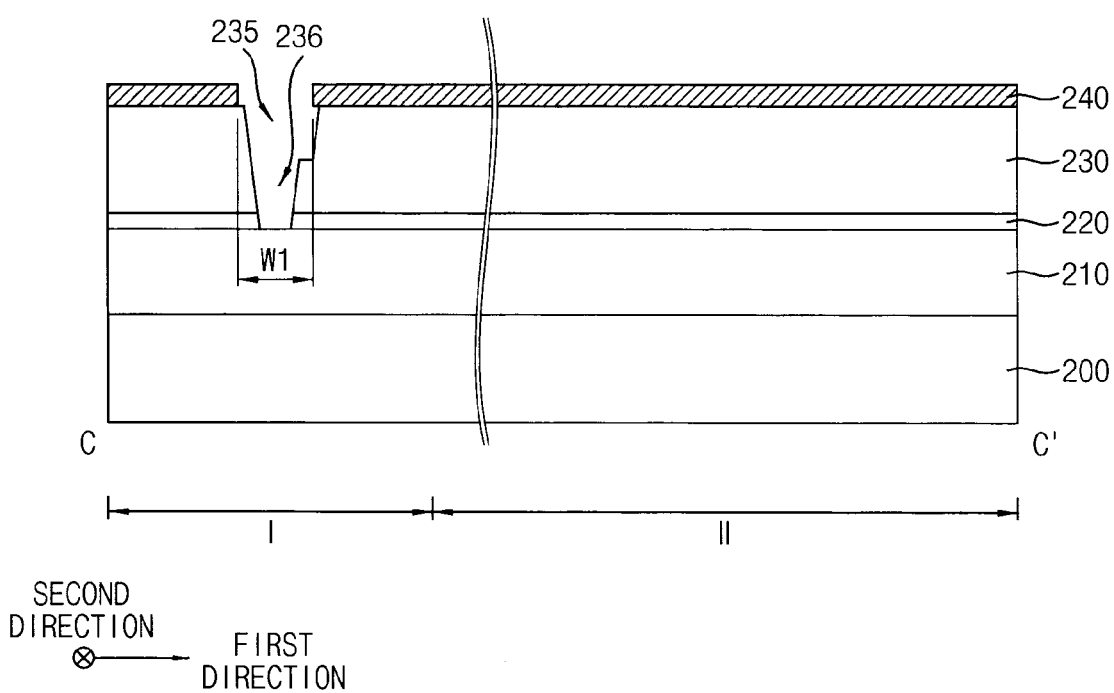
Figure 60:
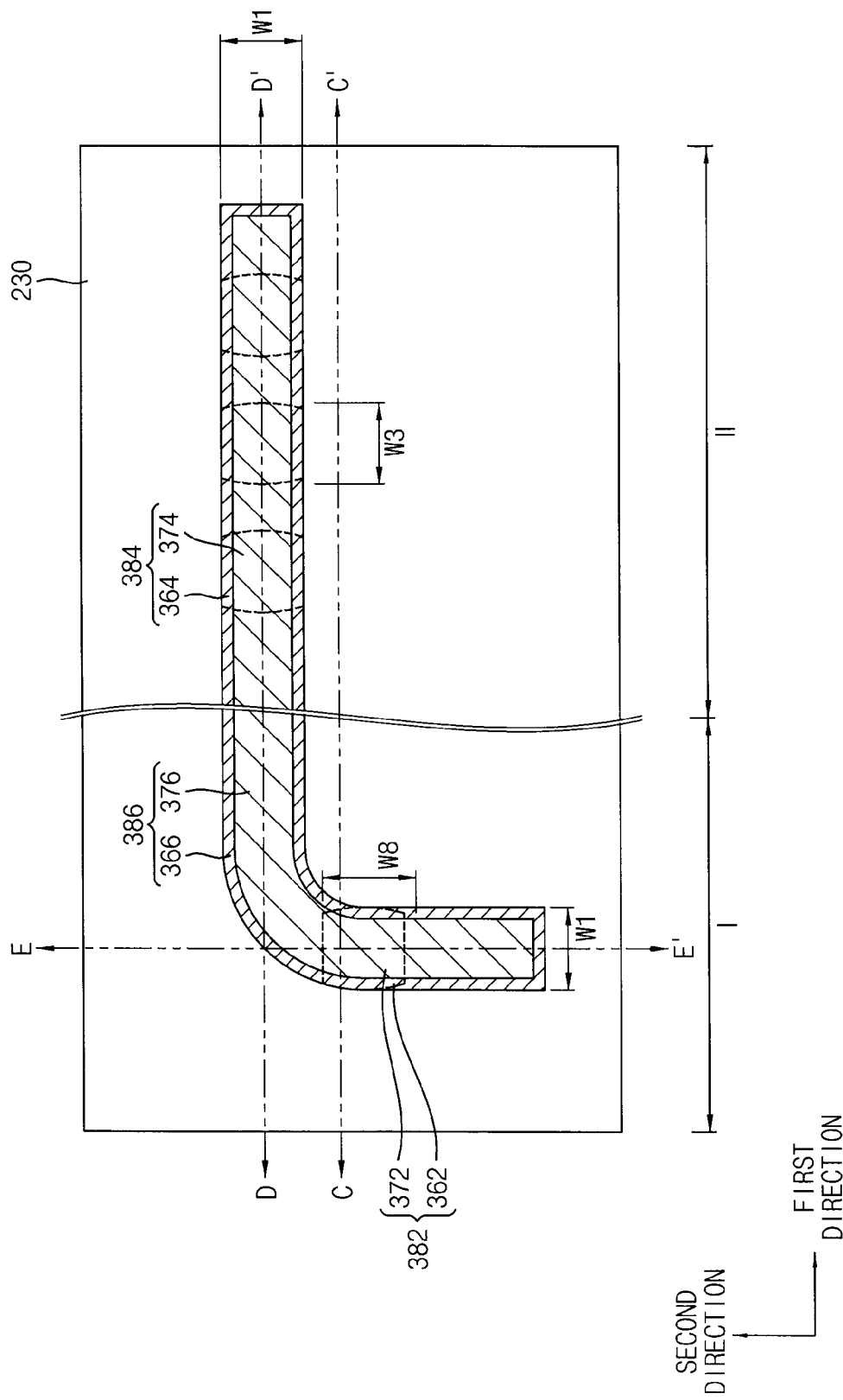
Figure 61:
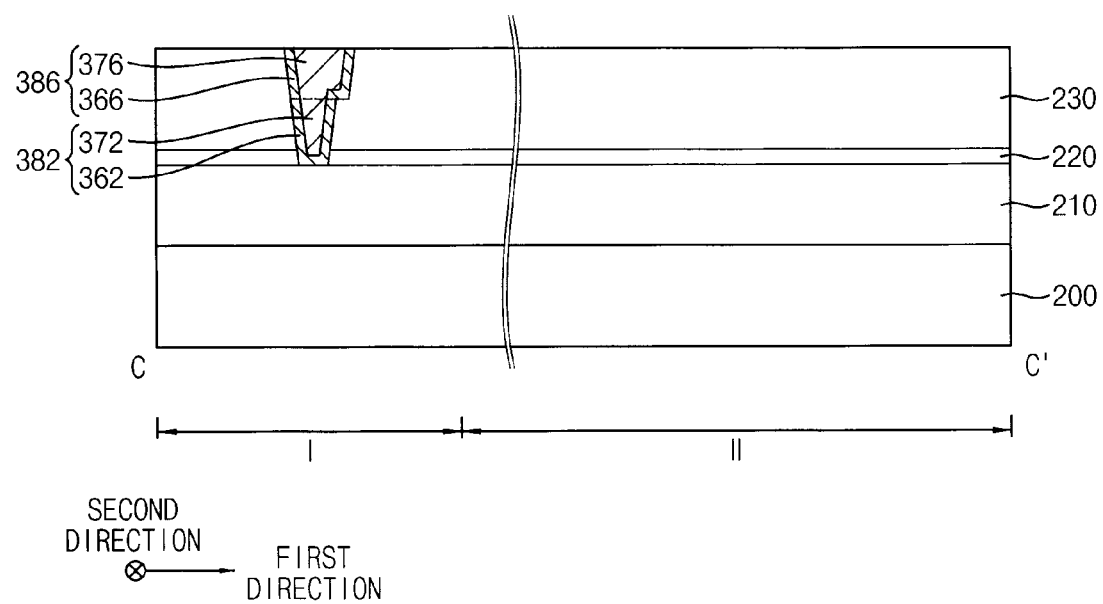

FIGS. 56 to 61 are plan views and cross-sectional views illustrating stages of a method of forming a wiring structure in accordance with example embodiments. Particularly, FIGS. 56, 58 and 60 are plan views thereof, and FIGS. 57, 59 and 61 are cross-sectional views thereof.

This method of forming the wiring structure may include processes that are substantially the same as or similar to the processes illustrated with reference to FIGS. 46 to 55, and detailed descriptions thereon are omitted herein.

First, processes that are substantially the same as or similar to the processes illustrated with reference to FIGS. 46 to 49 may be performed.

Referring to FIGS. 56 and 57, processes that are substantially the same as or similar to the processes illustrated with reference to FIGS. 50 and 51 may be performed.

Thus, upper portions of the second insulating interlayer 230 may be etched using the first and second etching masks 240 and 250 to form first and second recesses 232 and 234.

However, each of the first and second recesses 232 and 234 may be formed to include a rounded corner.

Referring to FIGS. 58 and 59, processes that are substantially the same as or similar to the processes illustrated with reference to FIGS. 42 and 43 may be performed.

Thus, a trench 235 may be formed at an upper portion of the second insulating interlayer 230, and first and second via holes 236 and 238 may be formed at lower portions of the second insulating interlayer 230.

The trench 235 may include a first portion extending in the second direction, and a second portion extending in the first direction and being in communication with the first portion. The trench 235 may have a rounded corner shape, however, unlike that of FIGS. 42 and 43, the trench 235 may have no protrusion.

Referring to FIGS. 60 and 61, processes that are substantially the same as or similar to the processes illustrated with reference to FIGS. 44 and 45 may be performed.

Thus, a wiring 386 and first and second vias 382 and 384 may be formed in the trench 235 and the first and second via holes 236 and 238, respectively.

The wiring 386 may include a first portion extending in the first direction and a second direction extending in the second direction, and may have a rounded shape at a boundary between the first and second portions, i.e., at a corner thereof. The first via 382 may also have a rounded corner shape corresponding to that of the wiring 386.

Accordingly, even though a contact area between the first via 382 and the wiring 386 may have a rectangular shape a corner of which being rounded, the first via 382 may have widths in the first and second directions, respectively, greater than the widths of the second via 384. Thus, the contact area between the first vias 382 and the overlying wiring 386 may be substantially equal to or greater than the contact area between the second vias 384 and the overlying the wiring 386.

FIGS. 62 to 89 are plan views and cross-sectional views illustrating stages of a method of manufacturing a semiconductor device in accordance with example embodiments. Particularly, FIGS. 62, 64, 67, 70, 73, 76, 79, 82 and 85 are plan views thereof, and FIGS. 63, 65-66, 68-69, 71-72, 74-75, 77-78, 80-81, 83-84 and 86-89 are cross-sectional views thereof.

Figure 65:
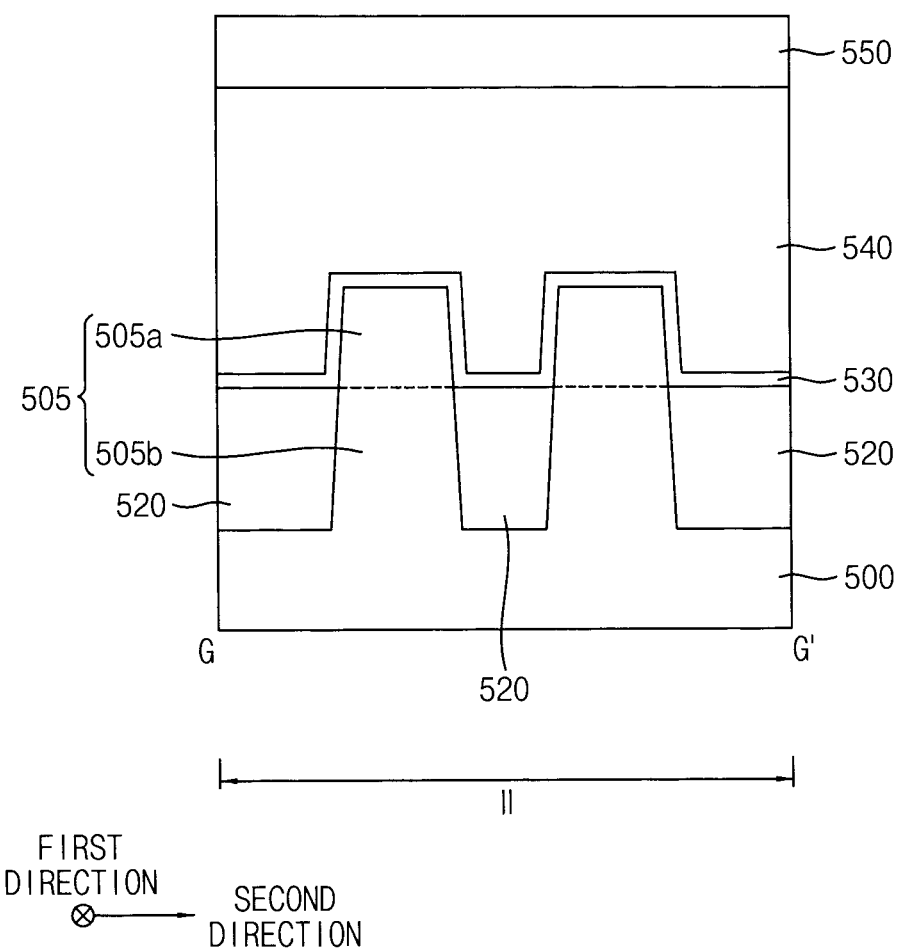
Figure 80:
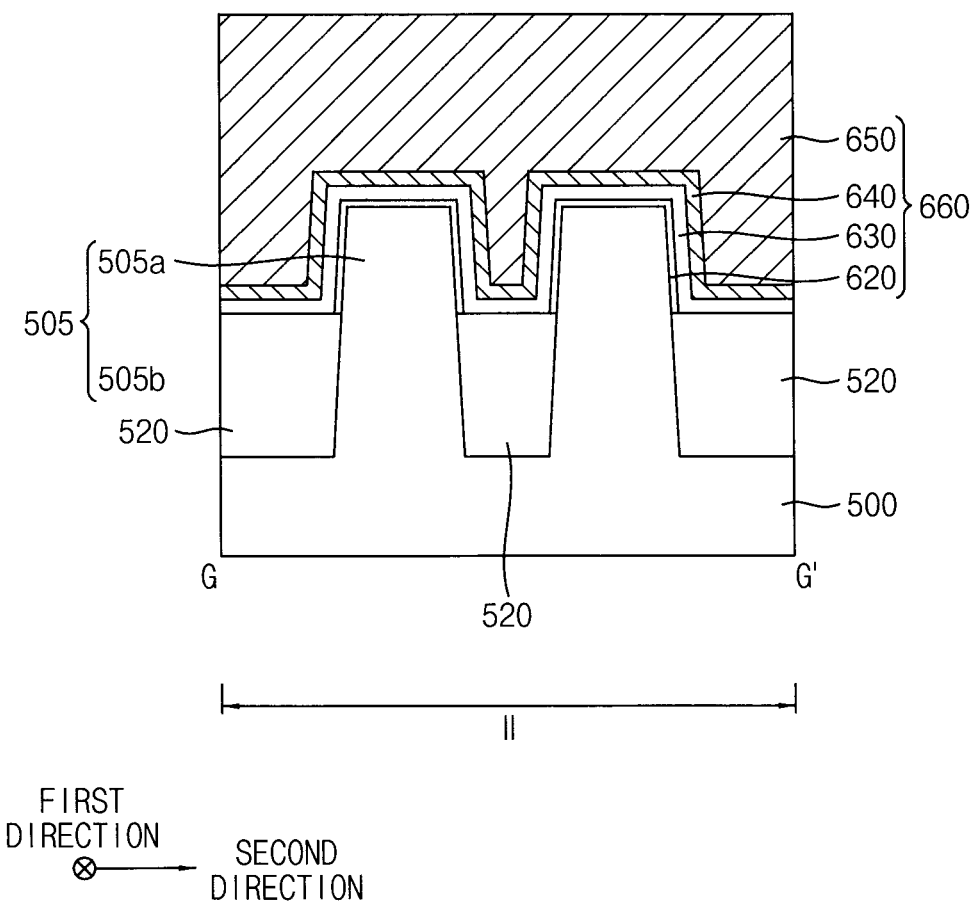
Figure 87:
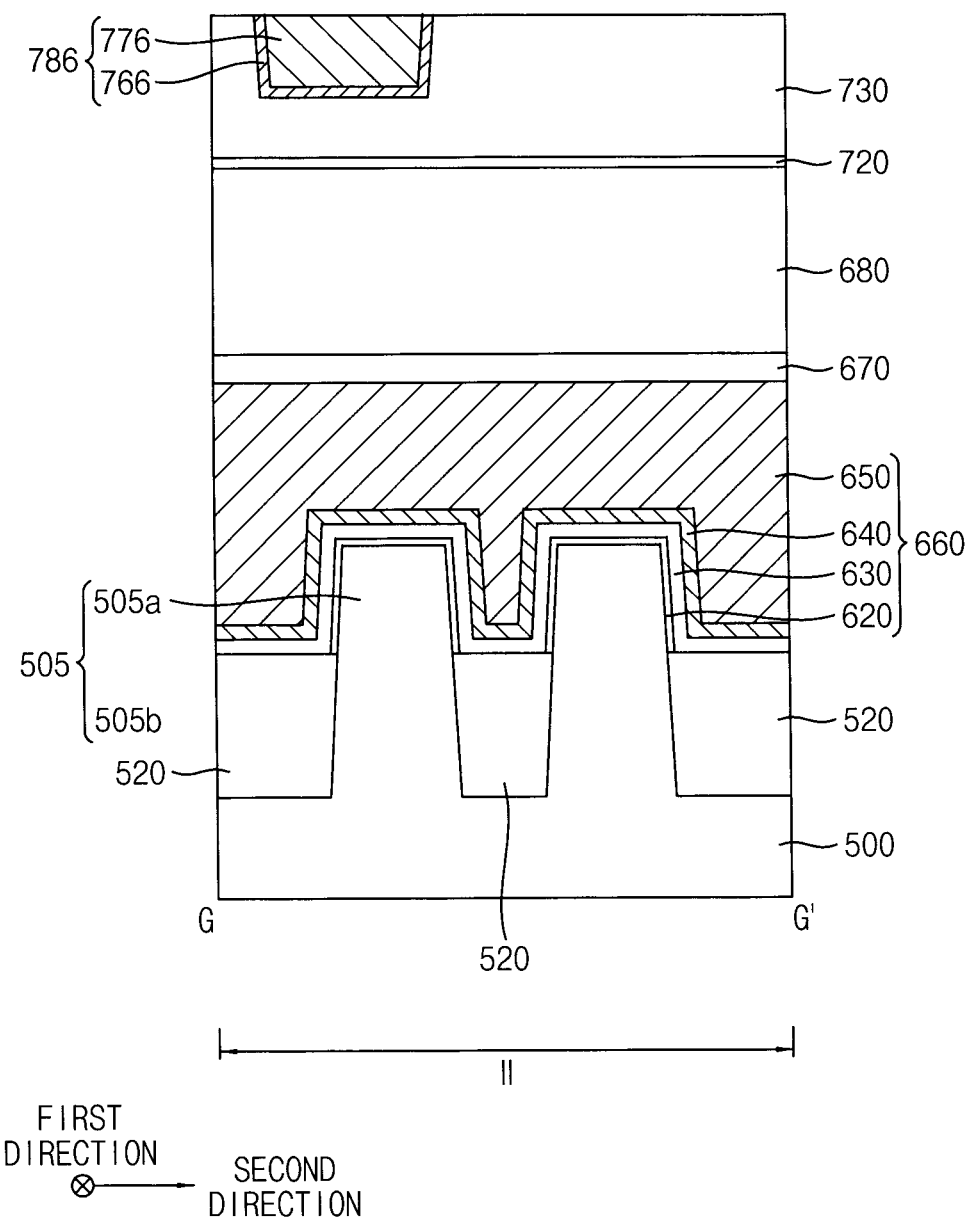
Figure 88:
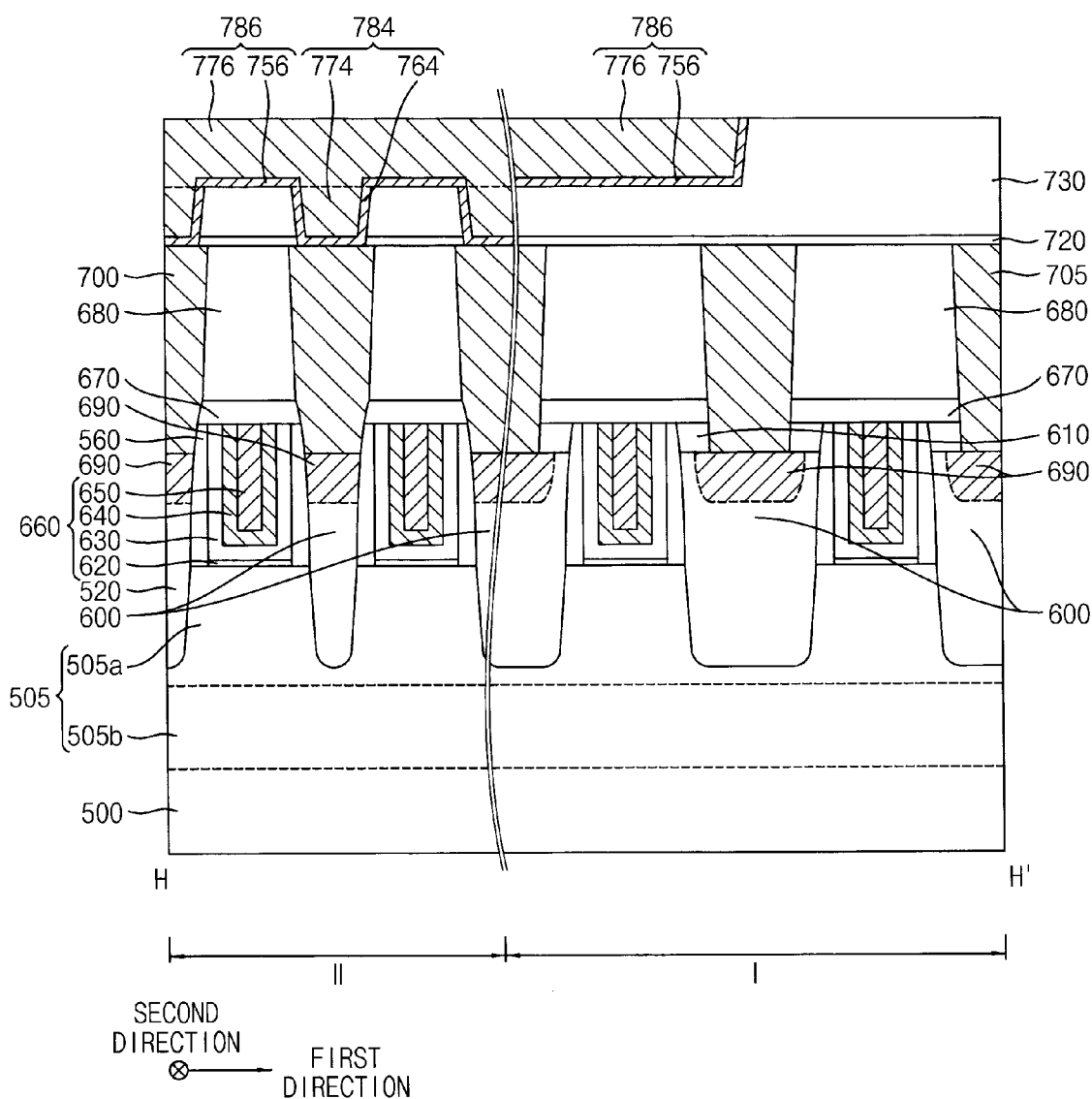
Figure 89:
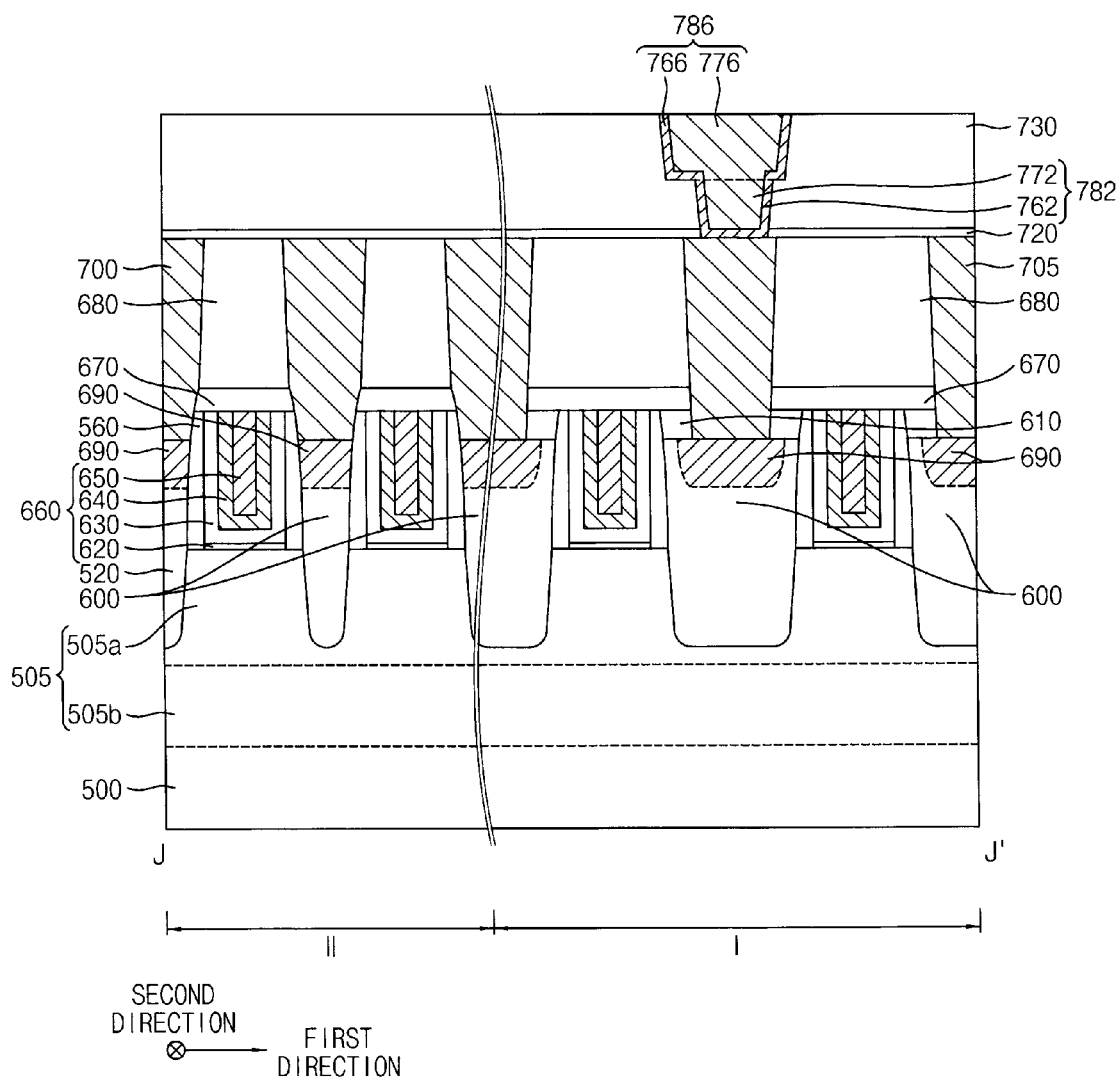

FIGS. 63, 68, 71, 7'4, 77, 83 and 86 are cross-sectional views taken along lines F-F' of corresponding plan views, FIGS. 65, 80 and 87 are cross-sectional views taken along lines G-G' of corresponding plan views, FIGS. 66, 69, 72, 75, 78, 81, 84 and 88 are cross-sectional views taken along lines H-H' of corresponding plan views, and FIG. 89 is a cross-sectional view taken along line J-J' of a corresponding plan view.

Figure 62:
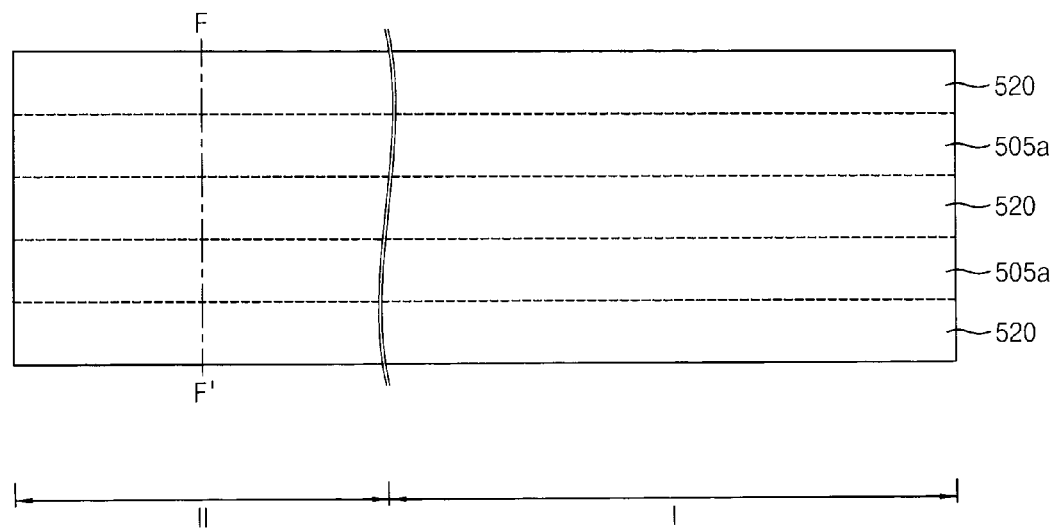
Figure 63:
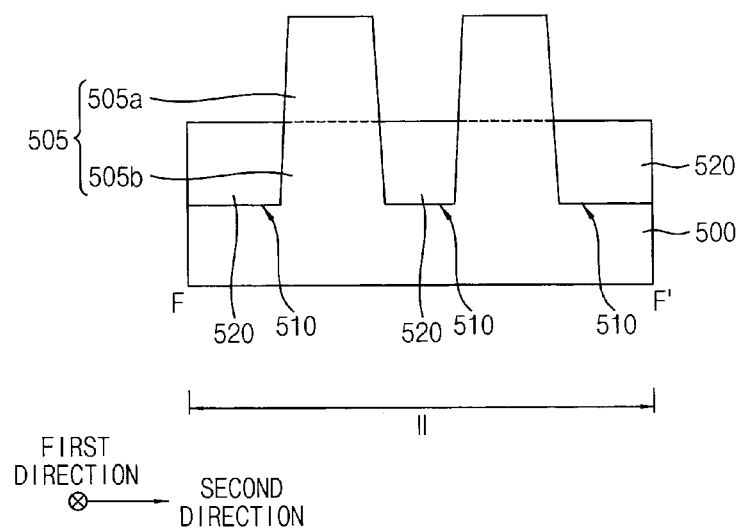

Referring to FIGS. 62 and 63, an upper portion of a substrate 500 may be partially removed to form third recesses 510, and an isolation pattern 520 may be formed to fill a lower portion of each of the third recesses 510.

The substrate 500 may include a semiconductor material, e.g., silicon, germanium, silicon-germanium, etc., or III-V semiconductor compounds, e.g., GaP, GaAs, GaSb, etc. In an example embodiment, the substrate 500 may be an SOI substrate or a GOI substrate. The substrate 500 may include first and second regions I and II.

In example embodiments, the isolation pattern 520 may be formed by forming an isolation layer on the substrate 500 to sufficiently fill the third recesses 510, planarizing the isolation layer until a top surface of the substrate 500 may be exposed, and removing an upper portion of the isolation layer. The isolation layer may be formed of or include an oxide, e.g., silicon oxide.

As the isolation pattern 520 may be formed on the substrate 500, a field region having a top surface covered by the isolation pattern 520 and an active region having a top surface not covered by the isolation pattern 520 may be defined in the substrate 500. The active region may have a fin-like shape protruding from the substrate 500, and thus may be referred to as an active fin 505.

In example embodiments, the active fin 505 may be formed to extend in a first direction substantially parallel to the top surface of the substrate 500, and a plurality of active fins 505 may be formed in a second direction substantially parallel to the top surface of the substrate 500 and substantially perpendicular to the first direction.

In example embodiments, the active fin 505 may include a lower active pattern 505b of which a sidewall may be covered by the isolation pattern 520, and an upper active pattern 505a protruding from a top surface of the isolation pattern 520. In example embodiments, the upper active pattern 505a may have a width in the second direction slightly smaller than a width of the lower active pattern 505b in the second direction.

Figure 64:
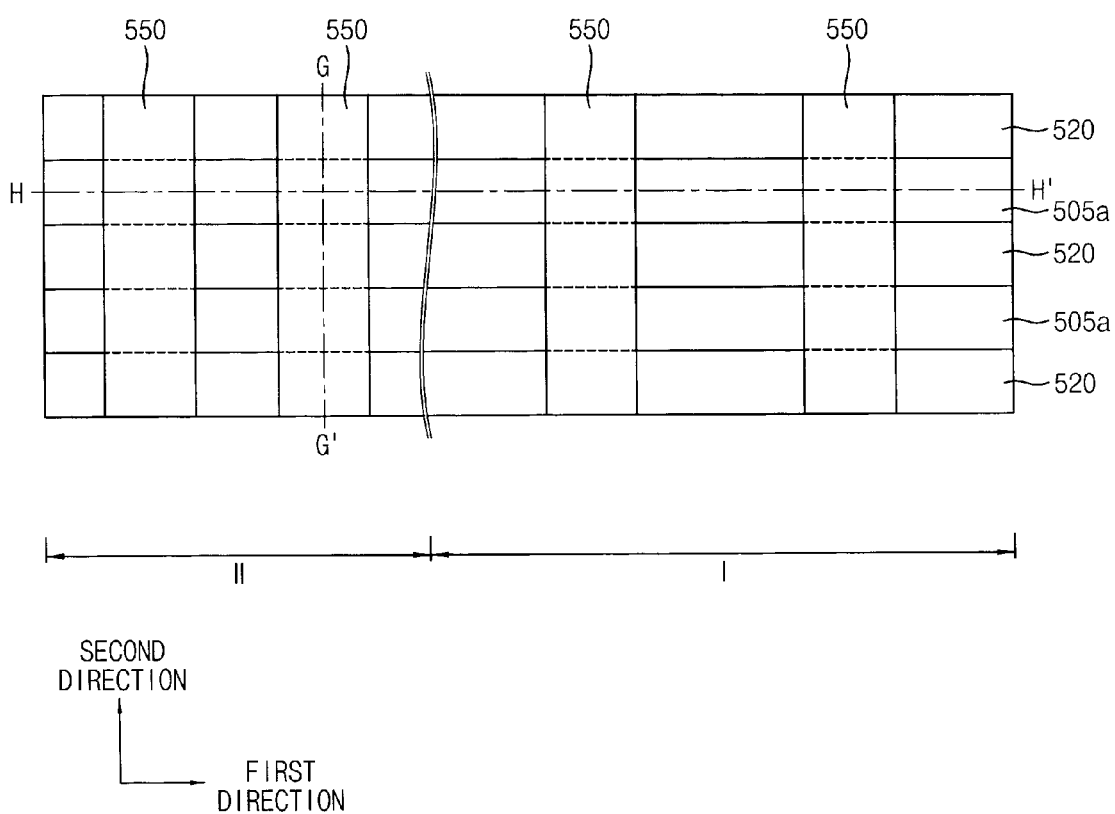
Figure 66:
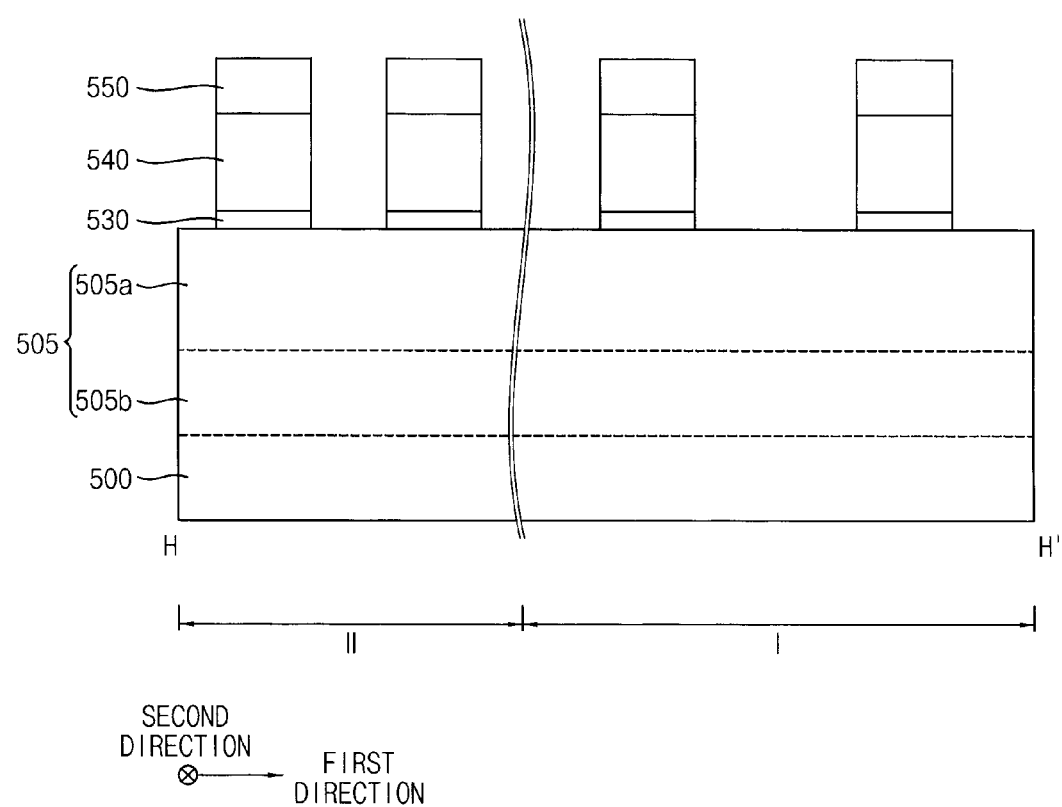

Referring to FIGS. 64 to 66, a dummy gate structure may be formed on the substrate 500.

The dummy gate structure may be formed by forming, for example sequentially forming, a dummy gate insulation layer, a dummy gate electrode layer, and a dummy gate mask layer on the active fin 505 of the substrate 500 and the isolation pattern 20, patterning the dummy gate mask layer by a photolithography process using a photoresist pattern (not shown) to form a dummy gate mask 550, and etching, for example sequentially etching, the dummy gate electrode layer and the dummy gate insulation layer. Thus, the dummy gate structure may be formed to include a dummy gate insulation pattern 530, a dummy gate electrode 540 and the dummy gate mask 550 stacked, for example sequentially stacked, on the active fin 505 of the substrate 500 and a portion of the isolation pattern 520 adjacent to the active fin 505 in the second direction.

The dummy gate insulation layer may be formed of or include an oxide, e.g., silicon oxide, the dummy gate electrode layer may be formed of or include, e.g., polysilicon, and the dummy gate mask layer may be formed of or include a nitride, e.g., silicon nitride. The dummy gate insulation layer may be formed by a CVD process, an ALD process, or the like. Alternatively, the dummy gate insulation layer may be formed by a thermal oxidation process on an upper portion of the substrate 500, and in this case, the dummy gate insulation layer may not be formed on the isolation pattern 520 but formed only on the active fin 505. The dummy gate electrode layer, and the dummy gate mask layer may be also formed by a CVD process, an ALD process, etc.

In example embodiments, the dummy gate structure may be formed to extend in the second direction on the active fins 505 of the substrate 500 and the isolation pattern 520, and a plurality of dummy gate structures may be formed in the first direction. In example embodiments, the dummy gate structures in the first region I may be spaced apart from each other at a distance greater than a distance between the dummy gate structures spaced apart from each other in the second direction II.

An ion implantation process may be further performed to form an impurity region (not shown) at an upper portion of the active fin 505 adjacent to the dummy gate structure.

Figure 67:
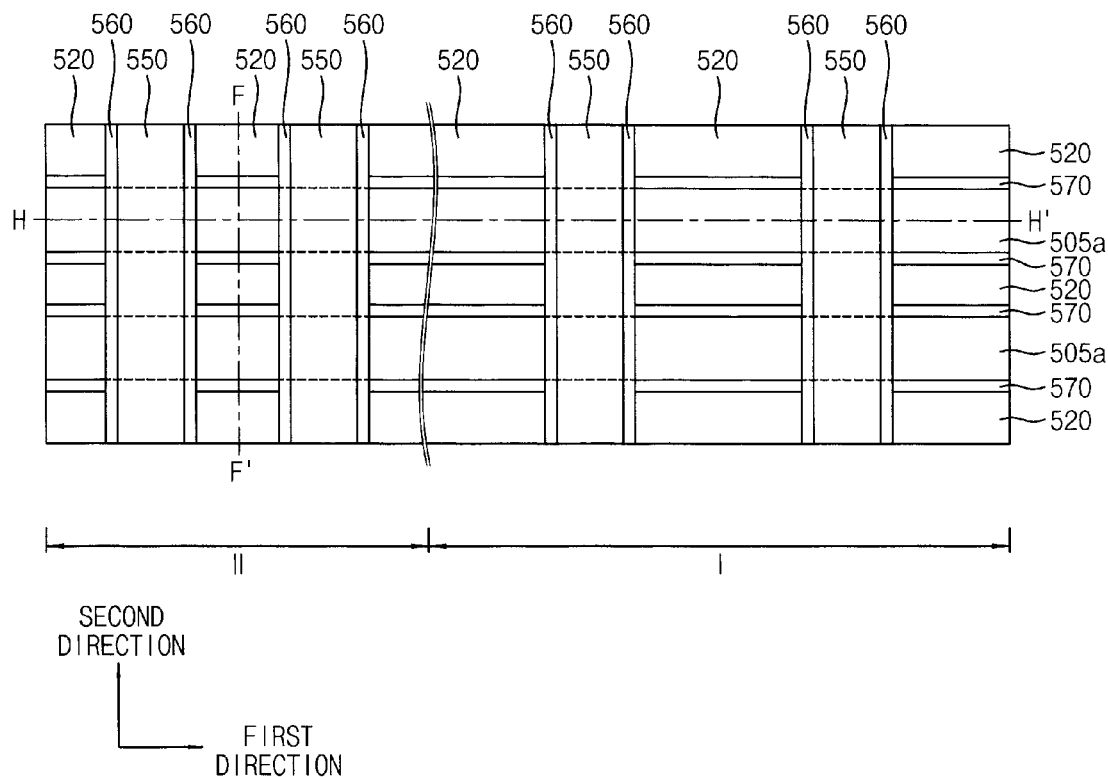
Figure 68:
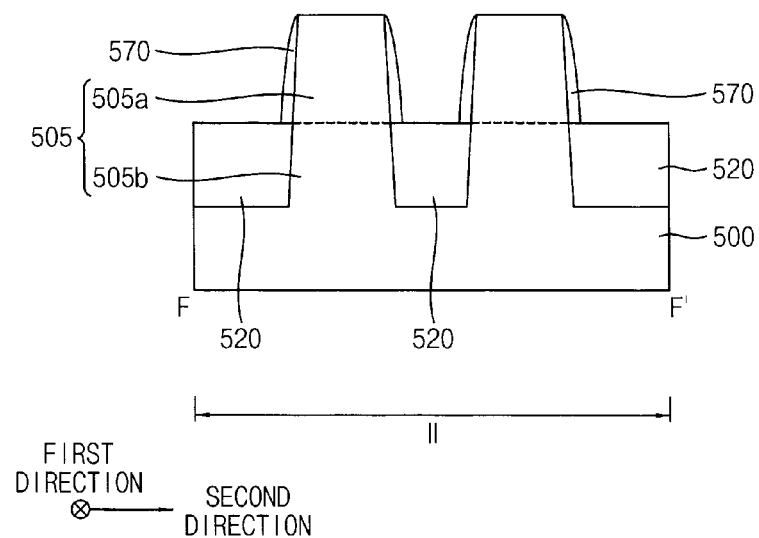
Figure 69:
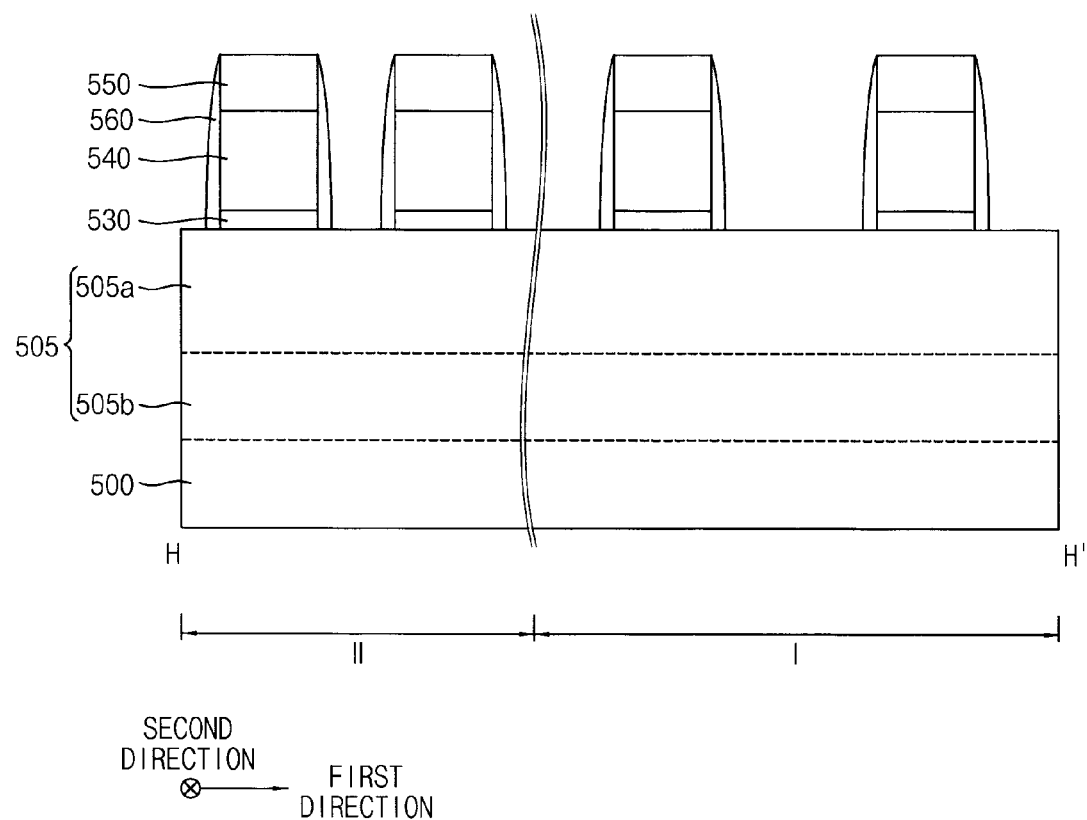

Referring to FIGS. 67 to 69, a gate spacer 560 and a fin spacer 570 may be formed on sidewalls of the dummy gate structure and sidewalls of the active tin 505, respectively.

In example embodiments, the gate spacer 560 and the fin spacer 570 may be formed by forming a spacer layer on the dummy gate structure, the active fin 505 and the isolation pattern 520, and anisotropically etching the spacer layer. The spacer layer may be formed of or include a nitride, e.g., silicon nitride, silicon carbonitride, silicon oxycarbonitride, etc.

The gate spacer 560 may be formed on the sidewalls of the dummy gate structure that are opposite to each other in the first direction, and the fin spacer 570 may be formed on the sidewalls of the active fin 505 that are opposite to each other in the second direction.

Figure 70:
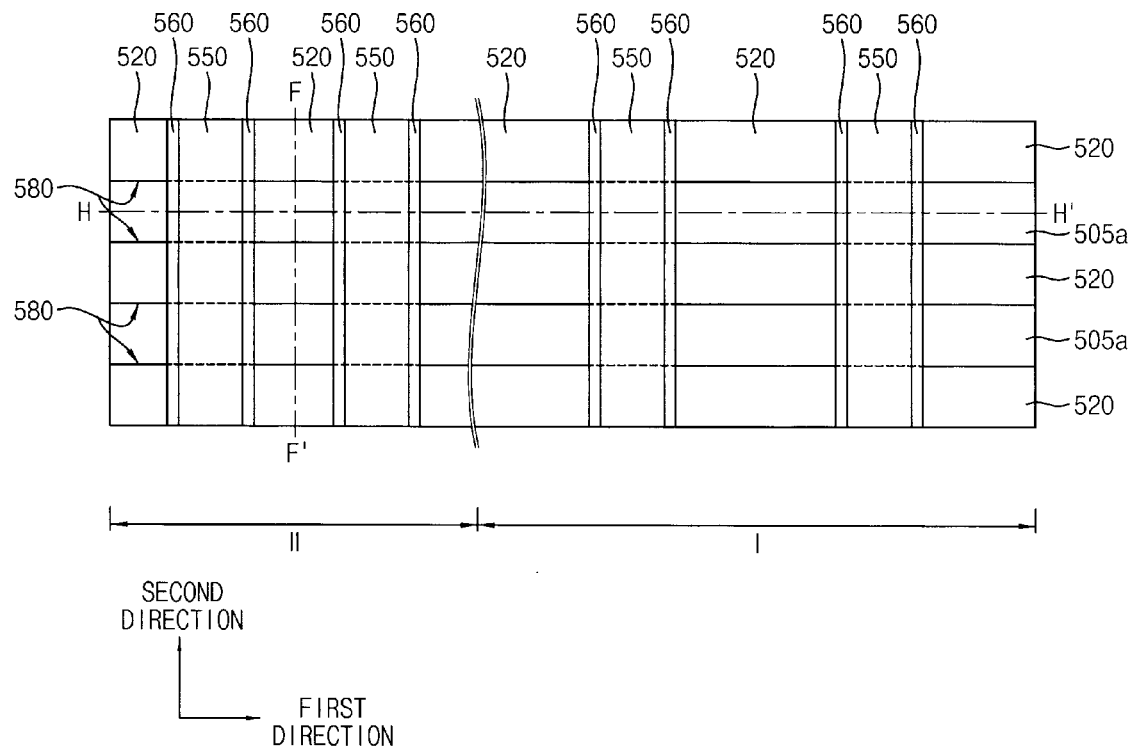
Figure 71:
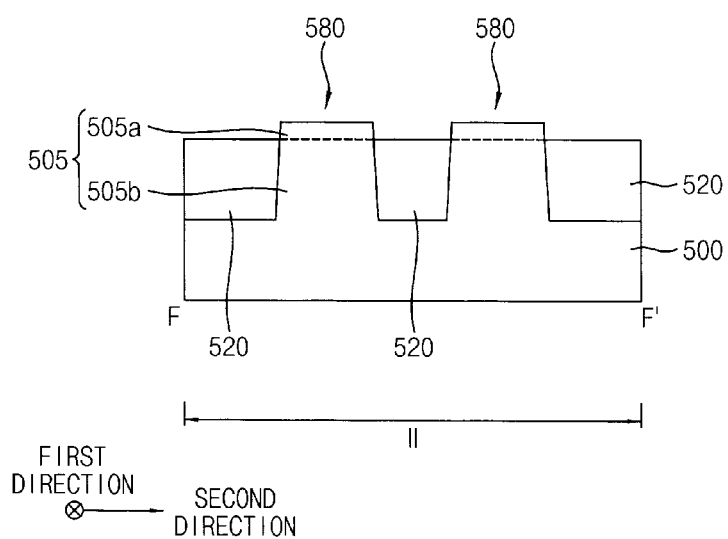
Figure 72:
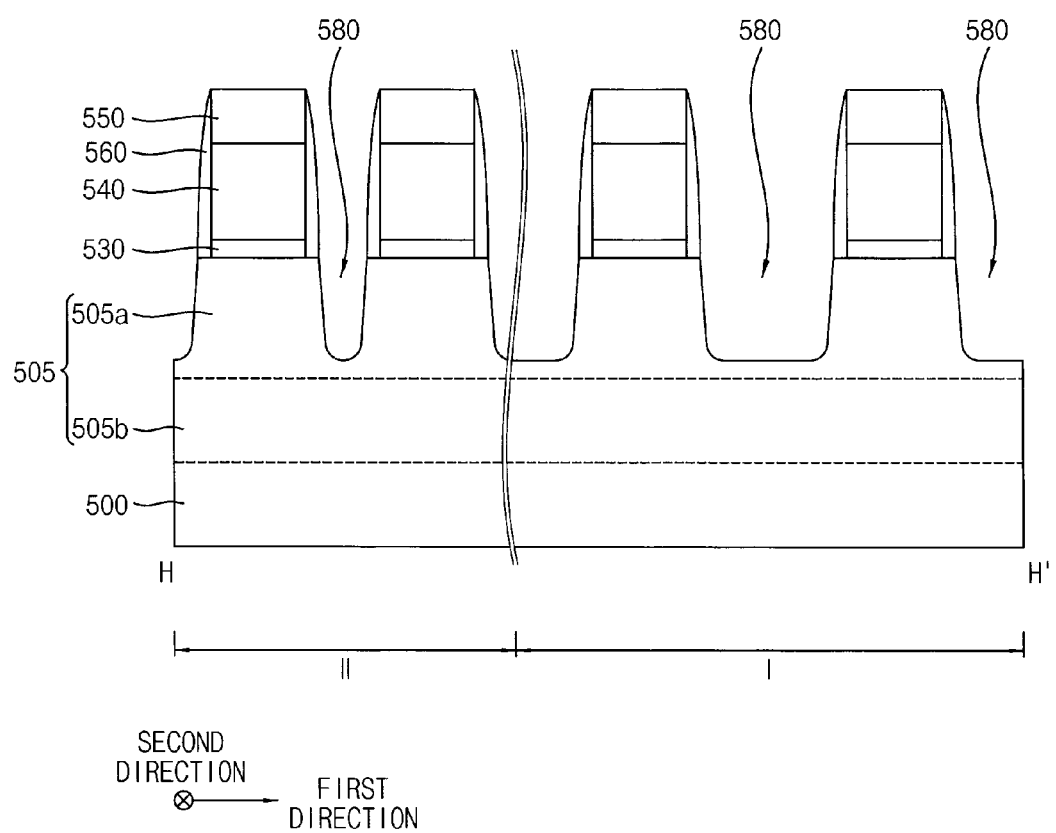

Referring to FIGS. 70 to 72, an upper portion of the active fin 505 adjacent to the dummy gate structure may be etched to form a fourth recess 580.

Particularly, the upper portion of the active fin 505 may be etched using the dummy gate structure and the gate spacer 560 as an etching mask. The fin spacer 570 may be also etched in the etching process. FIGS. 70 to 72 show that the upper active pattern 505a in the active fin 505 is etched to form the second recess 580, however, the inventive concepts may not be limited thereto. For example, the second recess 580 may be formed by removing the upper active pattern 505a to expose the lower active pattern 505b, and further, a portion of the lower active pattern 505b may be removed when the second recess 580 is formed.

As the dummy gate structures may be formed to be spaced apart from each other in the first region I at a distance greater than a distance between the dummy gate structures spaced apart from each other in the second region II, the fourth recess 580 in the first region I may be formed to have a width in the first direction greater than a width in the first direction of the fourth recess 580 in the second region II.

Figure 73:
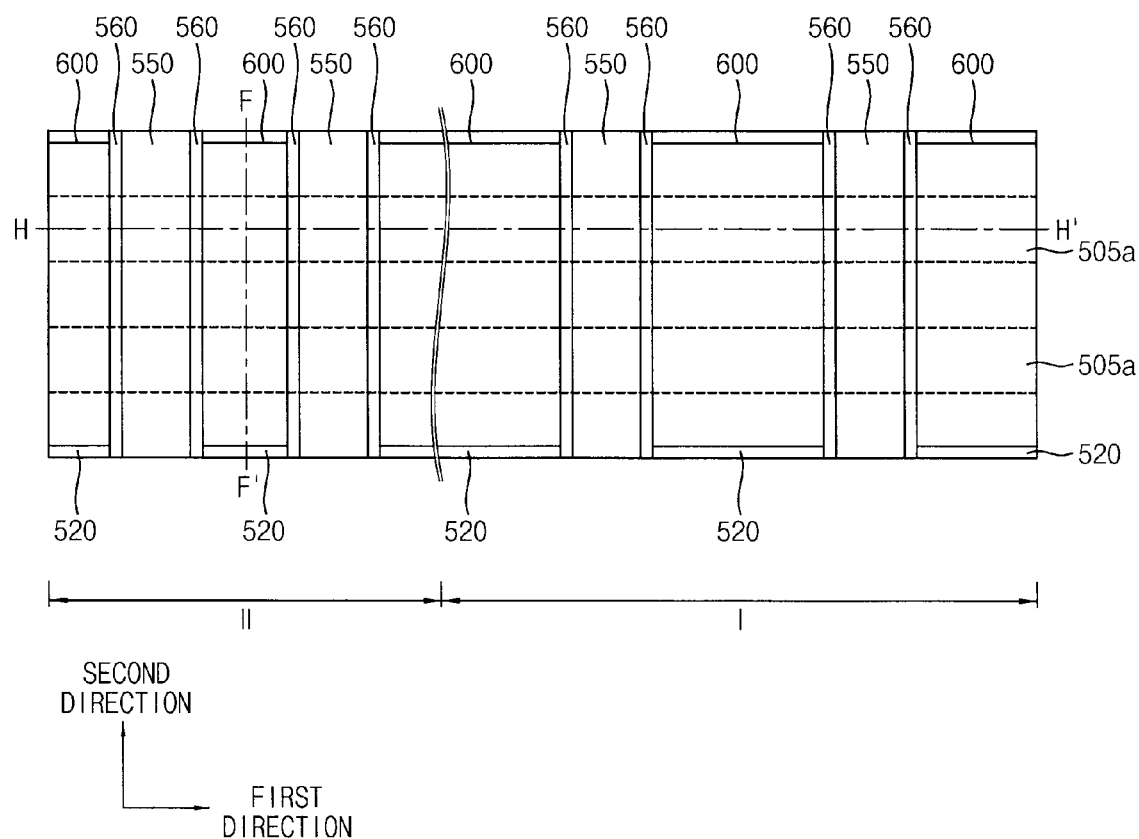
Figure 74:
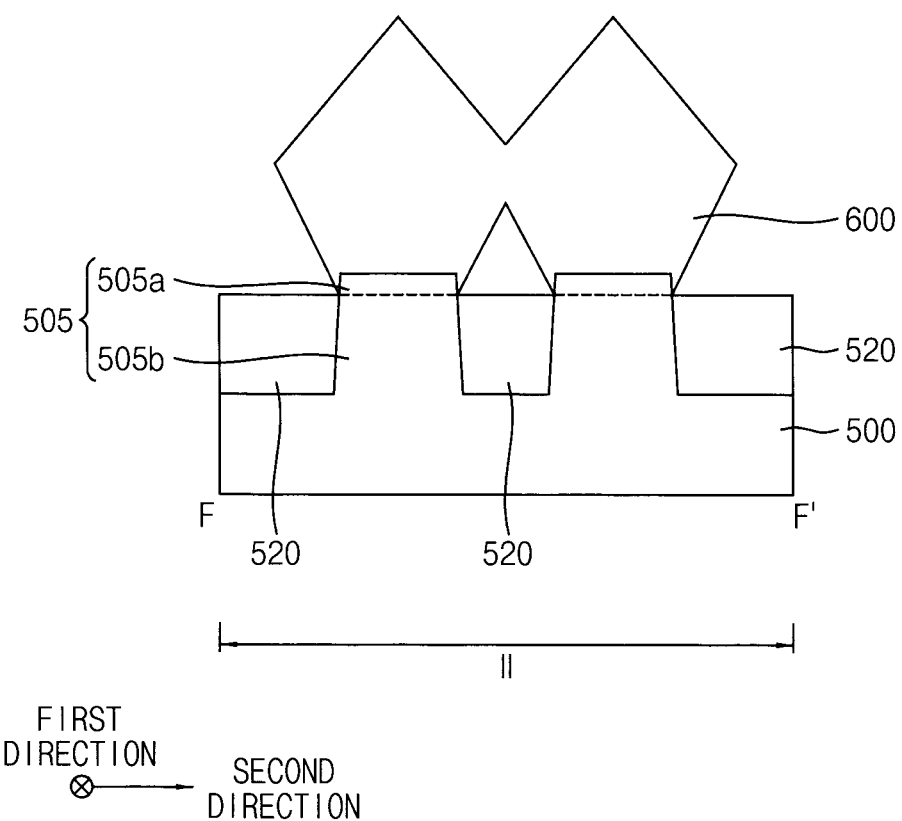
Figure 75:
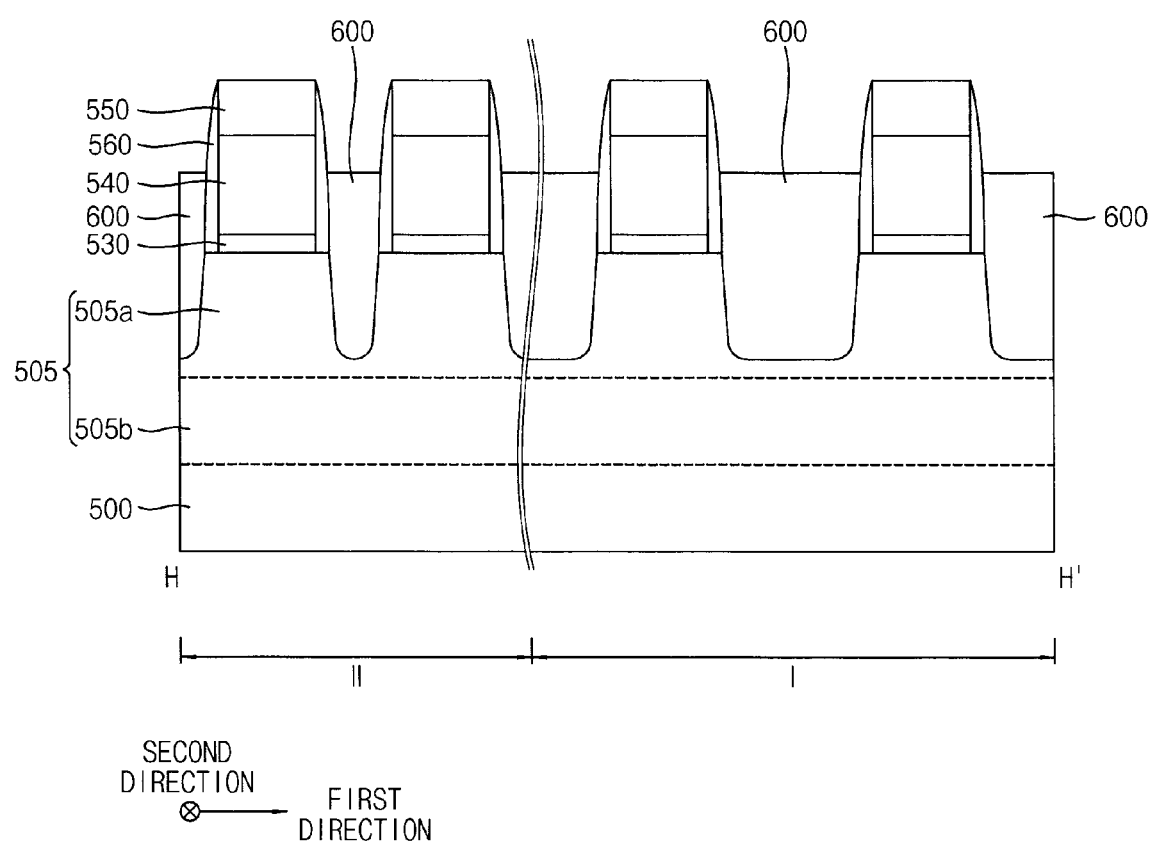

Referring to FIGS. 73 to 75, a source/drain layer 600 may be formed on the active fin 505 to fill the fourth recess 580.

In example embodiments, the source/drain layer 600 may be formed by a selective epitaxial growth (SEG) process using a top surface of the active fin 505 exposed by the fourth recess 580 as a seed.

In example embodiments, the SEG process may be performed using a silicon source gas, e.g., disilane ($Si_2H_6$) gas and a carbon source gas, e.g., monomethylsilane ($SiH_3CH_3$) gas to form a single crystalline silicon carbide layer. Alternatively, the SEG process may be performed using only a silicon source gas, e.g., disilane ($Si_2H_6$) gas to form a single crystalline silicon layer. An n-type impurity source gas, e.g., phosphine ($PH_3$) gas may be also used to form a single crystalline silicon carbide layer doped with n-type impurities or a single crystalline silicon layer doped with n-type impurities. Accordingly, the source/drain layer 600 may serve as a source/drain region of a negative-channel metal oxide semiconductor (NMOS) transistor.

Alternatively, the SEG process may be performed using a silicon source gas, e.g., dichlorosilane ($SiH_2Cl_2$) gas, and a germanium source gas, e.g., germane ($GeH_4$) gas to form a single crystalline silicon-germanium layer. A p-type impurity source gas, e.g., diborane ($B_2H_6$) gas may be also used to form a single crystalline silicon-germanium layer doped with p-type impurities. Accordingly, the source/drain layer 600 may serve as a source/drain region of a positive-channel metal oxide semiconductor (PMOS) transistor.

The source/drain layer 600 may grow both in vertical and horizontal directions, and thus may not only fill the fourth recess 580 but also contact a portion of the gate spacer 560. An upper portion of the source/drain layer 600 may have a cross-section taken along the second direction a shape of which may be pentagon or hexagon. When the active fins 505 are spaced apart from each other in the second direction at a short distance, neighboring ones of the source/drain layers 600 in the second direction may be merged with each other to form a single layer. In the figure, one merged source/drain layer 600 is shown.

Figure 76:
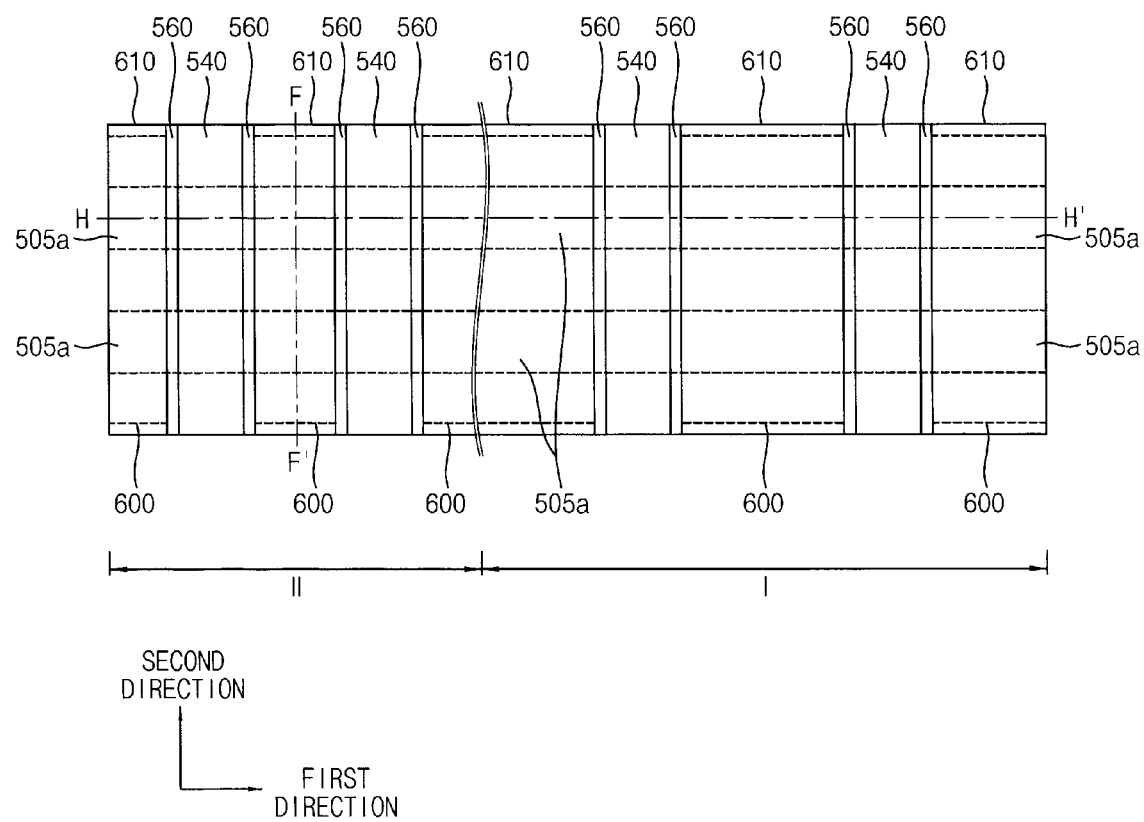
Figure 77:
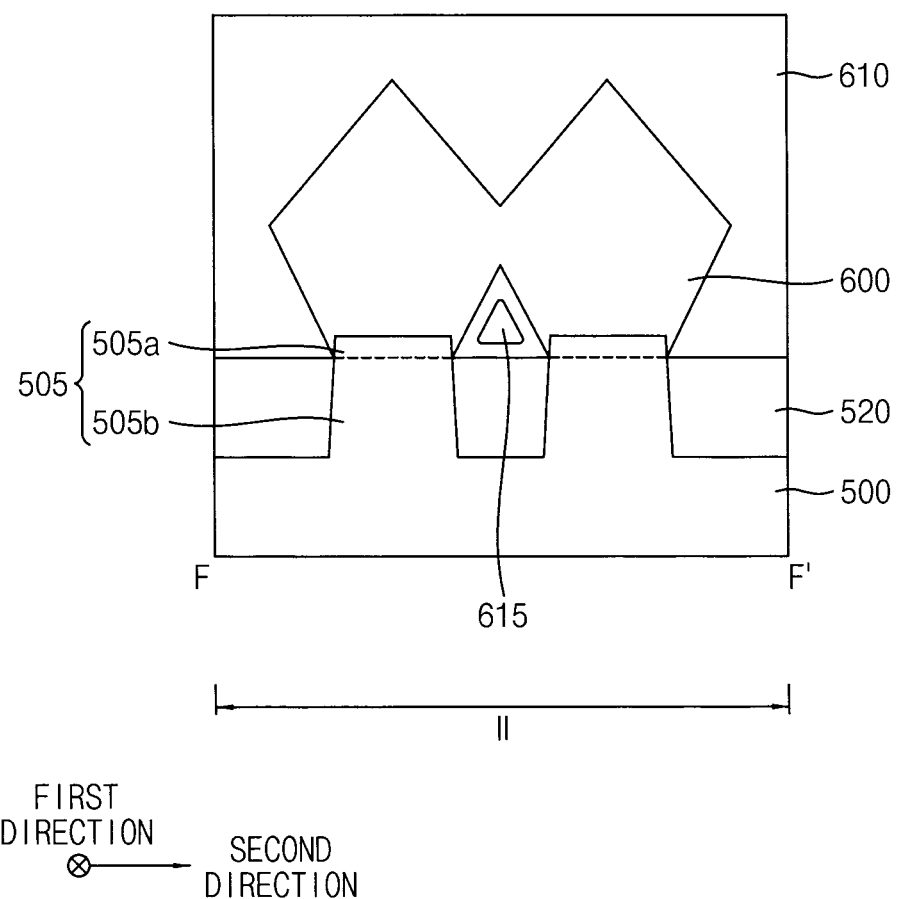
Figure 78:
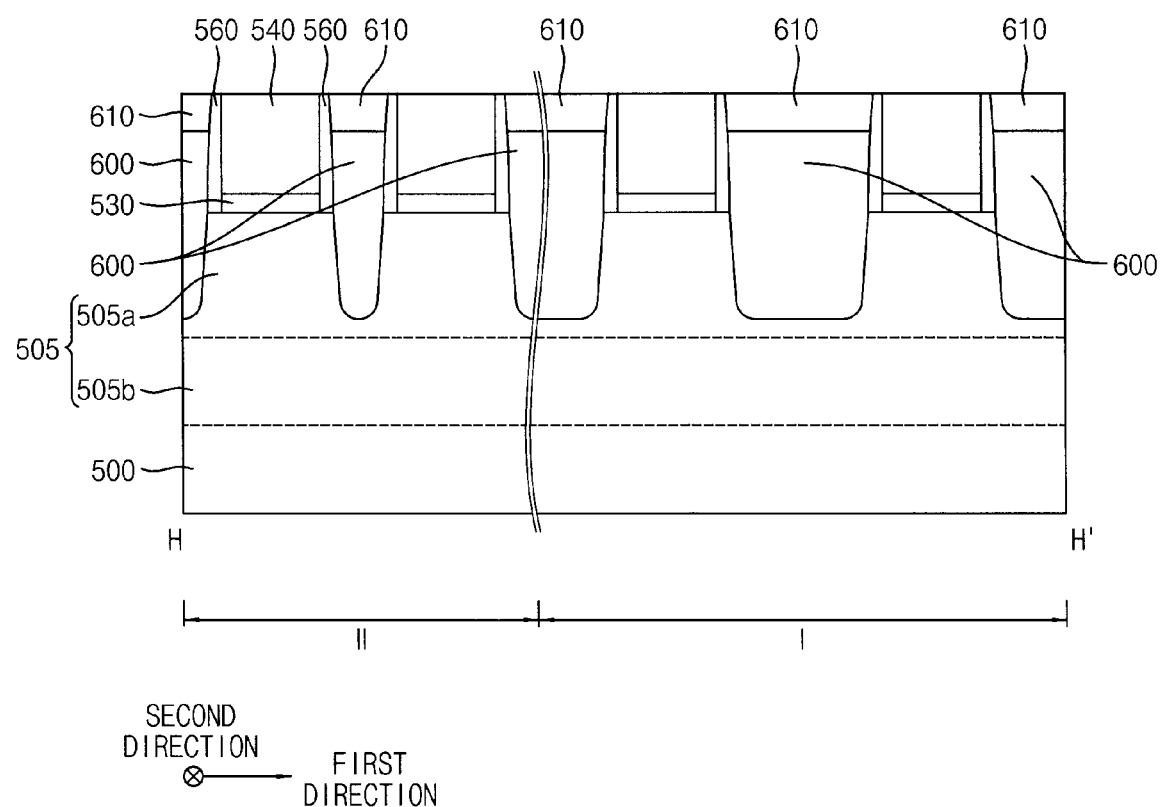

Referring to FIGS. 76 to 78, an insulation layer 610 may be formed on the active fin 505 and the isolation pattern 520 to cover the dummy gate structure, the gate spacer 560, and the source/drain layer 600, and the insulation layer 610 may be planarized until a top surface of the dummy gate electrode 540 of the dummy gate structure may be exposed. The dummy gate mask 550 may be also removed, and an upper portion of the gate spacer 560 may also be removed. A space between the merged source/drain layer 600 and the isolation pattern 520 may not be filled with the insulation layer 610, and thus an air gap 615 may be formed.

The insulation layer 610 may be formed of or include an oxide, e.g., silicon oxide. The planarization process may be performed by a CMP process and/or an etch back process.

Figure 79:
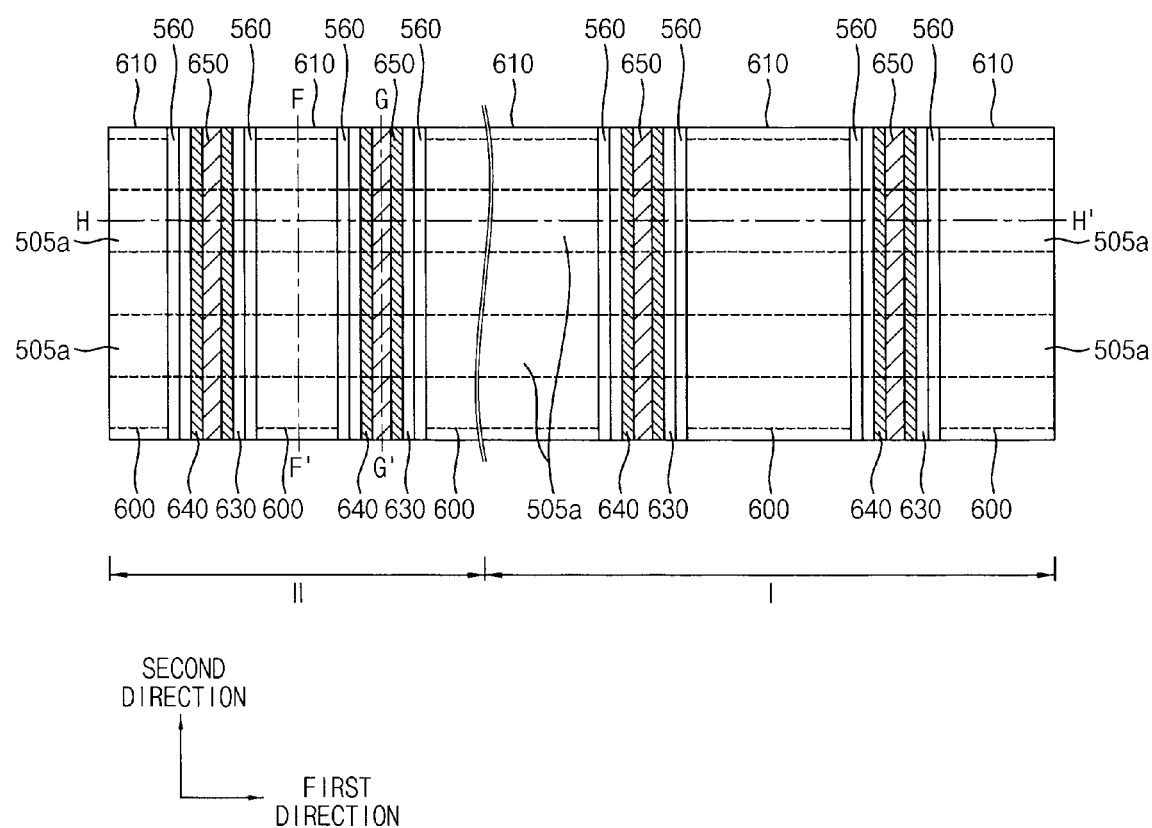
Figure 81:
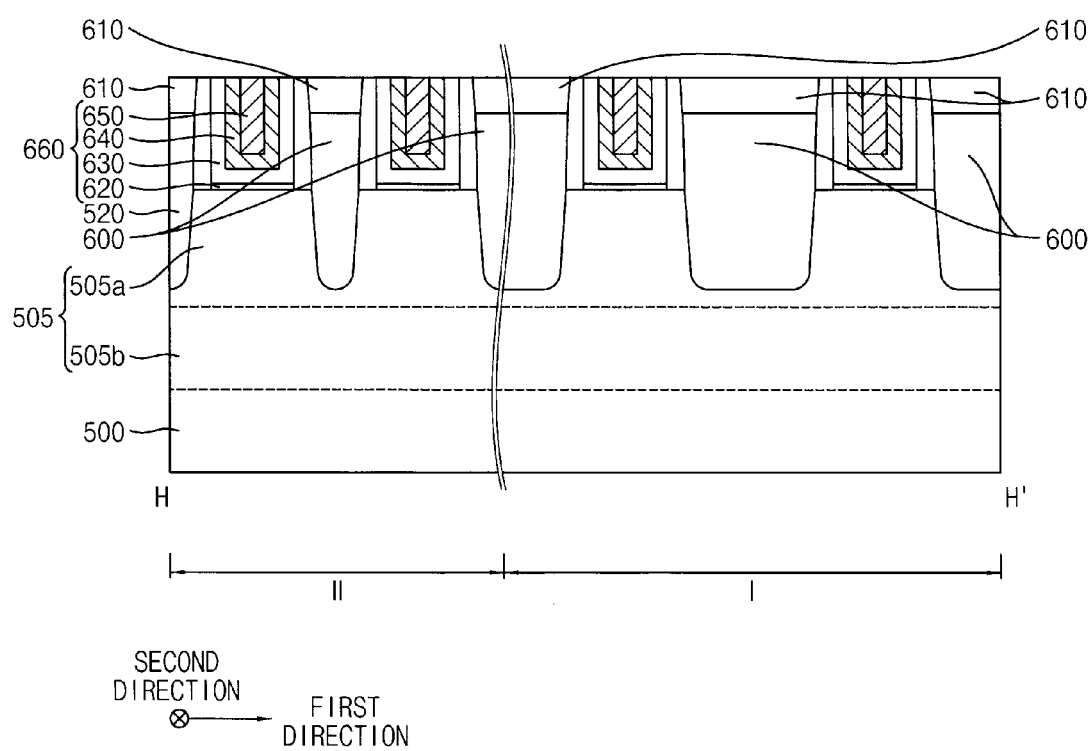

Referring to FIGS. 79 to 81, the exposed dummy gate electrode 540, and the dummy gate insulation pattern 530 thereunder may be removed to form an opening (not shown) exposing a top surface of the active fin 505 and an inner sidewall of the gate spacer 560. A gate structure 660 may be formed to fill the opening.

Particularly, after a thermal oxidation process may be performed on the exposed top surface of the active fin 505 to form an interface pattern 620, a gate insulation layer and a work function control layer may be formed, for example sequentially formed, on the interface pattern 620, the isolation pattern 520, the gate spacer 560 and the insulation layer 610, and a gate electrode layer may be formed on the work function control layer to sufficiently fill a remaining portion of the opening.

The gate insulation layer may be formed of or include a metal oxide having a high dielectric constant, e.g., hafnium oxide, tantalum oxide, zirconium oxide, or the like, by a CVD process, a PVD process, an ALD process, or the like. The work function control layer may be formed of or include a metal nitride or an metal alloy, e.g., titanium nitride, titanium aluminum, titanium aluminum nitride, tantalum nitride, tantalum aluminum nitride, etc. The gate electrode layer may be formed of or include a material having a low resistance, e.g., a metal such as aluminum, copper, tantalum, etc., or a metal nitride thereof. The work function control layer and the gate electrode layer may be formed by a CVD process, a PVD process, an ALD process, or the like. In an example embodiment, a heat treatment process, e.g., a rapid thermal annealing (RTA) process, a spike rapid thermal annealing (spike RTA) process, a flash rapid thermal annealing (flash RTA) process or a laser annealing process may be further performed on the gate electrode layer.

The interface pattern 620 may be formed by a CVD process, a PVD process, an ALD process instead of the thermal oxidation process, and in this case, the interface pattern 620 may be formed not only on the top surface of the active fin 505 but also on the top surface of the isolation layer pattern 520 and the inner sidewall of the gate spacer 560.

The gate electrode layer, the work function control layer and the gate insulation layer may be planarized until the top surface of the insulation layer 610 may be exposed to form a gate insulation pattern 630 and a work function control pattern 640 stacked, for example sequentially stacked, on the interface pattern 620, the isolation pattern 520 and the inner sidewall of the gate spacer 560, and a gate electrode 650 filling a remaining portion of the opening on the work function control pattern 640. Thus, a bottom and a sidewall of the gate electrode 640 may be covered by the work function control pattern 640. In example embodiments, the planarization process may be performed by a CMP process and/or an etch back process.

The interface pattern 620, the gate insulation pattern 630, the work function control pattern 640, and the gate electrode 650 stacked, for example sequentially stacked, may form the gate structure 660, and the gate structure 660 and the source/drain layer 600 may form an NMOS transistor or a PMOS transistor.

Figure 83:
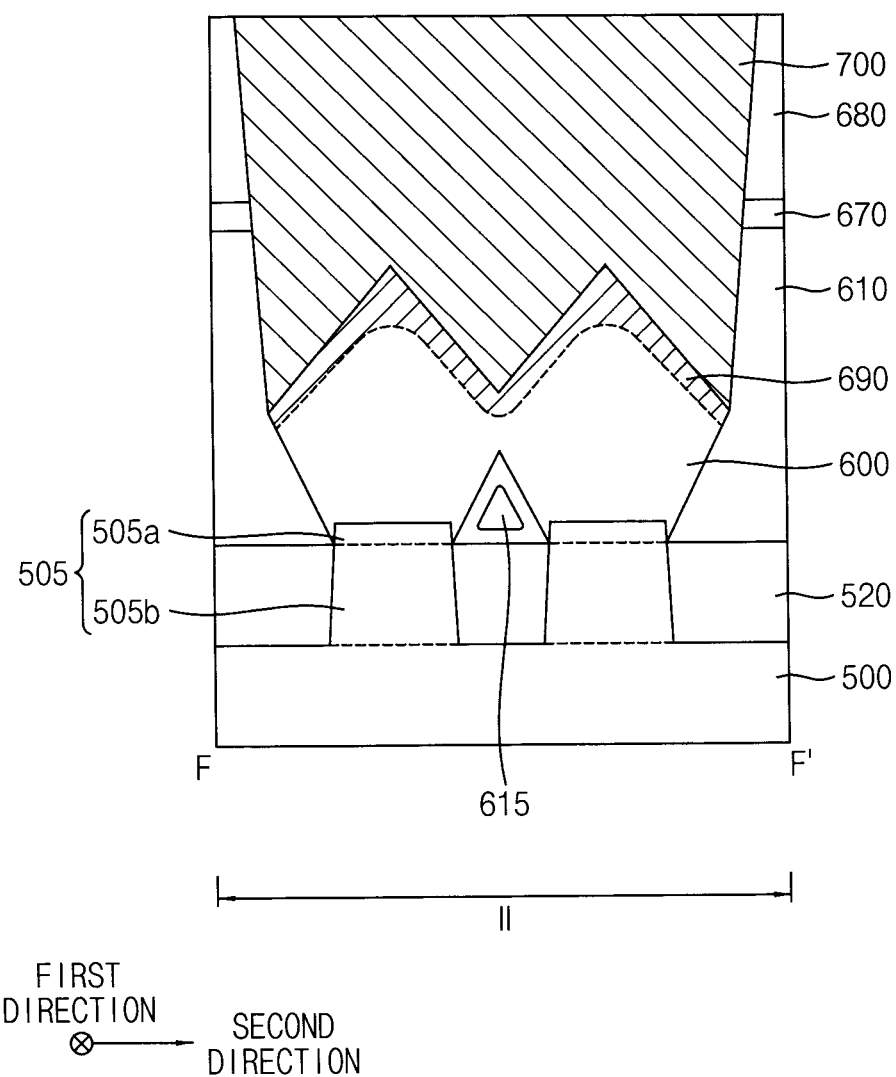
Figure 84:
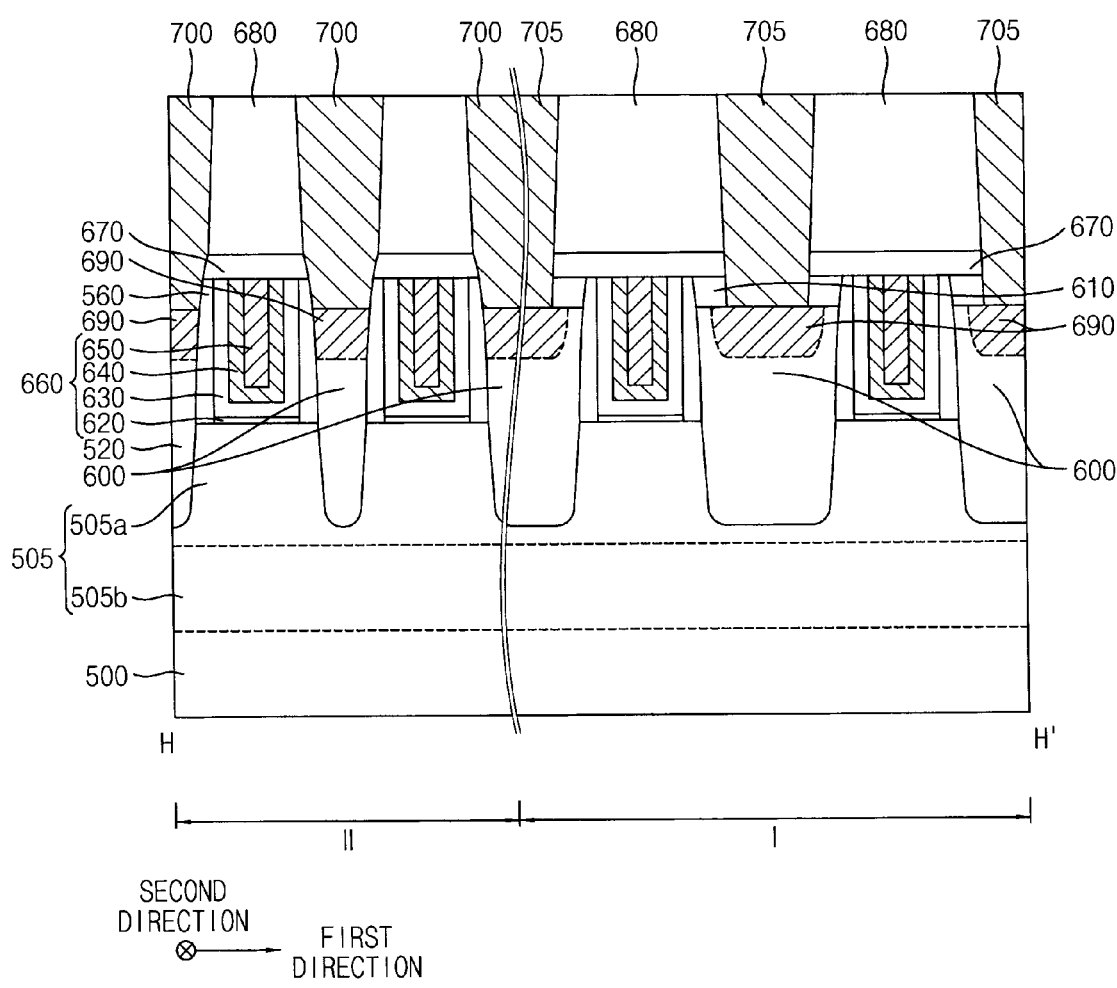
Figure 85:
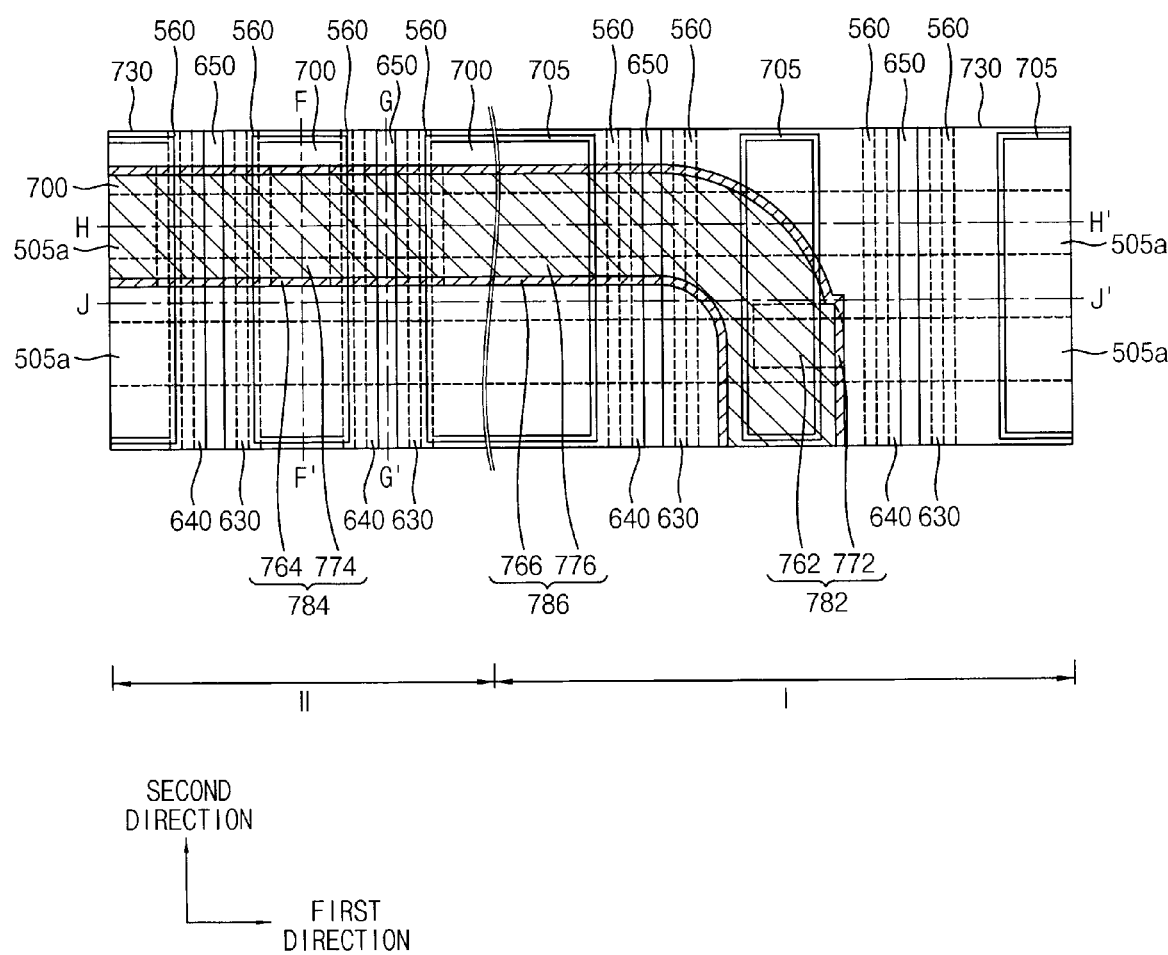
Figure 86:
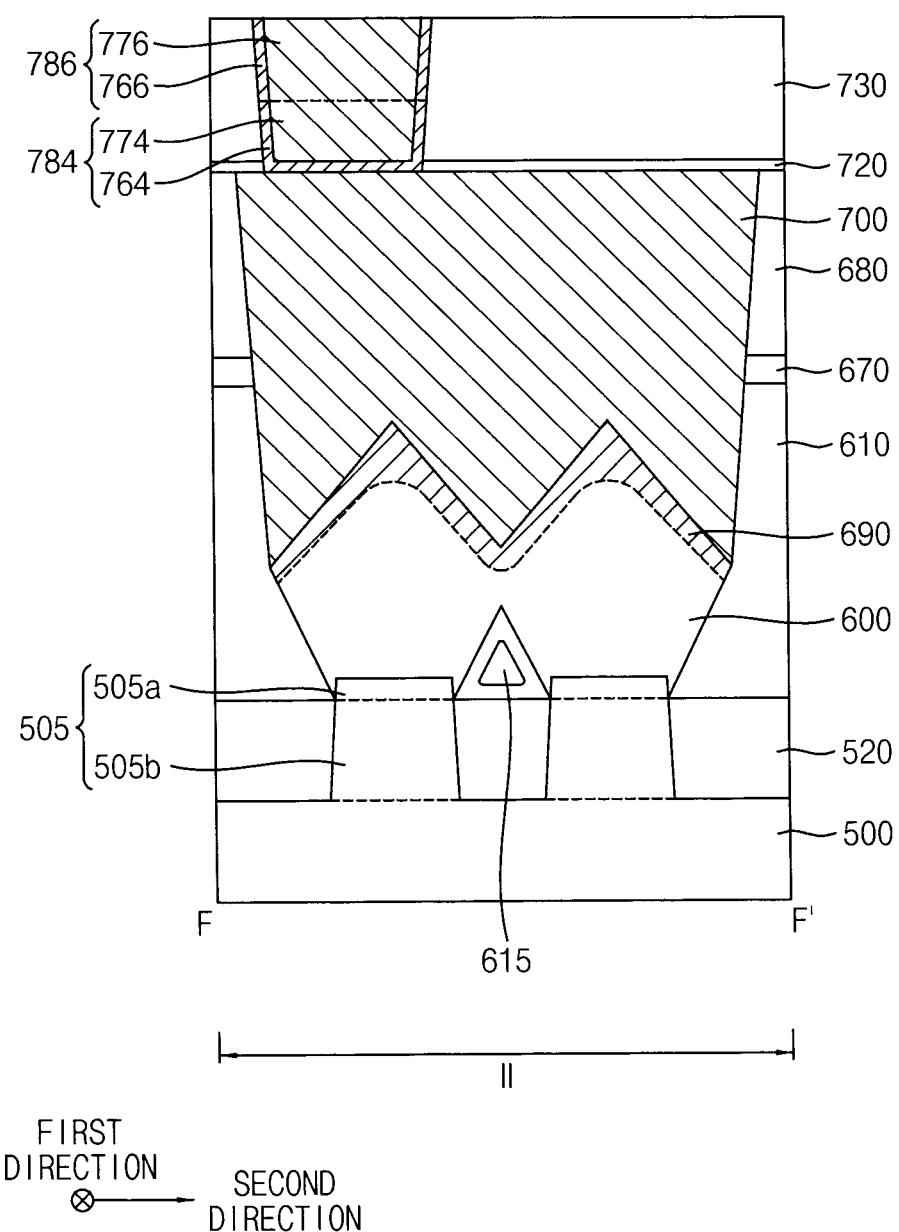

Referring to FIGS. 82 to 84, a capping layer 670 and a first insulating interlayer 680 may be formed, for example sequentially formed, on the insulation layer 610, the gate structure 660, and the gate spacer 560, and first and second contact plugs 700 and 705 may be formed through the insulation layer 610 and the first insulating interlayers 680 to contact top surfaces of the source/drain layers 600.

The first insulating interlayer 680 may be formed of or include a material substantially the same as or different from a material of the insulation layer 610. For example, the first insulating interlayer 680 may be formed of or include an oxide, e.g., silicon oxide.

The first and second contact plugs 700 and 705 may be formed by forming first and second contact holes (not shown) through the insulation layer 610 and the first insulating interlayer 680 to expose the top surfaces of the source/drain layers 600, and forming a conductive layer to fill the first and second contact holes. The conductive layer may be formed of or include, e.g., a metal, a metal nitride, or doped polysilicon.

The first and second contact holes may be formed in the first and second regions I and II, respectively, and the first and second contact plugs 700 and 705 filling the first and second contact holes, respectively, may be also formed in the first and second regions I and II, respectively.

In example embodiments, each of the first contact plugs 700 may be self-aligned with the gate spacer 560 on the sidewall of the gate structure 660, and each of the second contact plugs 705 may not be self-aligned with the gate spacer 560. However, the inventive concepts may not be limited thereto. The first contact plugs 700 may be disposed in the first region I at a distance from each other greater than a distance between the second contact plugs 705 disposed in the second region II.

Metal silicide patterns 690 may be formed on the source/drain layers 600 by forming a metal layer on the top surfaces of the source/drain layers 600 exposed by the first and second contact holes, performing a heat treatment on the metal layer, and removing an unreacted portion thereof. The metal layer may be formed of or include, e.g., cobalt, nickel, titanium, etc.

Referring to FIGS. 85 to 89, processes that are substantially the same as or similar to the processes illustrated with reference to FIGS. 22 to 39 may be performed.

Thus, an etch stop layer 720 and a second insulating interlayer 730 may be formed, for example sequentially formed, on the first insulating interlayer 680 and the first and second contact plugs 700 and 705, first and second vias 782 and 784 may be formed through lower portions of the second insulating interlayer 730 and the etch stop layer 720, and a wiring 786 may be formed through an upper portion of the second insulating interlayer 730 to contact top surfaces of the first and second vias 782 and 784.

A first density of the first via 782 in the first region I may be lower than a second density of the second via 784 in the second region II. For example, the second density may be equal to or more than about ten times the first density. However, a contact area between the first via 782 and the wiring 786 may not be smaller than a contact area between the second via 784 and the wiring 786, and thus the resistance characteristics of the semiconductor device may be enhanced.

Figure 90:
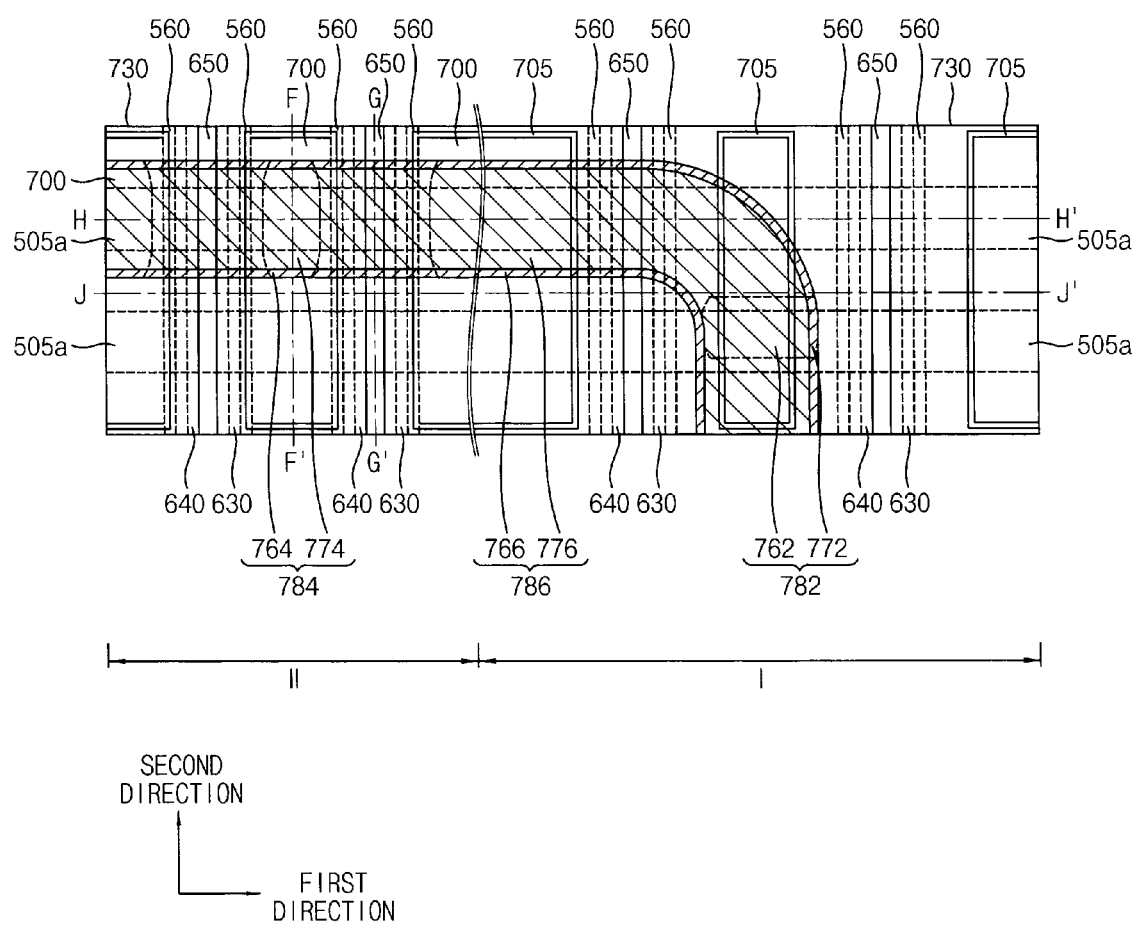
FIGS. 90 and 91 are a plan view and a cross-sectional view, respectively, illustrating a semiconductor device in accordance with example embodiments.
Figure 91:
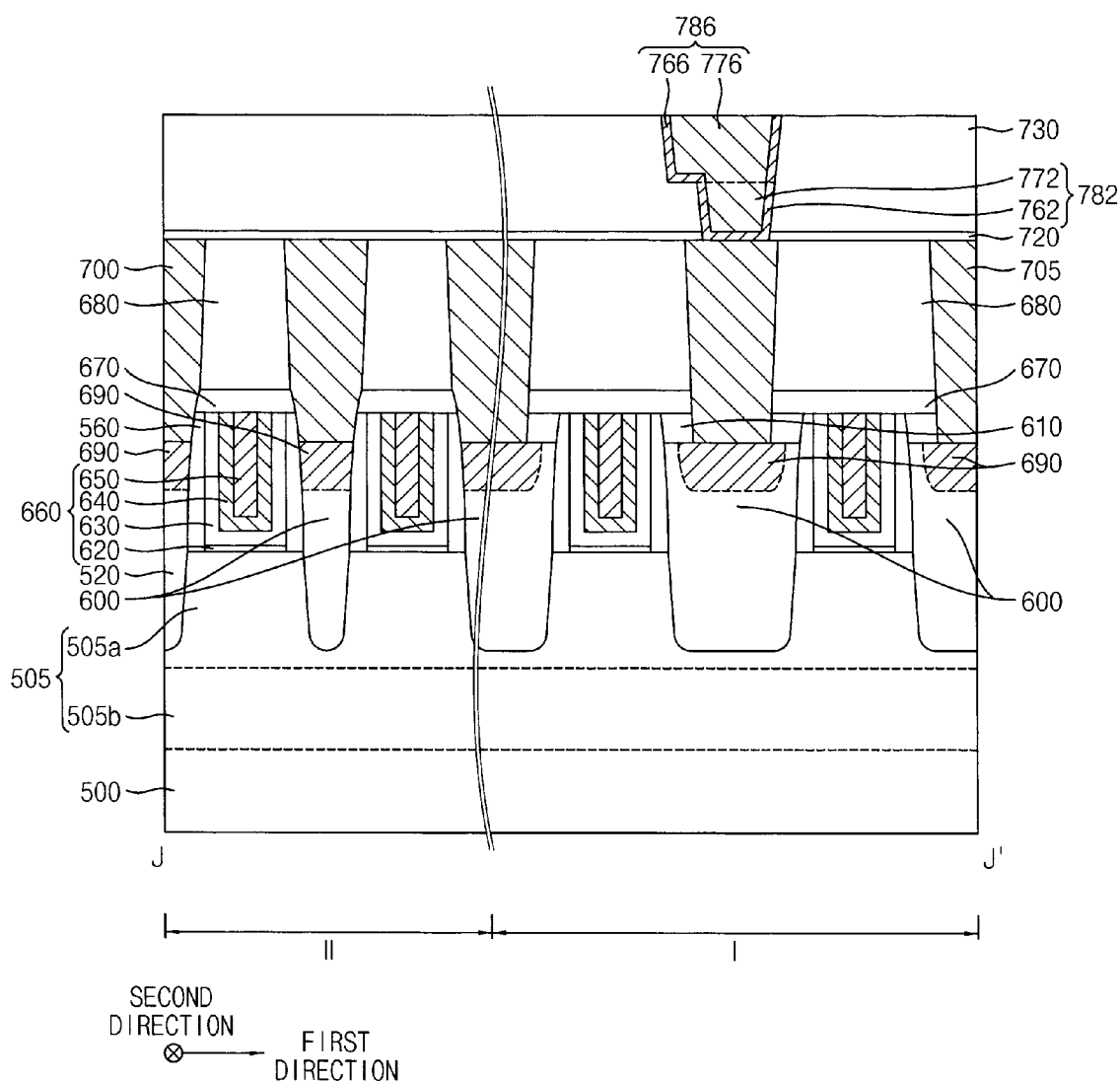

FIGS. 90 and 91 are a plan view and a cross-sectional view, respectively, illustrating a semiconductor device, in accordance with example embodiments.

This semiconductor device may be substantially the same as or similar to the semiconductor device manufactured by the processes illustrated with reference to FIGS. 62 to 89. That is, the semiconductor device illustrated with reference to FIGS. 62 to 89 may include the wiring structure formed by the processes illustrated with reference to FIGS. 22 to 39, while the semiconductor device illustrated with reference to FIGS. 90 and 91 may include the wiring structure formed by the processes illustrated with reference to FIGS. 40 to 45. Thus, detailed descriptions on the semiconductor device of FIGS. 90 and 91 are omitted herein.

The above semiconductor device and the method of manufacturing the same may be applied to various types of memory devices having wiring structures including vias and wirings and methods of manufacturing the same. For example, the semiconductor device may be applied to wiring structures of logic devices such as central processing units (CPUs), main processing units (MPUs), or application processors (APs), or the like. Additionally, the semiconductor device may be applied to wiring structures of volatile memory devices such as DRAM devices or SRAM devices, or wiring structures of non-volatile memory devices such as flash memory devices, PRAM devices, MRAM devices, RRAM devices, or the like.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   an insulating interlayer on a substrate;
   a wiring in an upper portion of the insulating interlayer, the wiring including a first portion and a second portion, the second portion extending in a first direction, the first portion extending in a second direction crossing the first direction, the second portion being connected to the first portion, and a corner of the wiring at which the first and second portions are connected to each other having a rounded shape; and
   a via structure in a lower portion of the insulating interlayer, the via structure including,
       first vias in a first region at a first density, at least one of the first vias contacting a bottom of the first portion of the wiring; and
       second vias in a second region at a second density that is greater than the first density, at least one of the second vias contacting a bottom of the second portion of the wiring,
   wherein the at least one of the first vias contacting the bottom of the first portion of the wiring at least partially contacts the rounded corner of the wiring.

2. The semiconductor device of claim 1, wherein, in a plan view, the at least one of the first vias has a corner with a rounded shape corresponding to the rounded shape of the corner of the wiring.

3. The semiconductor device of claim 1, wherein the rounded corner of the wiring includes a protrusion protruding therefrom in a plan view.

4. The semiconductor device of claim 3, wherein the at least one of the first vias is adjacent to the protrusion of the rounded corner of the wiring, and does not contact a bottom of the protrusion.

5. The semiconductor device of claim 1, wherein, in a plan view, an area of the at least one of the first vias contacting the bottom of the first portion of the wiring is equal to or greater than an area of the at least one of the second vias contacting the bottom of the second portion of the wiring.

6. The semiconductor device of claim 1, wherein the second density is equal to or more than about ten times the first density.

7. The semiconductor device of claim 1, wherein the first and second directions cross each other at a substantially right angle.

8. The semiconductor device of claim 1, wherein the at least one of the first vias contacting the bottom of the first portion of the wiring includes a first metal pattern and a first barrier pattern covering a bottom and a sidewall of the first metal pattern,
   the at least one of the second vias contacting the bottom of the second portion of the wiring includes a second metal pattern and a second barrier pattern covering a bottom and a sidewall of the second metal pattern,
   and wherein the wiring includes a third metal pattern and a third barrier pattern covering a portion of a bottom and a sidewall of the third metal pattern.

9. The semiconductor device of claim 8, wherein the first to third barrier patterns include a substantially same material, and the first to third metal patterns include a substantially same material.

10. A semiconductor device, comprising:
    an active fin on a substrate, the active fin partially protruding from an isolation pattern on the substrate and extending in a first direction;
    a gate structure on the active fin and the isolation pattern, the gate structure extending in a second direction crossing the first direction;
    a source/drain layer on a portion of the active fin adjacent to the gate structure;
    a contact plug on the source/drain layer;
    a first insulating interlayer structure containing the gate structure, the source/drain layer and the contact plug;
    a second insulating interlayer on the first insulating interlayer structure;
    a wiring in an upper portion of the second insulating interlayer, the wiring including a first portion and a second portion, the second portion extending in a third direction, the first portion extending in a fourth direction crossing the third direction, the second portion being connected to the first portion, and a corner of the wiring at which the first and second portions are connected to each other having a rounded shape; and
    a via structure in a lower portion of the second insulating interlayer, the via structure including:
        first vias in a first region at a first density, at least one of the first vias contacting a bottom of the first portion of the wiring; and
        second vias in a second region at a second density that is greater than the first density, at least one of the second vias contacting a bottom of the second portion of the wiring,
    wherein the at least one of the first vias at least partially contacts the bottom of the first portion of the wiring contacts the rounded corner of the wiring.

11. The semiconductor device of claim 10, wherein, in a plan view, the at least one of the first vias has a corner with a rounded shape corresponding to the rounded shape of the corner of the wiring.

12. The semiconductor device of claim 10, wherein the rounded corner of the wiring includes a protrusion protruding therefrom in a plan view.

13. The semiconductor device of claim 12, wherein the at least one of the first vias is adjacent to the protrusion of the rounded corner of the wiring, but does not contact a bottom of the protrusion.

14. The semiconductor device of claim 10, wherein, in a plan view, an area of the at least one of the first vias contacting the bottom of the first portion of the wiring is equal to or greater than an area of the at least one of the second vias contacting the bottom of the second portion of the wiring.

15. The semiconductor device of claim 10, wherein the first and third directions are substantially parallel to each other, the second and fourth directions are substantially parallel to each other, and the first and second directions cross each other at a substantially right angle.

16. A semiconductor device, comprising:
an insulating interlayer on a substrate;
a wiring in the insulating interlayer, the wiring including a first portion extending in a first direction, a second portion extending in a second direction, and a bent portion connecting the first portion and the second portion; and
a via structure in the insulating interlayer between the wiring and the substrate, the via structure including,
at least one first via in contact with the first portion of the wiring and at least partially in contact with the bent portion of the wiring; and
at least one second via in contact with the second portion of the wiring.

17. The semiconductor device of claim 16, wherein the second direction is substantially perpendicular to the first direction, and the bent portion is arcuate.

18. The semiconductor device of claim 16, wherein
the via structure includes a plurality of first vias and a plurality of second vias;
the first vias are at a first density; and
the second vias are at a second density greater than the first density.

19. The semiconductor device of claim 16, wherein the first and second directions are substantially parallel to a surface of the substrate.

20. The semiconductor device of claim 16, wherein
the at least one first via has a via bent portion corresponding to the bent portion of the wiring in a direction substantially parallel to a surface of the substrate;
the bent portion of the wiring includes a protrusion protruding therefrom in a direction substantially parallel to a surface of the substrate; and
the at least one first via is adjacent to the protrusion.

* * * * *